(12) United States Patent
Satou

(10) Patent No.: US 9,475,275 B2
(45) Date of Patent: Oct. 25, 2016

(54) SCREEN PRINTING APPARATUS

(75) Inventor: Toshimichi Satou, Shizuoka-ken (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 324 days.

(21) Appl. No.: 14/127,454

(22) PCT Filed: Jun. 21, 2011

(86) PCT No.: PCT/JP2011/003524
§ 371 (c)(1),
(2), (4) Date: Feb. 7, 2014

(87) PCT Pub. No.: WO2012/176229
PCT Pub. Date: Dec. 27, 2012

(65) Prior Publication Data
US 2014/0190361 A1 Jul. 10, 2014

(51) Int. Cl.
*B41F 15/08* (2006.01)
*B41F 15/16* (2006.01)
*B41F 15/18* (2006.01)
*B41F 15/26* (2006.01)
(Continued)

(52) U.S. Cl.
CPC .............. *B41F 15/18* (2013.01); *B41F 15/08* (2013.01); *B41F 15/0881* (2013.01); *B41F 15/26* (2013.01); *B41F 15/36* (2013.01); *H05K 3/1233* (2013.01); *B41F 15/423* (2013.01); *B41P 2215/114* (2013.01); *B41P 2215/50* (2013.01); *H05K 3/3484* (2013.01)

(58) Field of Classification Search
CPC .... B41F 15/08; B41F 15/0813; B41F 15/16; B41F 15/26; B41F 15/36; B41F 15/42

USPC .................................................. 101/126, 129
See application file for complete search history.

(56) References Cited

U.S. PATENT DOCUMENTS

| 5,730,051 | A | 3/1998 | Takahashi et al. |
| 2010/0242755 | A1 | 9/2010 | Nagao |

(Continued)

FOREIGN PATENT DOCUMENTS

| JP | 03-036130 A | 2/1991 |
| JP | 03-093543 A | 4/1991 |

(Continued)

OTHER PUBLICATIONS

International Search Report; PCT/JP2011/003524; Sep. 6, 2011.
(Continued)

*Primary Examiner* — Leslie J Evanisko
(74) *Attorney, Agent, or Firm* — Studebaker & Brackett PC

(57) ABSTRACT

A screen printing apparatus includes print executing parts, first and second substrate loading parts and a substrate unloading part, and first and second substrate support tables for supporting a substrate. The first substrate support table moves between a first receiving position where the substrate loaded from the first substrate loading part is received, and a sending position where the substrate is unloaded from the substrate unloading part. The second substrate support table moves between a second receiving position where the substrate loaded from the second substrate loading part is received, and the sending position. The print executing parts are respectively placed at positions on the substrate support tables where printing on the substrate is enabled.

13 Claims, 35 Drawing Sheets

(51) Int. Cl.
*H05K 3/12* (2006.01)
*B41F 15/36* (2006.01)
*H05K 3/34* (2006.01)
*B41F 15/42* (2006.01)

(56) References Cited

U.S. PATENT DOCUMENTS

| | | |
|---|---|---|
| 2011/0259217 A1 | 10/2011 | Abe et al. |
| 2012/0085253 A1 | 4/2012 | Nagao |
| 2012/0085254 A1 | 4/2012 | Nagao |

FOREIGN PATENT DOCUMENTS

| | | |
|---|---|---|
| JP | 05-078542 A | 10/1993 |
| JP | 06-166166 A | 6/1994 |
| JP | 07-205399 A | 8/1995 |
| JP | 2002-225221 A | 8/2002 |
| JP | 2003-211631 A | 7/2003 |
| JP | 2005-081745 A | 3/2005 |
| JP | 2008-260212 A | 10/2008 |
| JP | 2008-272964 A | 11/2008 |
| JP | 2009-070867 A | 4/2009 |
| JP | 2010-253785 A | 11/2010 |
| JP | 2011-131488 A | 7/2011 |
| JP | 2011-143640 A | 7/2011 |
| WO | 2009/035136 A1 | 3/2009 |
| WO | 2010/122736 A1 | 10/2010 |

OTHER PUBLICATIONS

Japanese Office Action, "Notice of Reasons for Refusal", JP2009-292781, Jul. 16, 2013.

The extended European search report issued by the European Patent Office on Oct. 14, 2014, which corresponds to European Patent Application No. 11868168.3-1704 and is related to U.S. Appl. No. 14/127,454.

The extended European Search Report issued by the European Patent Office on Oct. 26, 2015, which corresponds to European Patent Application No. 15001642.6-1704 and is related to U.S. Appl. No. 14/127,454.

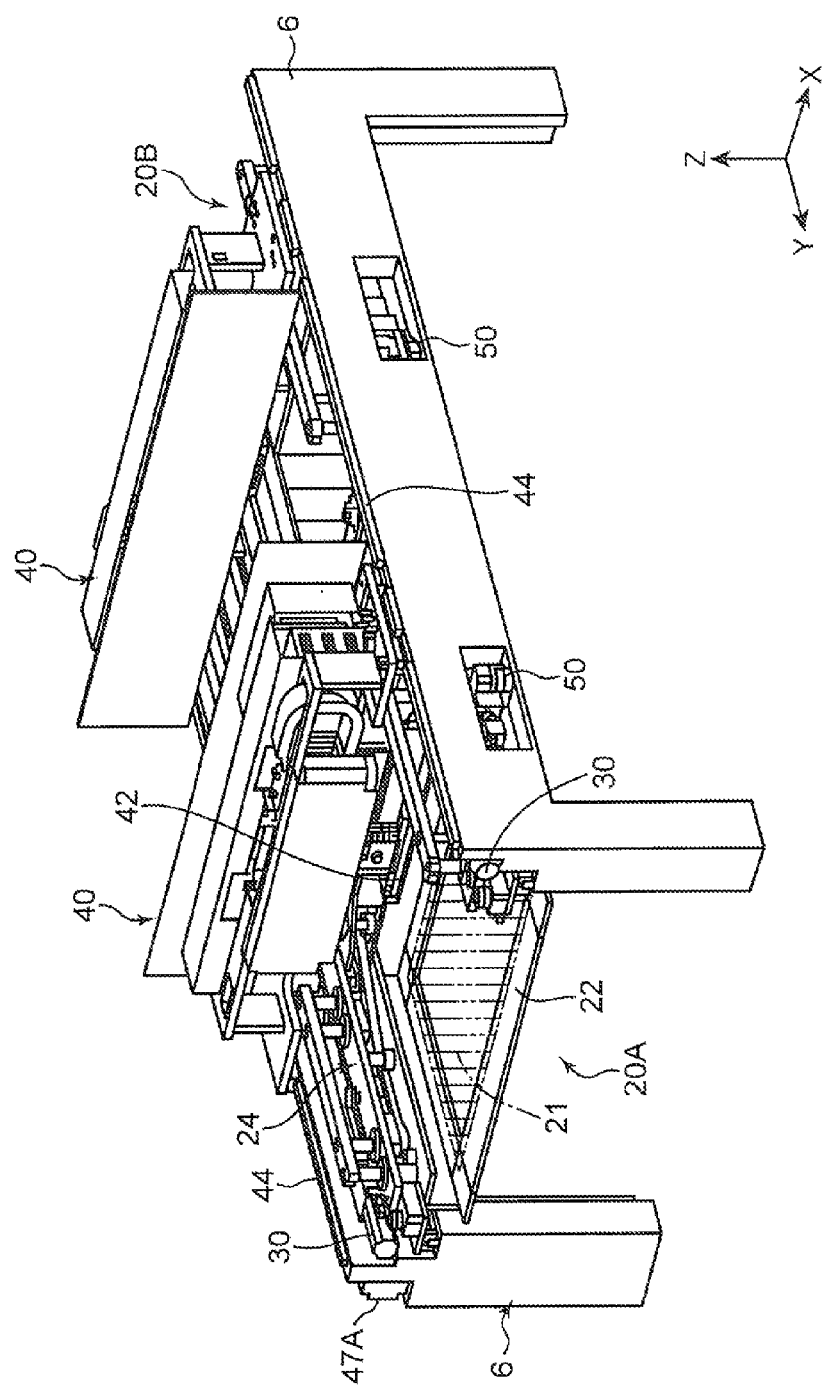

SCREEN PRINTING APPARATUS

CROSS REFERENCE TO RELATED APPLICATIONS

This application claims benefit of priority to International Patent Application No. PCT/JP2011/003524, filed Jun. 21, 2011, the entire content of which is incorporated herein by reference.

TECHNICAL FIELD

The present disclosure relates to a screen printing apparatus which prints solder cream, conductive paste or the like on a substrate such as a printed wiring board (PWB) or the like, as pre-processing for mounting components on the substrate.

BACKGROUND

A screen printing apparatus is built into the manufacturing line of a printed circuit board (PCB), and prints conductive paste or the like on a substrate that is transferred from the upstream side and delivers the substrate to the component mounting device on the downstream side. With this type of screen printing apparatus, generally speaking, as disclosed in Japanese Patent Laid-Open Publication No. H7-205399, one printing unit in the apparatus receives every substrate and delivered to the component mounting device in a one by one manner while being subject to a printing process.

In recent years, however, an apparatus, as disclosed in Japanese Patent Laid-Open Publication No. 2009-70867, for example, which comprises two printing units and two substrate moving stages therebelow respectively in parallel, and every substrate is individually received by the respective printing units from the upstream side and subsequently subjected to a printing process, and then delivered to the downstream side. This was achieved by using a so-called dual transfer-type component mounting device in which two substrate transfer lines are provided in an apparatus, and the mounting of components are carried out simultaneously (in parallel) with each transfer line, the aims of which is to streamline the printing and component mounting processes by coupling the screen printing apparatus and the component mounting device. For similar reasons, a type has been developed, such as disclosed in Japanese Patent Laid-Open Publication No. 2008-272964, in which one apparatus is provided with two transfer lines and with one screen mask formed with two printing patterns each corresponding to the respective transfer lines, so that the apparatus individually receives each substrate along the respective transfer lines, conducts a printing process using a different printing pattern for each transfer line, and subsequently delivers the substrates individually to the component mounting device.

Meanwhile, the manufacturing line of a printed circuit board will be configured in various forms in order to increase the production efficiency. For example, there may be a demand to install a screen printing apparatus between a device of a single transfer-type (hereinafter referred to as the "device of a single system") having one substrate transfer line, and a dual transfer-type component mounting device comprising two substrate transfer lines in parallel or a single transfer-type two component mounting devices (hereinafter collectively referred to as the "device of a dual system"), or conversely installing a screen printing apparatus between the upstream-side device of a dual system and the single system component mounting device. Moreover, even in a case where the screen printing apparatus is installed between an upstream-side device of a dual system and a component mounting device of a dual system thereby configuring two substrate transfer lines from the upstream-side device to component mounting device, there may also be demand for performing a printing process to a substrate which is transferred from the upstream-side device along the substrate transfer line on one side and, thereafter, for transferring the printed substrate to the component mounting device belonging to the substrate transfer line on the other side.

However, since a conventional device described in Japanese Patent Laid-Open Publication No. H7-205399 is based on the premise of being installed between an upstream-side device of a single transfer-type and a downstream-side device (component mounting device) of a single transfer-type, it is impossible to employ those devices as it is. Meanwhile, regarding conventional devices in Japanese Patent Laid-Open Publication No. 2009-70867 and Japanese Patent Laid-Open Publication No. 2008-272964, it is also impossible to employ those devices because the device is supposed to be installed between an upstream-side device of a dual transfer-type and a downstream-side device (component mounting device) of dual transfer-type, so that the substrate transfer lines are respectively and independently configured from the upstream-side device to the downstream-side device.

Therefore, if, for example, an apparatus in Japanese Patent Laid-Open Publication No. H7-205399 is to be applied as a screen printing apparatus in a case where the upstream side is a device of a single transfer-type and the downstream side is the device (supposed to be a component mounting device) of a dual transfer-type, the application in the actual practice would be conducted by installing a sorting device for sorting the destination of the substrates between the screen printing apparatus and the component mounting device. Moreover, when apparatuses of Japanese Patent Laid-Open Publication No. 2009-70867 and Japanese Patent Laid-Open Publication No. 2008-272964 are applied in the same case, a similar sorting device is disposed between the upstream-side device and the screen printing apparatus. Contrarily, if an apparatus in Japanese Patent Laid-Open Publication No. H7-205399 is to be applied as a screen printing apparatus in a case where the upstream side is a device of a dual transfer-type and the downstream side is the device (supposed to be a component mounting device) of a single transfer-type, a switching device for switching the source for receiving the substrates is disposed between the upstream-side device and the screen printing apparatus. Moreover, when apparatuses of Japanese Patent Laid-Open Publication No. 2009-70867 and Japanese Patent Laid-Open Publication No. 2008-272964 are applied in the same case, a similar switching device is disposed between the screen printing apparatus and the component mounting device.

Furthermore, if the device of Japanese Patent Laid-Open Publication No. 2009-70867 or Japanese Patent Laid-Open Publication No. 2008-272964 is applied as a screen printing apparatus to be installed between an upstream-side device of a dual system and a component mounting device of a dual system where the substrate is transferred along the substrate transfer line on one side of the two substrate transfer lines, the substrate is then subjected to printing process and thereafter the substrate is transferred to the component mounting device belonging to the substrate transfer line on the other side, a similar switching device would be disposed between the screen printing apparatus and the component mounting device.

In addition, even if a case where the screen printing apparatus described in Japanese Patent Laid-Open Publication No. 2009-70867 or Japanese Patent Laid-Open Publication No. 2008-272964 is to be installed between the upstream-side device of a dual system and downstream-side device(supposed to be a component mounting device) of the dual system, if the line pitch of the respective substrate transfer lines of the upstream-side device and the line pitch of the respective substrate transfer lines of the component mounting device were different, it would be impossible for the apparatus to solely be installed between the upstream-side device and the component mounting device, because the pitch of the transfer lines of the substrate on the substrate loading side and the pitch on the substrate unloading side are the same in that screen printing apparatus. Therefore, in the foregoing case, a relay device for relaying the transfer of the substrates would be additionally installed between the upstream-side device and the screen printing apparatus, or between the screen printing apparatus and the component mounting device.

However, a line configuration of providing incidental equipment such as the sorting device, the switching device or the relay device in addition to the screen printing apparatus as described above is undesirable in terms of space saving and cost reduction of the manufacturing equipment of printed circuit boards, there is room for improvement with respect to these points.

SUMMARY

The present disclosure was devised in view of the foregoing circumstances, and an object of this disclosure is to provide a screen printing apparatus that enables solely to install between a device of a single system and a device of a dual system, or between an upstream-side device of a dual system and a downstream-side device of a dual system having mutually different substrate transfer line pitches, without any supplemental equipment such as a sorting device.

In order to achieve the foregoing object, the screen printing apparatus of the present disclosure comprises: a print executing part positioned between a substrate loading position which enables loading of a substrate, and a substrate unloading position which enables unloading of a printed substrate, both of which are juxtaposing in a certain direction, the print executing part being configured to perform screen printing to a substrate; substrate support means that receives a substrate loaded from the substrate loading position, supports the substrate so that the print executing part enables the printing on the substrate, and unloads the printed substrate from the substrate unloading position; and control means that controls the substrate support means, wherein the substrate support means comprises first substrate support means and second substrate support means which are respectively juxtaposed movably in a Y axis direction which is orthogonal to an X axis direction under the presumption that the X axis is defined as the certain direction, the first substrate support means and second substrate support means have a common area in which movable areas of the first and second substrate support means partially overlap, wherein the control means executes one of operational controls: a first operational control in which the first substrate support means and the second substrate support means receive a substrate from a first substrate loading position and a second substrate loading position which are respectively predetermined as the substrate loading position at positions which are mutually different in the Y axis direction and which are outside of the common area and the first substrate support means and the second substrate support means unload a print-processed substrate from the substrate unloading position positioned within the common area; a second operational control in which the first substrate support means and the second substrate support means receive a substrate from the substrate loading position positioned within the common area and the first substrate support means and the second substrate support means unload a print-processed substrate from a first substrate unloading position and a second substrate unloading position which are respectively predetermined as the substrate unloading position at positions which are mutually different in the Y axis direction and which are outside of the common area; and a third operational control in which the first substrate support means and the second substrate means receive a substrate from a first substrate loading position and a second substrate loading position which are respectively predetermined as the substrate loading position at positions which are mutually different in the Y axis direction and which are positioned within the common area and the first substrate support means and the second substrate support means unload a print-processed substrate from a first substrate unloading position and a second substrate unloading position which are respectively predetermined as the substrate unloading position at positions which are mutually different in the Y axis direction and which are positioned within the common area, and wherein the print executing part is placed at a position at which the print executing part enables screen printing on the substrate supported by each of the substrate support means.

According to the foregoing screen printing apparatus, it is possible to install solely the screen printing apparatus between a device of a single system and a device of a dual system, or between an upstream-side device of a dual system and a downstream-side device of a dual system, without incidental equipment such as a sorting device, and perform printing to a substrate that is transferred from the upstream side and unload the substrate to the downstream side.

BRIEF DESCRIPTION OF THE DRAWINGS

FIG. 6 is a perspective view showing the print executing part and the like to be built into the screen printing apparatus.

DETAILED DESCRIPTION

The preferred embodiments of the present disclosure are now explained herein below in detail with reference to the appended drawings.

Figure 1:
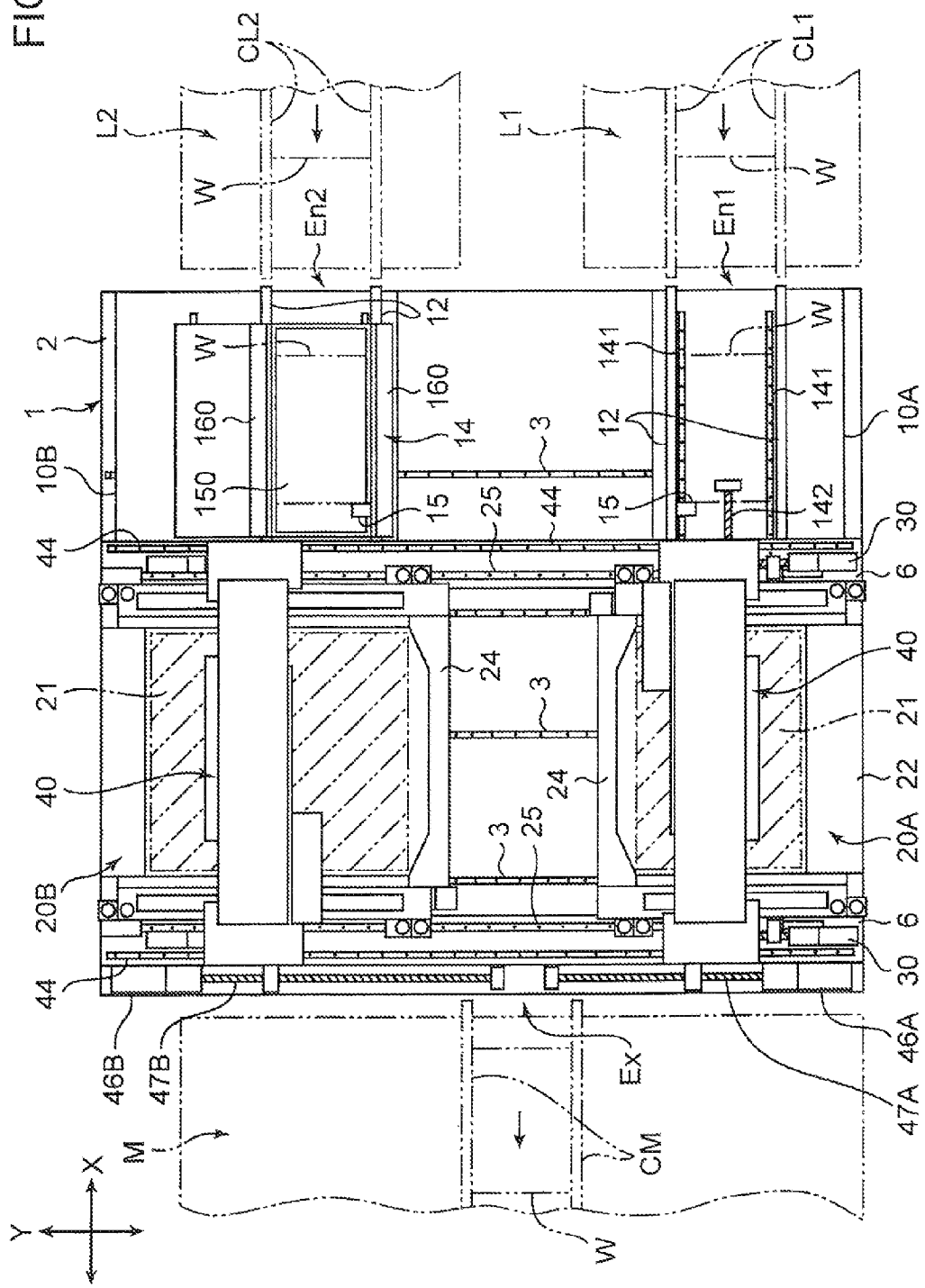
FIG. 1 is a plan view showing the first embodiment of the screen printing apparatus according to the present disclosure.
Figure 2:
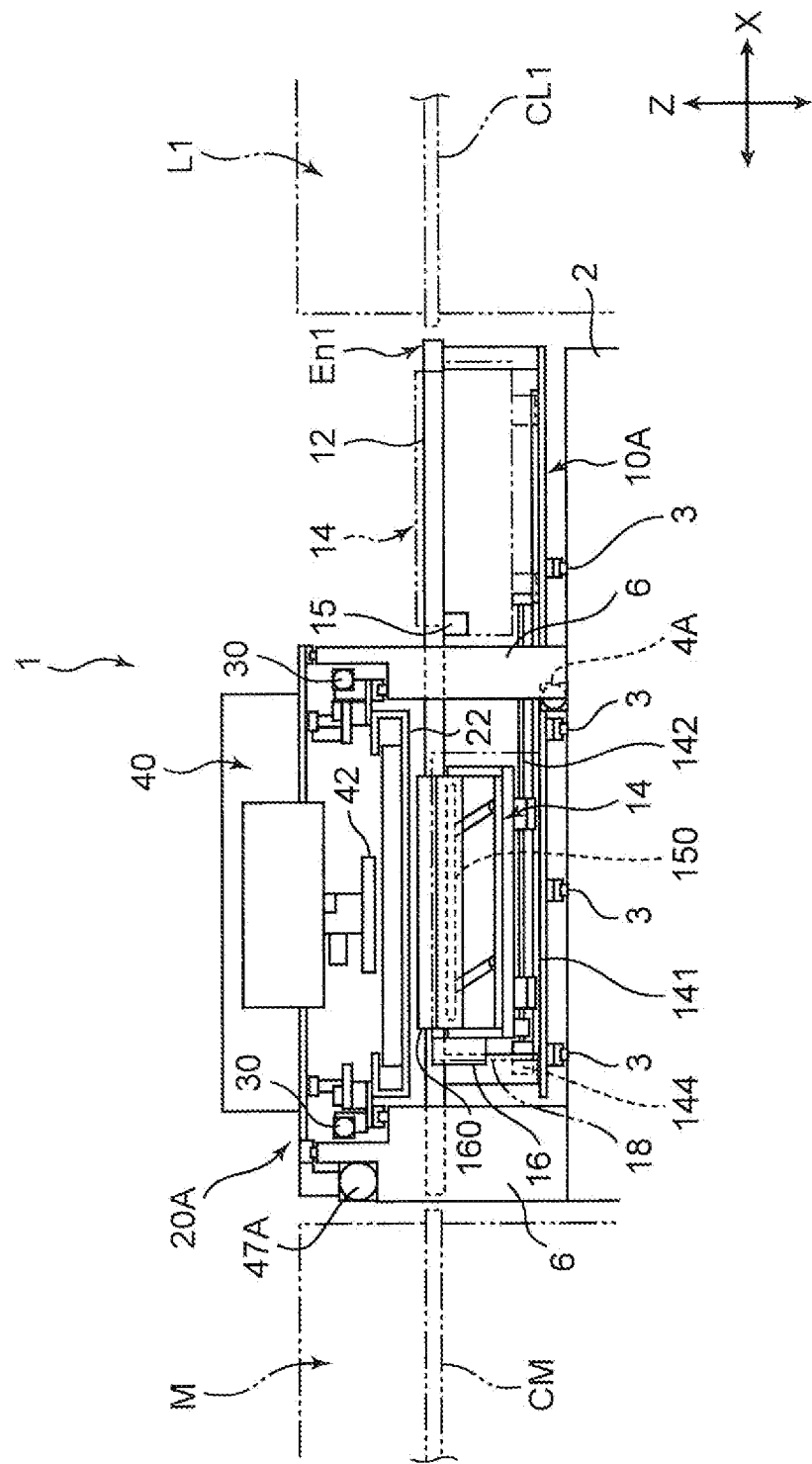
FIG. 2 is a front view showing the screen printing apparatus.

FIG. 1 and FIG. 2 show the first embodiment of the screen printing apparatus according to the present disclosure, wherein FIG. 1 is a plan view and FIG. 2 is a front view schematically showing the screen printing apparatus, respectively.

The screen printing apparatus 1 is built into the manufacturing line of a printed circuit board (PCB) being disposed between an upstream-side device of a dual system and a downstream-side device of a single system. In the illustrated example, the screen printing apparatus 1 (hereinafter abbreviated as the "printing apparatus 1") is installed between two loaders L1, L2 (first loader L1 and second loader L2) disposed in parallel, and one component mounting device M, thereby printing substrates W that are sent out from the respective loaders L1, L2 on the upstream side, and then forwarding the substrates W to the component mounting device M on the downstream side.

The ensuing explanation refers to the transfer direction of the substrate W in the manufacturing line as the X axis direction, the direction that is orthogonal to the X axis direction on the horizontal plane as the Y axis direction, and the direction (vertical direction) that is orthogonal to both the X axis direction and the Y axis direction as the Z axis direction for the explanation of the printing apparatus 1.

The printing apparatus 1 is provided on its foundation 2 with two substrate support tables 10A, 10B for supporting the substrates W, and two print executing parts 20A, 20B for performing printing individually to the substrates W supported by the substrate support tables 10A, 10B in a state where the substrate support tables 10A, 10B have respectively stopped at predetermined positions in the Y axis direction.

On the foundation 2, two substrate loading parts En1, En2 (first substrate loading part En1 and second substrate loading part En2) are set in correspondence with the positions of the loaders L1, L2 at one side end (upstream end in the substrate transfer direction) with respect to the X axis direction, and one substrate unloading part Ex set in correspondence with the position of the component mounting device M at the other side end (downstream end in the substrate transfer direction). The printing apparatus 1 loads the substrate W sent out from the first loader L1 from the first substrate loading part En1 or loads the substrate W sent out from the second loader L2 from the second substrate loading part En2, respectively. The printing apparatus 1 then unloads the printed substrate W from the common substrate unloading part Ex to the component mounting device M. The respective substrate loading parts En1, En2 are placed at positions across a predetermined interval in the Y axis direction, and the substrate unloading part Ex is placed at a position between the respective substrate loading parts En1, En2 with respect to the Y axis direction. In the Figure, reference numerals CL1, CL2, CM designate belt conveyer pairs, respectively mounted on the loaders L1, L2 and the component mounting device M. The substrate W is transferred along these belt conveyer pairs CL1, CL2, CM (hereinafter abbreviated as the "conveyer pairs CL1, CL2, CM").

Incidentally, the substrate loading parts En1, En2 and the substrate unloading parts Ex respectively refer to specific positions on the foundation 2, and the positions of the substrate loading parts En1, En2 and the substrate unloading parts Ex are set by a control machine 8 described later according to the respective loaders L1, L2 placed on the upstream side and the component mounting device M disposed on the downstream side. That is, the positions of the substrate loading parts En1, En2 in this embodiment are the substrate loading positions of the present disclosure, and the positions of the substrate unloading parts Ex are the substrate unloading positions (same in the respective embodiments described later).

The substrate support tables 10A, 10B (first substrate support table 10A and second substrate support table 10B or first substrate support device 10A and second substrate support device 10B), corresponding to the substrate support means of the present disclosure, receive the substrates W loaded from the loaders L1, L2 in the substrate loading parts En1, En2 and support the substrates W to enable printing on the substrates W, and send the printed substrates W to the component mounting device M in the substrate unloading part Ex. Of the substrate support tables 10A, 10B, the first substrate support table 10A receives the substrate W loaded from the loader L1 in the first substrate loading part En1 and supports the substrate W to enable printing on the substrates W by the first print executing part 20A. The second substrate support table 10B receives the substrate W loaded from the loader L2 in the second substrate loading part En2 and supports the substrate W to enable printing on the substrates W by the second print executing part 20B.

Figure 3:
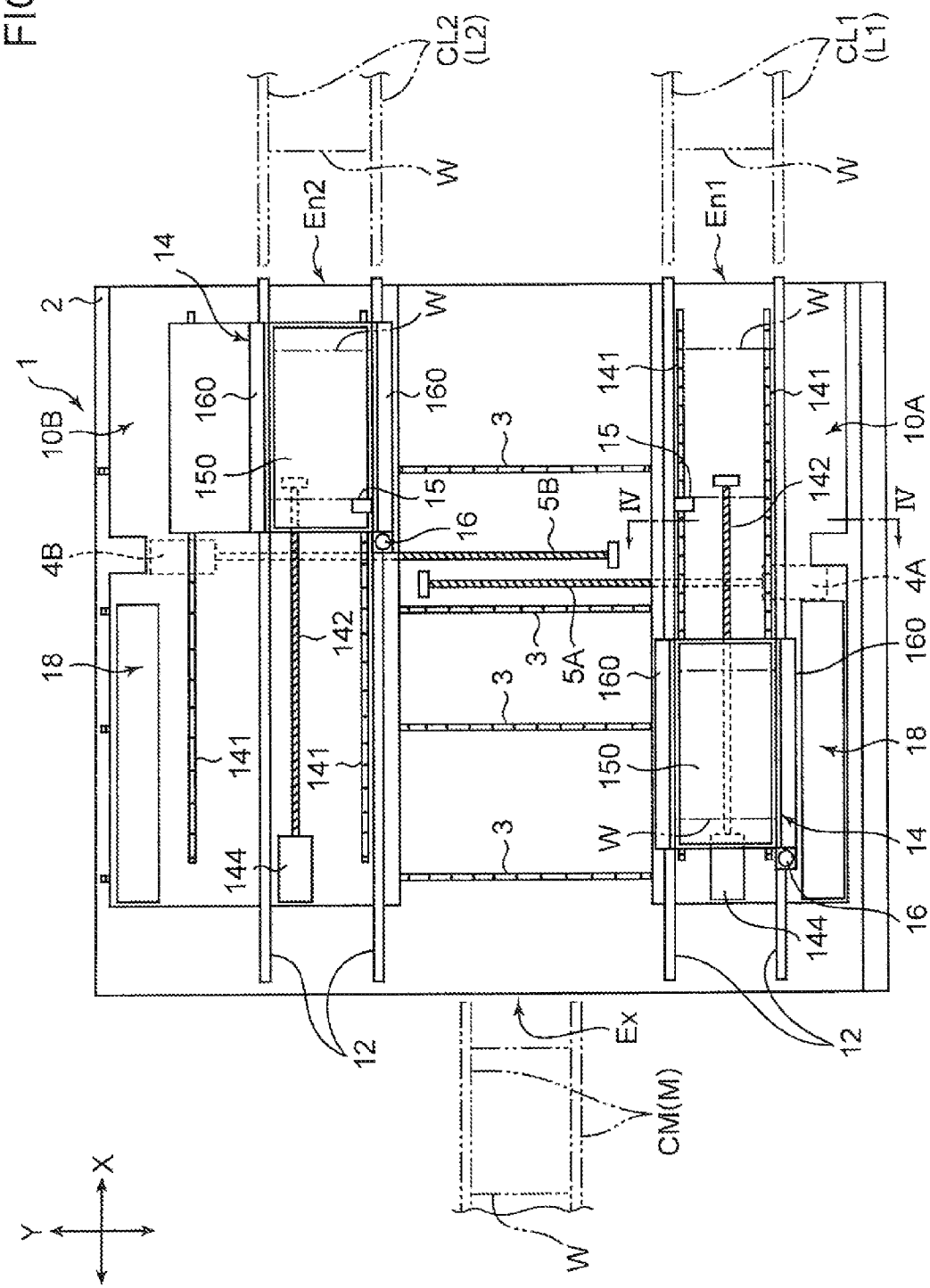
FIG. 3 is a plan view showing the substrate support table and its drive mechanism and the like to be built into the screen printing apparatus (plan view showing a state in which a print executing part and the like are omitted from the screen printing apparatus).

The respective substrate support tables 10A, 10B have a substantial rectangular shape in a plan view that is elongated in the X axis direction as shown in FIG. 3, and are configured to move individually in the Y axis direction by the table drive mechanism. The table drive mechanism is configured from a screw feeding mechanism. That is, the respective substrate support tables 10A, 10B are respectively configured to be supported movably on a common fixed rail 3 provided on the foundation 2 and extending in the Y axis direction, and to be driven by motors 4A, 4B via screw axes 5A, 5B. In addition, based on the motor control of the control machine 8 described later, the first substrate support table 10A is adapted to move between a receiving position (position shown in FIGS. 1 and 3; first receiving position) where the first substrate support table 10A can receive the substrate W loaded from the loader L1 in the first substrate loading part En1, and a position (sending position) where the first substrate support table 10A can unload the substrate W to the component mounting device M in the substrate unloading part Ex. Meanwhile, the second substrate support table 10B is adapted to move between a receiving position (position shown in FIGS. 1 and 3; second receiving position) where the second substrate support table 10B can receive the substrate W loaded from the loader L2 in the second substrate loading part En2, and the sending position. That is, the first substrate support table 10A can move between the first receiving position and the sending position defined as its movable area, and the second substrate support table 10B can move between the second receiving position and the sending position defined as its movable area. The sending position is positioned within a common area where a part of the movable area of the first substrate support table 10A and a part of the movable area of the second substrate support table 10B overlap with each other. When the first substrate support table 10A is positioned at the sending position, the second substrate support table 10B will be positioned at the first receiving position which avoids the first substrate support table 10A within its movable area, and when the second substrate support table 10B is positioned at the sending position, the first substrate support table 10A will be disposed at the second receiving position which avoids the second substrate support table 10B within its movable area.

The substrate support tables 10A, 10B respectively comprise a conveyer pair 12 for receiving the loaded substrate W and sending the printed substrate W to the substrate unloading part Ex, a conveyer width variable mechanism, a clamp unit 14 for supporting and fixing the substrate W on the conveyer pair 12 to perform printing performed thereon, a clamp unit drive mechanism for moving the clamp unit 14 in the X axis direction along the conveyer pair 12, and a cleaning unit 18 for cleaning a screen mask 21 described later.

Figure 5A:
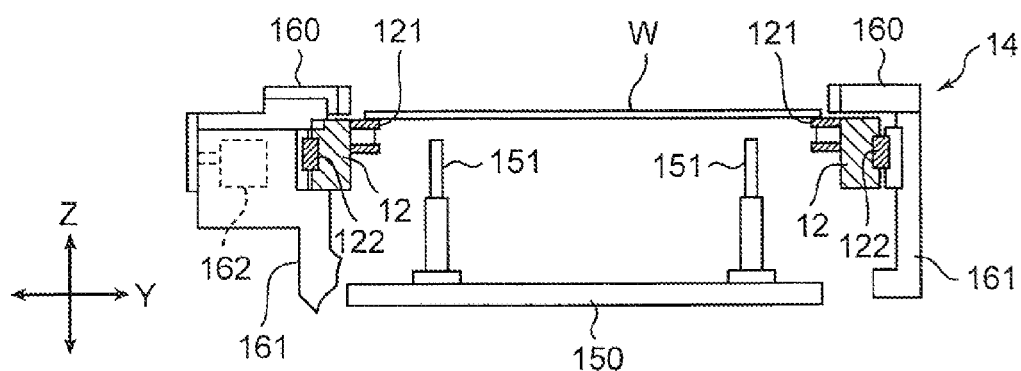
FIG. 5 is an enlarged view of the relevant part of the clamp unit in FIG. 4 (FIG. 5A shows the unclamped state of the substrate, and FIG. 5B shows the clamped state of the substrate).

The conveyer pair 12 comprises a belt conveyer, and, in a state of supporting either end of the substrate W in the Y axis direction with a belt 121 which rotates by being driven by a motor 120 (shown in FIG. 10), transfers the substrate W in the X axis direction pursuant to the movement of the belt (see FIG. 5A). The conveyer width variable mechanism changes the interval (that is, the conveyer width) of the two conveyers configuring the conveyer pair 12 according to the size of the substrate W. The conveyer width variable mechanism comprises a screw feeding mechanism, for example. That is, one of the two conveyers is a fixed conveyer that is fixed on the substrate support tables 10A, 10B, and the other conveyer is a movable conveyer which is movably supported by a fixed rail on the substrate support tables 10A, 10B so that the movable conveyer can move toward and away from the one conveyer (move in the Y axis direction). In addition, the interval of the two conveyers is changed by the other conveyer being driven along the fixed rail via a screw axis that is driven by the motor 123 (shown in FIG. 10). That is, the conveyer pair 12 is a variable stroke-type conveyer capable of changing the interval according to the size of the substrate W.

Incidentally, regarding the first substrate support table 10A positioned on the device's front side (lower side of FIG. 1 and FIG. 3) in this embodiment, the conveyer width variable mechanism is configured such that the back side of the conveyer pair 12 is a fixed conveyer and the front side is the movable conveyer, and the interval of the conveyers is changed with the back-side conveyer as a reference. Meanwhile, regarding the second substrate support table 10B positioned on the device's back side, the front side of the conveyer pair 12 is a fixed conveyer and the back side is the movable conveyer, and the interval of the conveyers is changed with the front-side conveyer as a reference. That is, as the whole printing apparatus 1, with respect to both substrate support tables 10A, 10B, the other conveyer is moved with the conveyer on the mutually adjacent side as a reference; in other words, the interval of the conveyers of the respective conveyer pairs 12 is changed with the device's inner side in the Y axis direction as a reference, and with the printing apparatus 1. The foregoing configuration contributes to the downsizing of the apparatus and the improvement of the throughput. This point will be explained in detail later.

The clamp unit 14 includes a base member 140 which is supported movably in the X axis direction along the fixed rail 141 provided on the substrate support tables 10A, 10B. On the base member 140, the clamp unit 14 comprises a backup mechanism for raising and supporting the substrate W from the conveyer pair 12, and a clamp mechanism for fixing the substrate W that was raised by the backup mechanism.

Figure 4:
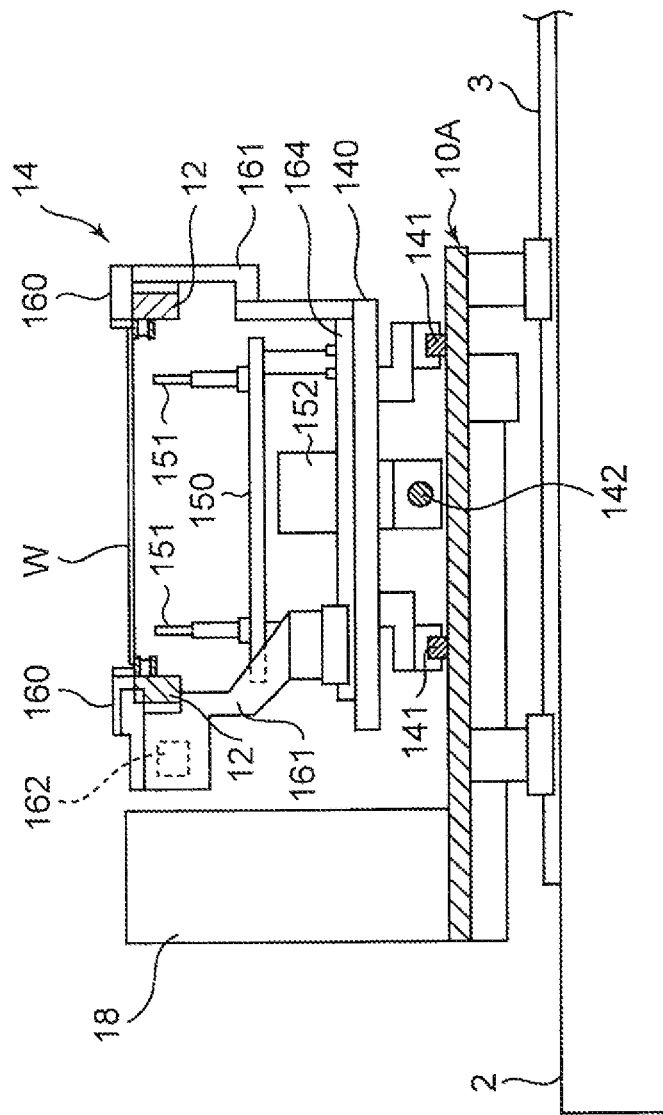
FIG. 4 is a cross section taken along line IV-IV of FIG. 3 of the screen printing apparatus showing the configuration of the substrate support table.
Figure 5B:
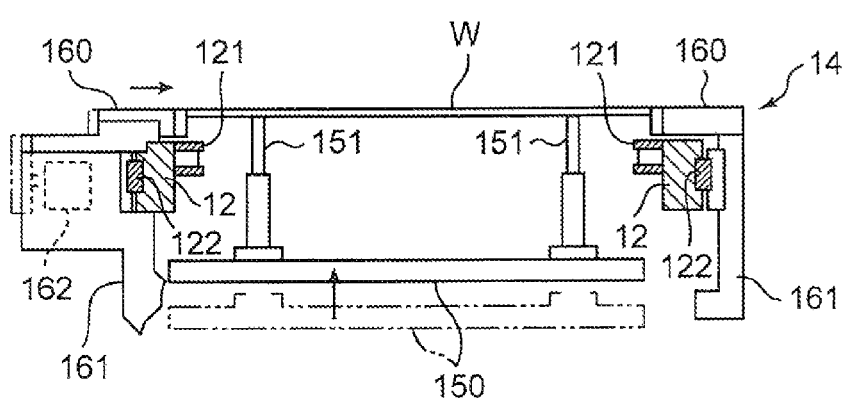

As shown in FIG. 4 and FIG. 5A, the backup mechanism comprises a plurality of backup pins 151 (hereinafter abbreviated as the "pins 151") of a predetermined arrangement. The backup mechanism further includes a backup table 150 (BU table 150) which is elevatably supported on the base member 140 via a link mechanism or the like, and a drive motor 152. The backup mechanism is configured so that the BU table 150 is displaced between a predetermined withdrawal position and an operating position raised therefrom by the drive of the motor 152. Here, the withdrawal position is a position (position shown in FIG. 5A) in which the tip position of the pins 151 places lower than the rear face of the substrate W supported by the conveyer pair 12 (belt 121), and the operating position is a position in which the tip position of the pins 151 places higher than the lower face of that substrate W. Accordingly, the backup mechanism raises the substrate W from the conveyer pair 12 when the BU table 150 is placed at the operating position as shown in FIG. 5B.

The clamp mechanism includes a pair of clamp members 160 disposed at a position above the conveyer 12 and extending parallel to each other with respect to the X axis direction, an arm member 161 to which the clamp members 160 are mounted, and an actuator for driving the clamp members; for instance, a bi-directional air cylinder 162. One of the two clamp members 160 (left side in FIGS. 4 and 5A) is mounted on the arm member 161 so that it can be displaced in the Y axis direction, and is displaced between the withdrawal position indicated in the Figure and the forward position indicated in FIG. 5B by the drive of the air cylinder 162. That is, with the clamp mechanism as shown in FIG. 5B, one clamp member 160 sandwiches and clamps the substrate W, which was raised by the backup mechanism, with the other clamp member 160 in the Y axis direction as a result of the one clamp member 160 being displaced from the withdrawal position to the forward position.

The respective arm members 161 of the clamp mechanism are formed so as to embrace the conveyer pair 12 from the outside (outside in the Y axis direction), and are respectively slidably coupled to a fixed rail 122 mounted on the respective conveyer pairs 12 in the X axis direction. Since the respective arm members 161 are so configured to be guided by being coupled to the conveyer pair 12 (fixed rail 122), in a foregoing manner, the relative position between the conveyer pair 12 and the respective clamp members 160 with respect to the Y axis direction can be maintained to be constant despite the clamp unit 14 being moved in the X axis direction as explained later.

Moreover, one of the respective arm members 161; specifically, the arm member 161 (right-side arm member in FIG. 4) on the one side that is coupled to the fixed conveyer of the conveyer pair 12 is fixed to the base member 140, and the arm member 161 (left-side arm member in FIG. 4) on the other side that is coupled to the movable conveyer is supported movably in the Y axis direction along the fixed rail 164 provided on the base member 140. Accordingly, when the interval of the conveyer pair 12 is changed, one arm member 161 will move in the Y axis direction integrally with the movable conveyer, and the interval of both clamp members 160 will thereby be automatically adjusted. That is, the interval of both clamp members 160 will be automatically changed to an interval that will enable the clamping of the substrate W that is transferred after the interval of the conveyer pair 12 is changed. Each of the clamp members 160 is configured so that the clamp member mounted on the movable conveyer side is driven. With this configuration, the substrate W is clamped with respect to a reference defined by the fixed conveyer side. Accordingly, with the clamp unit 14 of the first substrate support table 10A, the substrate W is clamped with respect to a reference defined by the device's back side, and with the clamp unit 14 of the second substrate support table 10B, the substrate W is clamped with respect to a reference defined by the device's front side.

The clamp unit drive mechanism is configured from a screw feeding mechanism. That is, the base member 140 of the clamp unit 14 is configured to be movably supported on the fixed rail 141 provided on the foundation 2 and extending in the X axis direction, and to be driven by the motor 144 via the screw axis 142. With respect to respective substrate support tables 10A, 10B, the position near the substrate loading parts En1, En2 is set as a substrate standby position, and a predetermined position that is downstream thereof is set as a print executing position. Then, the clamp unit 14 moves between the substrate standby position (position indicated with a two-dot chain line in FIG. 2) and the print executing position (position indicated with a solid line in FIG. 2) in accordance with the motor control of the control machine described later.

Incidentally, while only the clamp unit 14 of the first substrate support table 10A is shown in FIGS. 2, 4 and 5, the configuration of the second substrate support table 10B is basically similar with the first substrate support table 10A excluding the point that the substrate W is clamped with respect to a reference defined by the device's front side.

While a detailed view is omitted, the cleaning unit 18 comprises a cleaning head including pad that is slidable on the lower face of the screen mask 21 described later, and a suction nozzle for sucking the screen mask 21 by negative pressure via the pad. When the substrate support tables 10A, 10B move in the Y axis direction, the cleaning unit 18 slide contacts the cleaning head with the lower face of the mask 21 to remove the paste remaining on the lower face of the mask and in the pattern holes. The cleaning head is configured to be elevatable relatively to the substrate support tables 10A, 10B, to be placed at the operating position that is slidable on the screen mask 21 only during the cleaning process, and otherwise to be placed at the withdrawal position lowered from the operating position.

Reference numeral 15 in FIG. 1 to FIG. 3 designates a stopper mechanism of the conveyer pair 12, which is used for causing the substrate W received on the conveyer pair 12 to stand by at the substrate standby position. The stopper mechanism 15 includes a stopper axis that is driven forward or backward by an actuator such as an air cylinder so that the stopper mechanism 15 is configured to enable switching between an activated state of restricting the movement of the substrate W by moving the stopper axis forward in the transfer path of the substrate W by the conveyer pair 12, and a stopped state of withdrawing the stopper axis outside the transfer path and allowing the movement of the substrate W.

Moreover, reference numeral 16 in the Figure designates the mask recognition camera mounted on the clamp unit 14. The mask recognition camera 16 is a camera comprising a CCD area sensor or the like, and is adapted for imaging, from the lower side, signs such as marks or symbols indicated on the lower face of the screen mask in order to recognize the relative position between the screen mask 21 described later and the substrate W.

Incidentally, the first print executing part 20A is provided above the first substrate support table when the first substrate support table is placed at the first receiving position for receiving the substrate, and the second print executing part 20B is provided above the second substrate support table when the second substrate support table is placed at the second receiving position for receiving the substrate.

FIG. 6 is a perspective view showing a state where only the print executing parts 20A, 20B are extracted from the printing apparatus 1. The print executing parts 20A, 20B are juxtaposed in the Y axis direction, and respectively include a mask holding mechanism for holding the mask 21, a squeegee unit 40 disposed in the X axis direction, a squeegee drive mechanism disposed in the Y axis direction and moving the squeegee unit 40 in the Y axis direction, and the like. Each mechanism that configures the print executing parts 20A, 20B is mounted on a pair of apparatus frames 6 each of which is formed in a gate shape and is installed on the foundation 2 with a predetermined interval with respect to the X axis direction. The pair of apparatus frames 6 are adapted to straddle the substrate W that moves from the substrate standby position to the print executing position on the first substrate support table 10A, the substrate W that moves from the substrate standby position to the print executing position on the second substrate support table 10B, and the substrate W that moves from the print executing position P2 to the substrate unloading part Ex on the substrate support tables 10A, 10B positioned at the sending positions.

Figure 7:
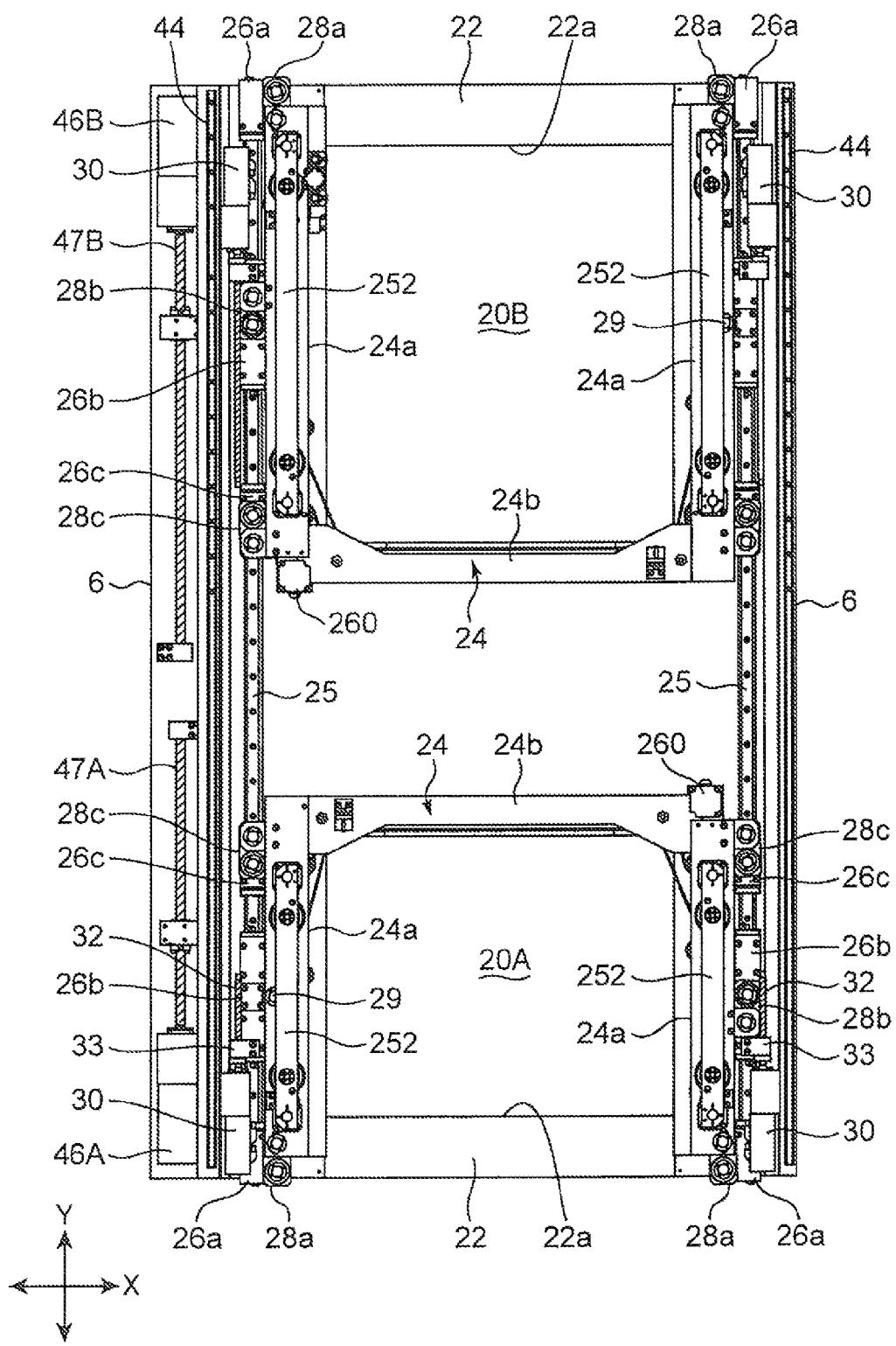
FIG. 7 is a plan view showing the print executing part.
Figure 8:
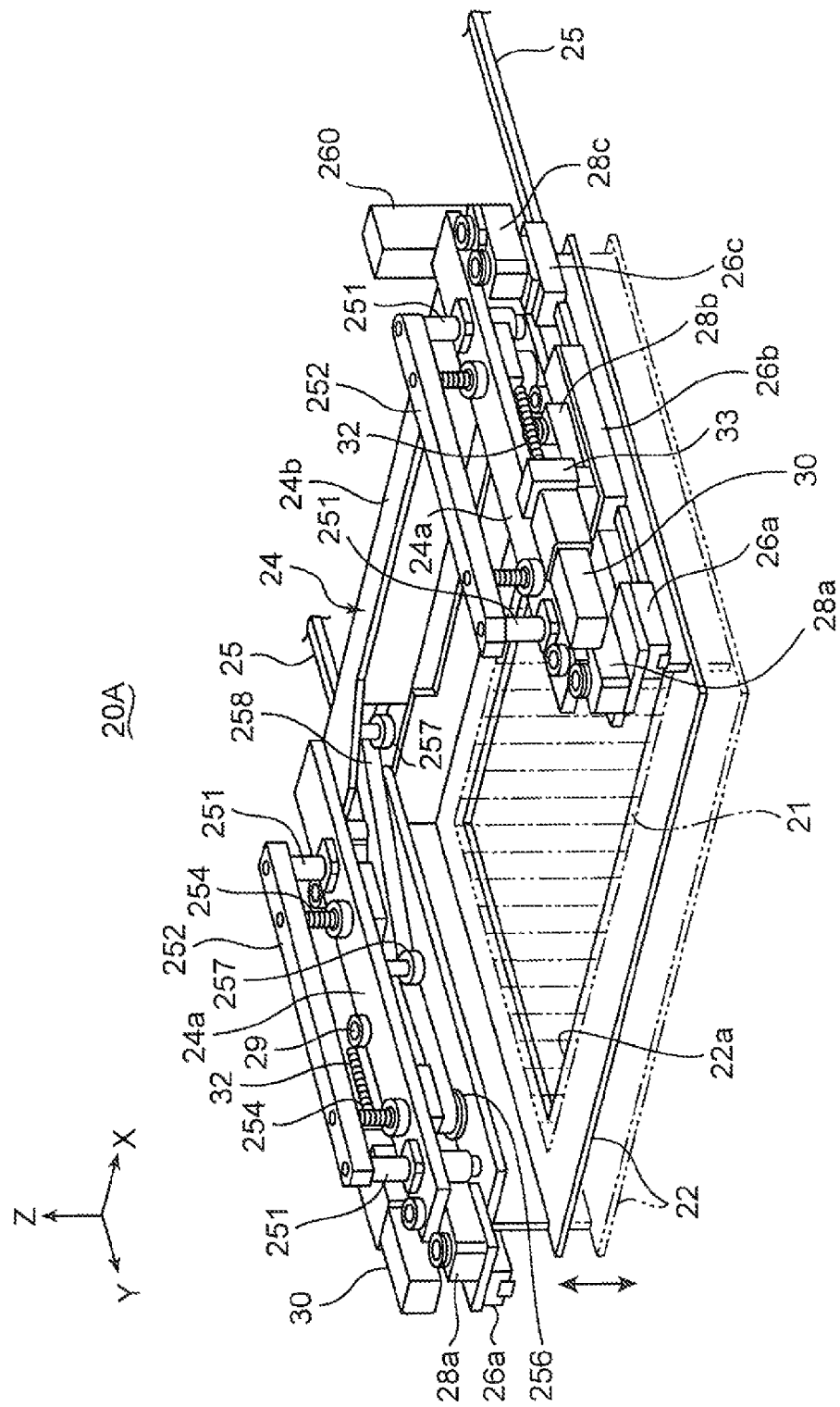
FIG. 8 is a perspective view showing the mask holding mechanism for holding the screen mask.

As shown in FIGS. 6 to 8, each mask holding mechanism includes a mask fixing member 22 of a rectangular shape to which the screen mask 21 (hereinafter abbreviated as the "mask 21") is mounted detachably, an elevating drive mechanism for elevating the mask fixing member 22, a rotating drive mechanism for rotating the fixing member 22 around the Z axis together with the elevating drive mechanism, and a Y axis drive mechanism for moving the fixing member 22 in the Y axis direction together with the elevating drive mechanism.

As shown in FIGS. 7 and 8, the mask fixing member 22 has a rectangular shape formed at the center thereof with an opening 22a for printing, and the opening 22a is configured to be covered by the mask 21 which is previously mounted on a frame.

Each driving mechanism of the mask fixing member 22 is configured as follows.

Each apparatus frame 6 is provided with fixed rails 25 extending in the Y axis direction. A mask support member 24 for elevatably supporting the mask fixing member 22 is movably supported by the fixed rails 25. Specifically, the mask support member 24 has a U-shape in a plan view, which is consisting of a pair of Y axis plate parts 24a extending along the fixed rail 25 and an X axis plate part 24b which connects the ends of the Y axis plate parts 24a, so that the mask support member 24 can move in the Y axis direction as a result of the respective Y axis plate parts 24a being coupled to sliders 26a to 26c mounted on each of the fixed rails 25.

As shown in FIG. 8, a pair of guide axes 251 extending in the Z axis direction penetrates the each of Y axis plate parts 24a of the mask support member 24 so that the mask fixing member 22 is fixed to the bottom end of the guide axes 251. A connecting member 252 is fixed to the upper ends of the pair of guide axes 251. A pair of pulley nuts 256 is placed between the guide axes 251 on the respective Y axis plate parts 24a of the mask support member 24 and mounted rotatably on the respective Y axis plate parts 24a but fixed with respect to the Z axis direction. Screw axes 254 are screwed and inserted into the respective pulley nuts 256 in the Z axis direction and ends of the screw axes 254 are fixedly supported by the mask fixing member 22 and the connecting member 252. Moreover, the motor 260 is fixed to the mask support member 24. A drive pulley not shown is mounted on an output axis of the motor 260. A drive belt 258 is placed across the drive pulley, a plurality of idle pulleys 257 mounted on the mask support member 24, and the pulley nuts 256.

With the foregoing configuration, when the motor 260 is driven, the rotation thereof is transmitted to the pulley nuts 256 via the drive belt 258. The pulley nuts 256 are thereby rotated, and the screw axis 254 moves in the axis direction thereof pursuant to the foregoing rotation. Consequently, as shown with the arrow in FIG. 8, the mask fixing member 22 fixed by the screw axis 254 is guided by the guide axes 251 and moves in the up-down direction (Z axis direction). Therefore, during the printing, in accordance with the control of the motor 260 of the control machine described later, the mask 21 is displaced between an overlapping height position (position indicated with a two-dot chain line in FIG. 8) where the mask 21 is placed atop the substrate W which is supported by the substrate support tables 10A, 10B, more specifically, the substrate W clamped by the clamp unit 14 in a state of being raised from the conveyer pair 12, and a withdrawal position (position indicated with a solid line in the Figure) that is higher than the foregoing height position.

Figure 9:
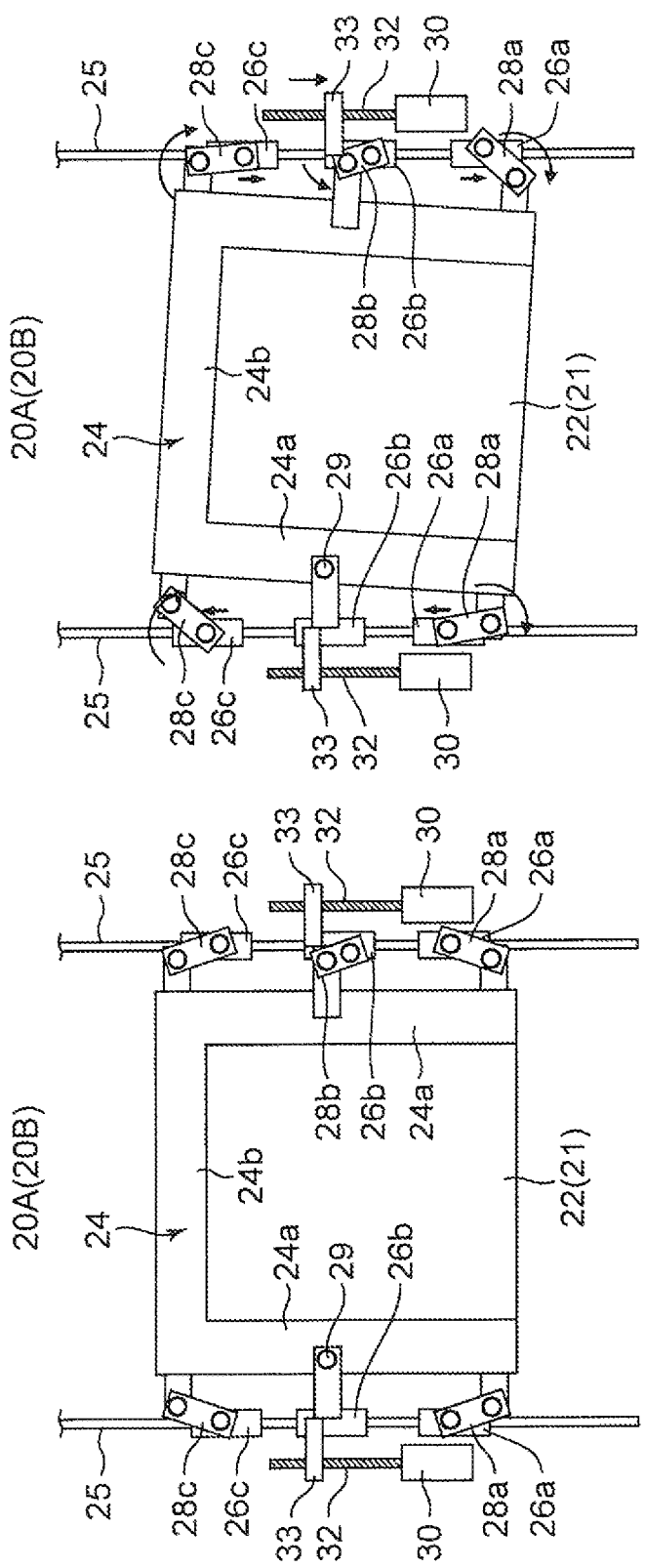
FIG. 9 is a schematic plan view of the mask holding mechanism explaining the rotating drive mechanism and the Y axis drive mechanism to be built into the mask holding mechanism (FIG. 9A shows a state before the mask rotation, and FIG. 9B shows a state after the mask rotation, respectively).

The mask support member 24 is coupled to the sliders 26a to 26c mounted on the respective fixed rails 25 as described above. Specifically, the respective Y axis plate parts 24a are coupled to the sliders 26a to 26c via the link members 28a to 28c so as to allow the displacement of the mask support member 24 around the Z axis with a specific position as the fulcrum. FIG. 9A is a Figure schematically showing the mask support member 24 and the like for facilitating the understanding of the foregoing structure. As shown in this Figure, in the mask support member 24, the middle position of the Y axis plate part 24a on one side (left side in the Figure) is coupled to the slider 26b via the pin 29. End positions in the Y direction of the Y axis plate part 24a on one side are respectively coupled with the sliders 26a, 26c via the link members 28a, 28c which are a pin-coupling on both ends. Moreover, three portions or both ends in the Y axis direction and intermediate portion therebetween in the Y axis plate part 24a on the other side of the mask support member 24 are similarly coupled with the sliders 26a to 26c via the link members 28a to 28c of the pin coupling on either end.

In addition, the nut member 33 is fixed to the respective sliders 26b which is in the middle among the three sliders 26a to 26c which are respectively coupled to the respective Y axis plate parts 24a of the mask support member 24. A screw axis 32 extending in the Y axis direction is screwed and inserted into the nut member 33. The screw axis 32 is integrated with the output axis of the motor 30 fixed to the apparatus frame 6.

With the foregoing configuration, when the respective motors 30 are driven at an equal speed in the same direction, the mask support member 24 moves in the Y axis direction while maintaining its state. Meanwhile, as shown in FIG. 9B, for example, when one of the motors 30 is solely driven, the mask support member 24 rotates around the Z axis with the pin 29 as the fulcrum.

In each of the print executing parts 20A, 20B, the squeegee unit 40 is respectively disposed above the mask holding mechanism. The squeegee unit 40 is for spreading paste such as solder cream or conductive paste on the mask 21 via rolling (kneading), and includes a single squeegee 42, a squeegee angle variable mechanism not shown for changing a inclination direction and the inclination angle of the squeegee 42 relative to the mask 21, a squeegee elevating mechanism not shown for elevating the squeegee 42 between a printing work height position where the squeegee 42 slidably contacts with the mask 21 and a withdrawal position (position indicated in FIG. 2 and FIG. 6) that is higher than the foregoing position, and other elements.

The squeegee drive mechanism for driving the squeegee unit 40 in the Y axis direction is configured from a screw feeding mechanism. That is, as shown in FIGS. 6 and 7, each squeegee unit 40 of the respective print executing parts 20A, 20B is movably supported on the common fixed rails 44 provided on the apparatus frame 6 and extending in the Y axis direction, and is respectively configured to be independently driven by the motors 46A, 46B via the screw axes 47A, 47B, respectively.

Incidentally, in FIG. 6, reference numeral 50 designates a substrate recognition camera that is used from the upper side for imaging signs such as marks and symbols of the substrate W to recognize the relative position between the substrate W supported by each of the substrate support tables 10A, 10B and the print executing parts 20A, 20B. As well as the mask recognition camera 16, the substrate recognition camera 50 is a camera comprising a CCD area sensor or the like, and the substrate recognition camera 50 is fixed at positions corresponding to the respective print executing parts 20A, 20B on the side of the substrate loading parts En1, En2 among the apparatus frames 6.

Figure 10:
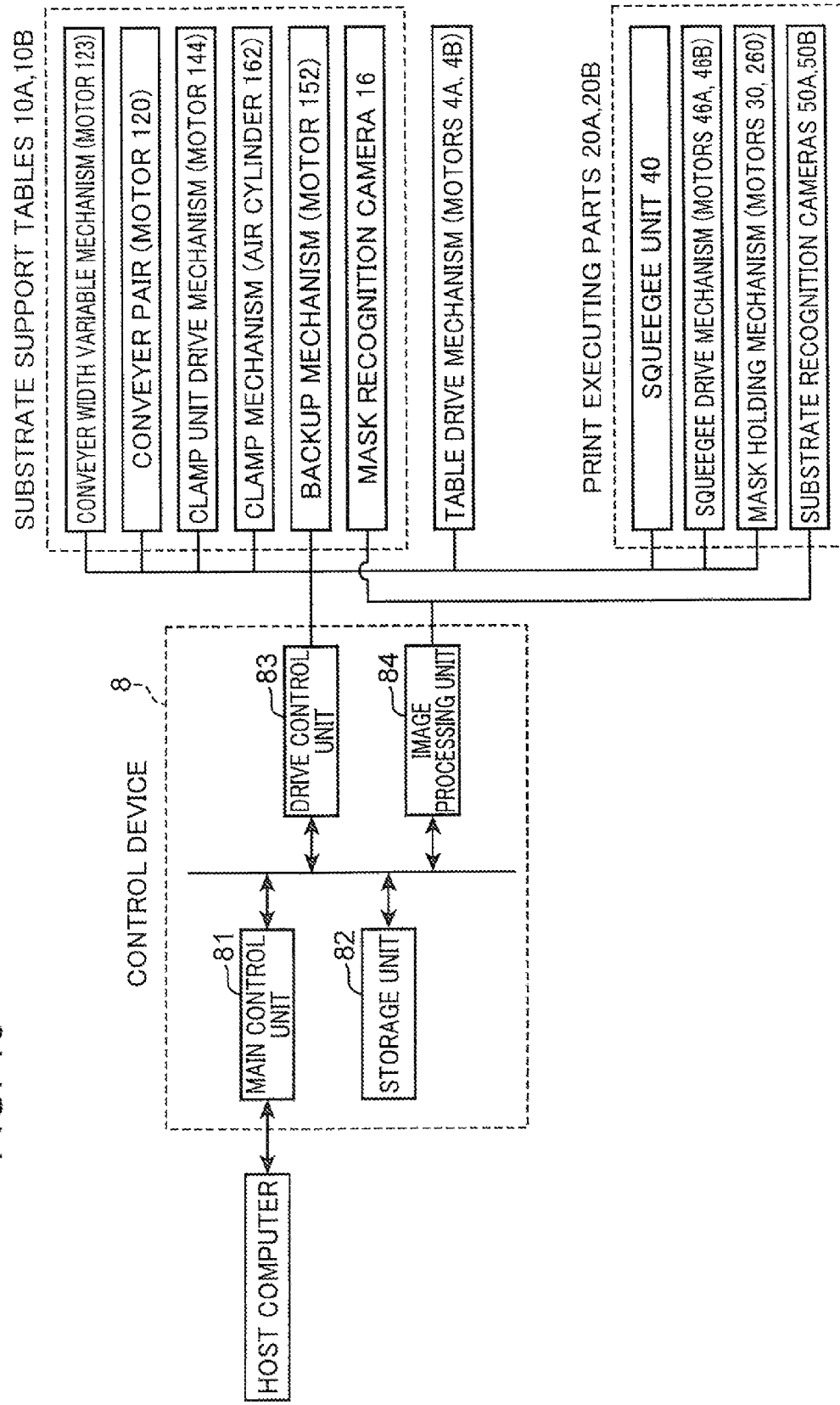
FIG. 10 is a block Figure showing the electrical configuration of the screen printing apparatus.

The printing apparatus 1 comprises a control machine 8 (corresponds to the control means of the present disclosure) having a CPU and the like as its constituent elements. The control machine 8, as shown in FIG. 10, comprises a main control unit 81 for governing the control of the operation of the overall printing apparatus 1, a storage unit 82 for storing various processing programs and various data, a drive control unit 83 for controlling the drive of the substrate support tables 10A, 10B and the print executing parts 20A, 20B, and an image processing unit 84 for performing predetermined image processing to the image data from each of the recognition cameras 16, 50A, 50B. These elements such as main control unit 81 and the like are mutually connected via a bus to enable the exchange of signals. In addition, the main control unit 81 governs the control of the series of printing operations to be performed by the substrate support tables 10A, 10B and the print executing parts 20A, 20B based on the print execution programs or the like given by an external host computer; that is, the series of printing operations including the interval adjustment of the conveyer 12 corresponding to the substrate W to be printed, the reception of the substrate W loaded from the loaders L1, L2 in the substrate loading parts En1, En2, the printing process to be performed by the print executing parts 20A, 20B, and the unloading of the substrate W to the component mounting device M in the substrate unloading part Ex.

The print execution programs and the like given from the host computer to the printing apparatus 1 contain data related to the positions of the conveyer pairs CL1, CL2 of the respective loaders L1, L2 and the positions of the conveyer pairs CM1, CM2 of the component mounting device M, coupled to the printing apparatus 1, and data related to the size (dimension) of the substrate W to be printed. Based on the foregoing print execution programs and the like, the main control unit 81 performs the initialization including the setting of the positions of the substrate loading parts En1, En2 and the substrate unloading part Ex. The main control unit 81 then controls the series of printing operations based on the positions of substrate loading parts En1, En2 and the substrate unloading part Ex set in the foregoing initialization.

The host computer governs the control of the manufacturing line of a printed circuit board to which the printing apparatus 1 is built therein. All devices (loaders L1, L2 and component mounting device M), including the printing apparatus 1, to be built into the manufacturing line are connected online so as to enable intercommunication with the host computer. The print execution program and various data are thus given to the respective devices of the printing apparatus 1 form the host computer.

The printing operation of the printing apparatus 1 in accordance with the control of the control machine 8 is now explained with reference to FIGS. 11 and 12.

Figure 11A:
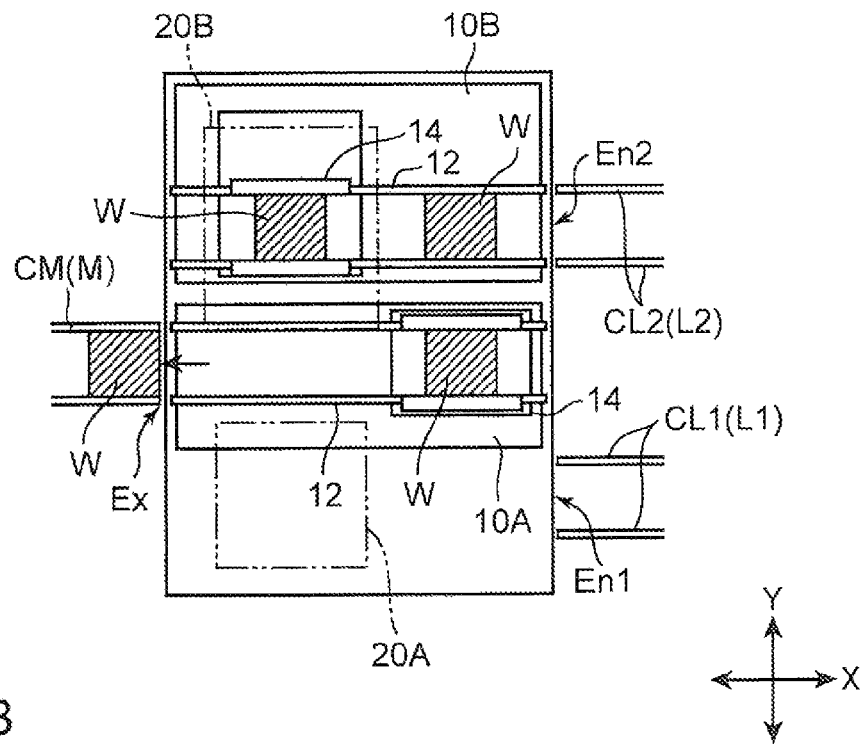
FIG. 11 is a schematic plan view explaining the printing operation of the screen printing apparatus in accordance with the control of the control machine (FIGS. 11A and 11B show the printing operation in accordance with a time series).

FIG. 11A schematically shows a state of a specific timing in the printing operation that is being performed continuously in the printing apparatus 1. Specifically, FIG. 11A shows the state immediately after the completion of printing of the substrate W supported by the second substrate support table 10B. The state of the substrate support tables 10A, 10B and the print executing parts 20A, 20B at this timing is as follows.

The second substrate support table 10B is being placed at the second receiving position where the conveyer pair 12 aligns with the second substrate loading part En2. In the second substrate support table 10B, the clamp unit 14 is being placed at the print executing position in a state of clamping the substrate W, and a subsequent substrate W is standing by at the substrate standby position. The second print executing part 20B is thus being a predetermined standing state where the mask 21 is detached from the substrate W by placing the mask support member 24 at the withdrawal position, and the squeegee 42 is placed at the standby position above one end of the mask.

Meanwhile, the first substrate support table 10A is placed at the sending position where the conveyer pair 12 aligns with the substrate unloading part Ex. The first substrate support table 10A just unloaded the substrate W previously subjected to printing, from the substrate unloading part Ex to the component mounting device M, and the clamp unit 14 is in a state of being placed at the substrate standby position and clamping the subsequent substrate W. Here, the clamping of the substrate W is performed, after the clamp unit 14 is moved to the substrate standby position, by lifting the substrate W from the conveyer pair 12 by the BU table 150, as shown in FIG. 5, and further sandwiching the substrate W by a pair of the clamp members 160 from both sides in the Y axis direction.

From a state as shown in FIG. 11A, the first substrate support table 10A moves initially toward the first receiving position, or a position where the conveyer pair 12 aligns with the first substrate loading part En1. At this timing, the substrate W will be transferred from the substrate standby position to the print executing position by the movement of the clamp unit 14, and during the foregoing transfer, the position of the substrate W on the clamp unit 14 is subjected to capture recognition by capturing a plurality of signs on the substrate W by the substrate recognition camera 50 at a position corresponding to the first print executing part 20A. Also a relative position between the mask 21 and the clamp unit 14 is subjected to capture recognition by capturing a plurality of signs of the mask 21 of the first print executing part 20A by the mask recognition camera 16 mounted on the clamp unit 14. Based on the recognition results, a position gap between the mask 21 and the substrate W at the print executing position is obtained, and the correction values ($\Delta X$, $\Delta Y$, $\Delta R$) of the X axis, Y axis, and R axis (around Z axis) directions of the mask 21 according to the obtained position gap are obtained. The foregoing recognition processing and calculation of correction values are performed by the control machine based on the images that were captured by the substrate recognition camera 50 and the mask recognition camera 16.

Moreover, the second substrate support table 10B moves from the second receiving position to the sending position in a manner of following the movement of the first substrate support table 10A.

Figure 11B:
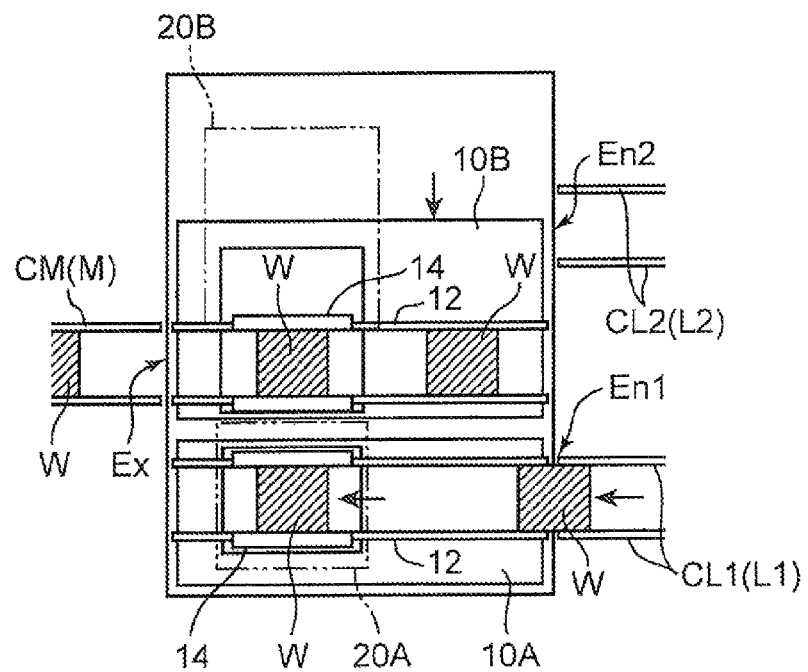

Consequently, as shown in FIG. 11B, the first substrate support table 10A is placed at the first receiving position and the second substrate support table 10B is placed at the sending position, respectively.

When the first substrate support table 10A is placed at the first receiving position, printing to the substrate W is performed by the first print executing part 20A. During that time, the subsequent substrate W is transferred from the loader L1 to the first substrate support table 10A and placed at the substrate standby position in the first substrate loading part En1. At this moment, since the substrate W at the print executing position is clamped by the clamp unit 14 in a state of being raised from the conveyer pair 12, a position gap will not occur despite the transfer of the subsequent substrate W by the drive of the conveyer pair 12.

In the printing of the substrate W by the first print executing part 20A, the mask support member 24 is initially lowered from the withdrawal position to the overlapping height position, and the mask 21 is fit atop the substrate W. At this operation, the relative position between the mask 21 and the substrate W are corrected by the motors 30, 144 which are controlled based on the correction values ($\Delta X$, $\Delta Y$, $\Delta R$). Specifically, the mask 21 is appropriately fit atop the substrate W by respectively exerting the position corrections (correction value $\Delta X$) of the substrate W with respect to the X axis direction being performed based on the drive of the motor 144, and the position corrections (correction value $\Delta Y$) of the mask 21 with respect to the Y axis direction and the position corrections (correction value $\Delta R$) of the mask 21 with respect to the R axis direction being performed based on the drive of the two motors 30.

When overlapping of the mask 21 with the substrate W is completed, the squeegee 42 is lowered from the withdrawal position to the printing work height position, and the overall squeegee unit 40 including the squeegee 42 is thereafter moved in the Y axis direction so as to perform printing on the substrate W.

Figure 12A:
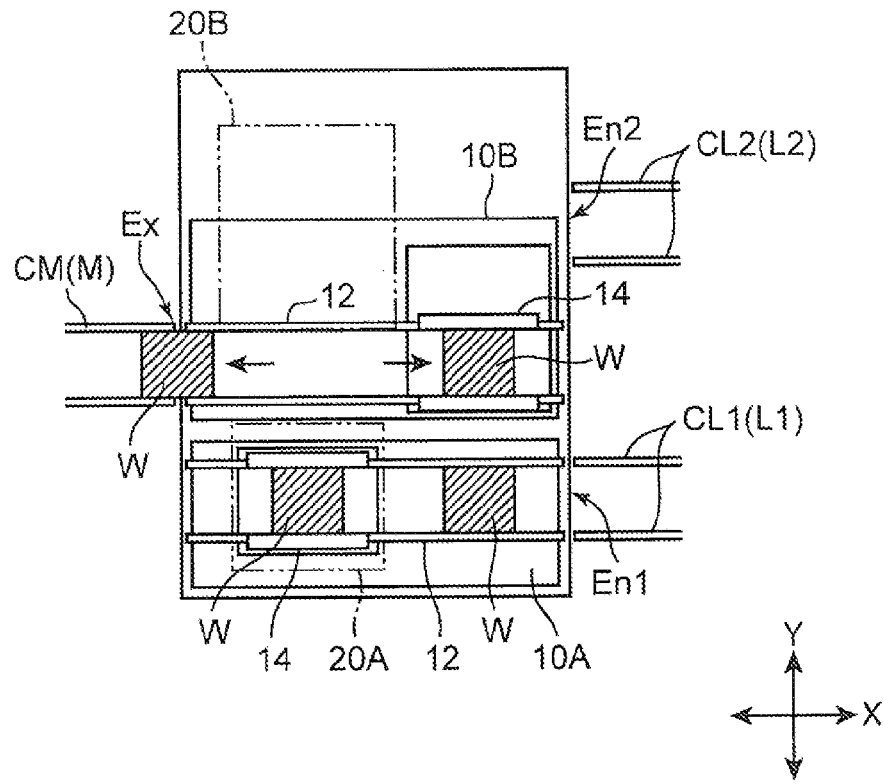
FIG. 12 is a schematic plan view explaining the printing operation of the screen printing apparatus in accordance with the control of the control machine (FIGS. 12A and 12B show the printing operation in accordance with a time series).

While printing is performed on the substrate W at the first substrate support table 10A as described above, in the second substrate support table 10B, the clamped state of the substrate W by the clamp unit 14 is released and, as shown in FIG. 12A, the printed substrate W is unloaded to the component mounting device M through the substrate unloading part Ex, the clamp unit 14 moves to the substrate standby position and clamps the subsequent substrate W in a standby state. While the conveyer pair 12 is driven in order to unload the printed substrate W at that timing, the subsequent substrate W in standby at the substrate standby position is in a transfer stopped state caused by the activation of the stopper mechanism 15, so that the clamping of the substrate W by the clamp unit 14 is enabled.

When the printing of the substrate W at the first substrate support table 10A is completed, the first print executing part 20A is reset to a standby state. That is, the substrate W is detached from the mask 21 as a result of the mask support member 24 being placed at the withdrawal position, and the squeegee 42 is raised to the standby position above one end of the mask at the Y axis direction destination and thereafter stopped and retained, and the first substrate support table 10A is thereafter moved to the sending position.

Meanwhile, the second substrate support table 10B moves to the second receiving position. The substrate W is then transferred from the substrate standby position to the print executing position with the movement of the clamp unit 14, and, during the foregoing transfer, the relative position between the mask 21 and the substrate W are subjected to capture recognition by capturing a plurality of signs on the substrate W by the substrate recognition camera 50 at a position corresponding to the second print executing part 20B, or by the sign of the mark 21 of the second print executing part 20B captured by the mask recognition camera 16. The correction values (ΔX, ΔY, ΔR) are obtained based on the foregoing recognition results.

Figure 12B:
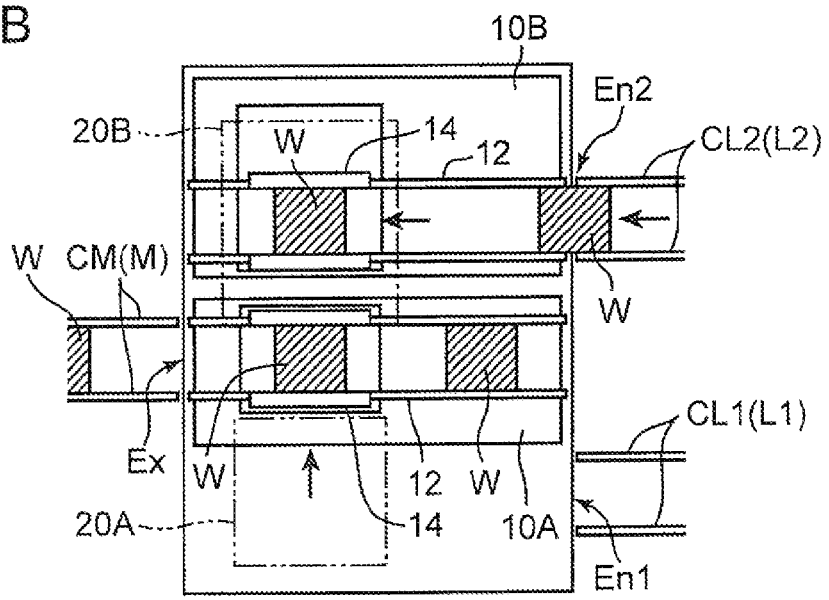

As shown in FIG. 12B, when the first substrate support table 10A is placed at the sending position and the second substrate support table 10B is placed at the second receiving position, respectively, position corrections based on the correction values (ΔX, ΔY, ΔR) is performed. The mask 21 is appropriately fit atop the substrate W, and the second print executing part 20B performs printing on the substrate W placed at the print executing position of the second substrate support table 10B, while the subsequent substrate W is received by the second substrate support table 10B, as shown in the Figure. Meanwhile, with respect to the first substrate support table 10A, the clamping of the substrate W by the clamp unit 14 is released and the printed substrate W is unloaded from the print executing position to the substrate unloading part Ex on the unloading side end, and further unloaded to the component mounting device M in the substrate unloading part Ex.

In this way, the substrate W loaded from the loader L1 to the first substrate loading part En1 is received by the first substrate support table 10A, and the substrate W loaded from the loader L2 to the second substrate loading part En2 is received by the second substrate support table 10B, respectively, while alternately printing to the substrates W in the respective print executing parts 20A, 20B. The printed substrates W are unloaded from the common substrate unloading part Ex to the component mounting device M.

As described above, according to the printing apparatus 1, printing of the substrate W can be efficiently performed because the printing process (mainly, loading of the substrate W to the standby position, substrate clamping, movement of the substrate W from the standby position to the print executing position, printing, substrate unclamping, substrate unloading) using the first substrate support table 10A, and the printing process (mainly, loading of the substrate W to the standby position, substrate clamping, movement of the substrate W from the standby position to the print executing position, printing, substrate unclamping, substrate unloading) using the second substrate support table 10B are performed in parallel by delaying the timing.

Moreover, conventional incidental equipment such as a switching device of the transfer path or the like is no longer required, and the printing apparatus can independently receive the substrate W from an upstream-side device of a dual system or two loaders L1, L2 and perform printing on the substrate, and unload the printed substrate W to a downstream-side device of a single system or one component mounting device M. Thus, the manufacturing line can be downsized despite the printing apparatus 1 being disposed between the upstream-side device of a dual system and the downstream-side device of single system.

In addition, since the printing apparatus 1 comprises, as a print executing part, the first print executing part 20A for performing printing to the substrate W loaded from the loader L1 in the first substrate loading part Ent and the second print executing part 20B for performing printing on the substrate W loaded from the loader L2 in the second substrate loading part En2, there is an advantage in that mutually different patterns can be printed on the substrates W that are respectively sent out from the two loaders L1, L2, and the printed substrates W can be simultaneously set to the component mounting device M.

Moreover, in the printing apparatus 1, the clamp unit 14 in the respective substrate support tables 10A, 10B is provided movably between the print executing position and the substrate standby position. Therefore, as described above, the printing apparatus 1 is configured so that the clamp unit 14 moves to the substrate standby position and clamps the subsequent substrate W in a standby state, in the midst of unloading the preceding substrate W (printed substrate W) clamping of which is being released after the printing has been completed. That is, printing of the preceding substrate W by the print executing parts 20A, 20B can be enabled substantially simultaneously with the substrate support tables 10A, 10B being reset to the receiving position (first receiving position, second receiving position). Accordingly, after the preceding substrate W is unloaded, the printing of the subsequent substrate W can be performed as soon as possible. Thus, there is an advantage in that the printing of the substrates W can be performed efficiently in both cases of printing the same pattern and printing mutually different patterns on the substrates W that are respectively sent out from the two loaders L1, L2.

Moreover, with the printing apparatus 1, since the conveyer width variable mechanism of the substrate support tables 10A, 10B is a configuration which changes the interval of the conveyer pair 12 with the device's inner side as a reference, as described above, there is an advantage in particular in that this configuration will contribute to the improvement in the throughput and the downsizing of the printing apparatus 1, in relation to the component mounting device M to be disposed downstream. This point is now explained.

Normally, the component mounting device M side is also provided with a conveyer width variable mechanism for changing the interval of the conveyer pair CM, and the interval of the conveyer pair CM is changed according to the size of the substrate W to be produced. Now, the throughput and structure of the printing apparatus 1 are considered to be influenced depending on whether the conveyer variable mechanism on the component mounting device M side changes the interval of the conveyer pair CM with the device's front side or the device's back side as a reference, and whether the conveyer width variable mechanism on the printing apparatus 1 side (substrate support tables 10A, 10B)

changes the interval of the conveyer pair 12 with the device's inner side or the device's outer side as a reference.

FIGS. 13 and 14 respectively show a moving distance, or the like, of the first substrate support table 10A between the first receiving position and a sending position classified in accordance with a reference of each conveyer width variable mechanism on the component mounting device M side and the printing apparatus 1 side (substrate support tables 10A, 10B).

Figure 13A:
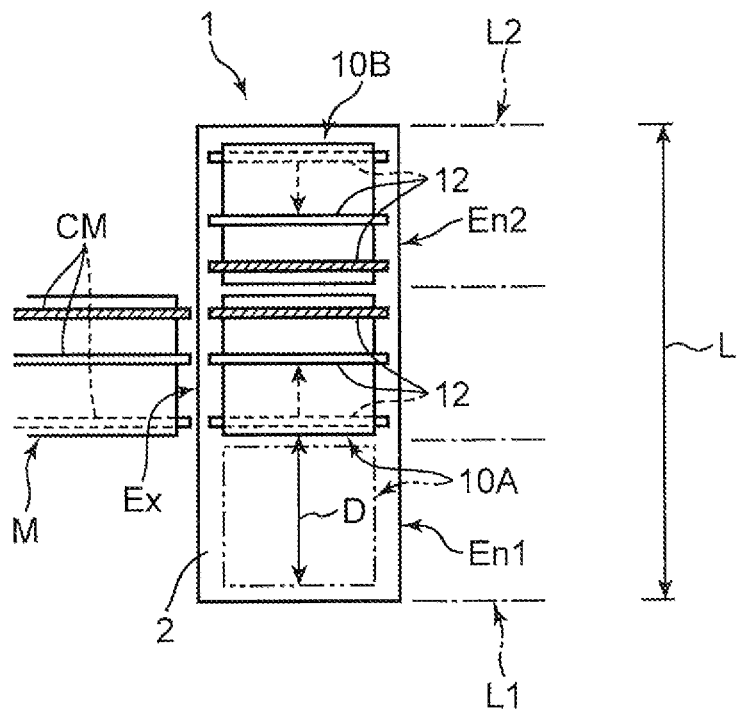
FIG. 13 is a schematic diagram of the printing apparatus explaining the advantages of the conveyer width variable mechanism (FIG. 13A shows a case where the conveyer width variable mechanism of the respective substrate support tables is based on an inner reference, and the conveyer width variable mechanism of the component mounting device uses the device's back side as a reference, and FIG. 13B shows a case where the conveyer width variable mechanism of the respective substrate support tables is based on an inner reference, and the conveyer width variable mechanism of the component mounting device uses the device's front side as a reference).
Figure 13B:
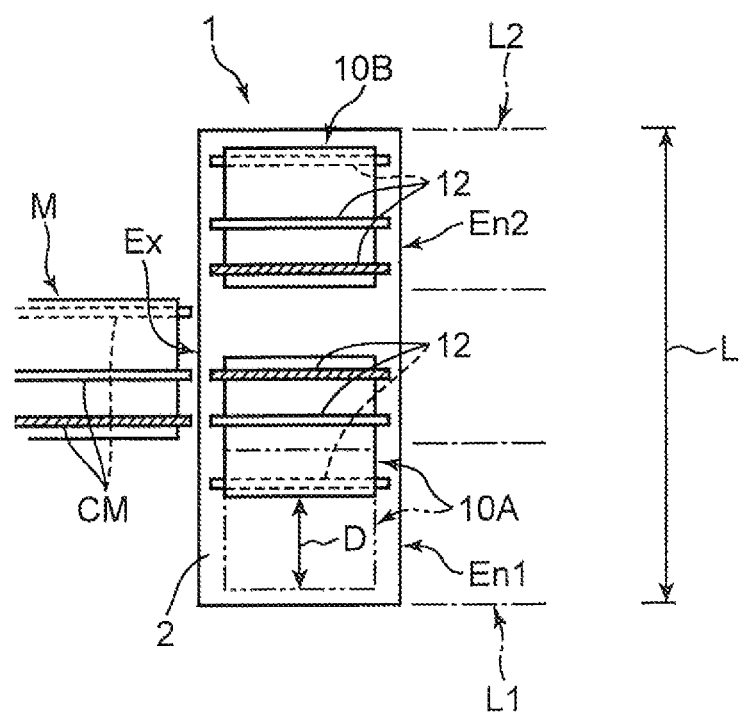
Figure 14A:
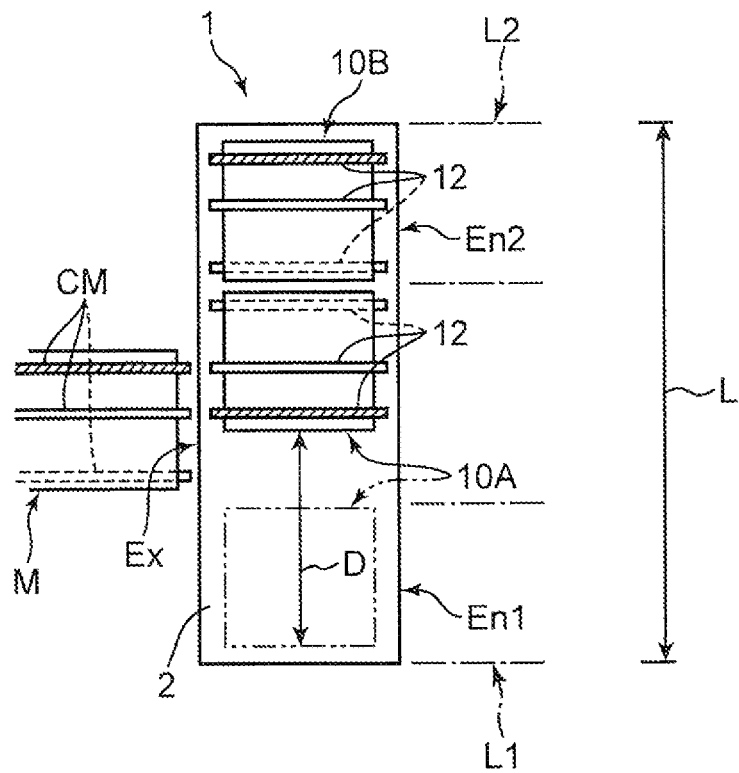
FIG. 14 is a schematic diagram of the printing apparatus explaining the advantages of the conveyer width variable mechanism (FIG. 14A shows a case where the conveyer width variable mechanism of the respective substrate support tables is based on an outer reference, and the conveyer width variable mechanism of the component mounting device uses the device's back side as a reference, and FIG. 14B shows a case where the conveyer width variable mechanism of the respective substrate support tables is based on an outer reference, and the conveyer width variable mechanism of the component mounting device uses the device's front side as a reference).
Figure 14B:
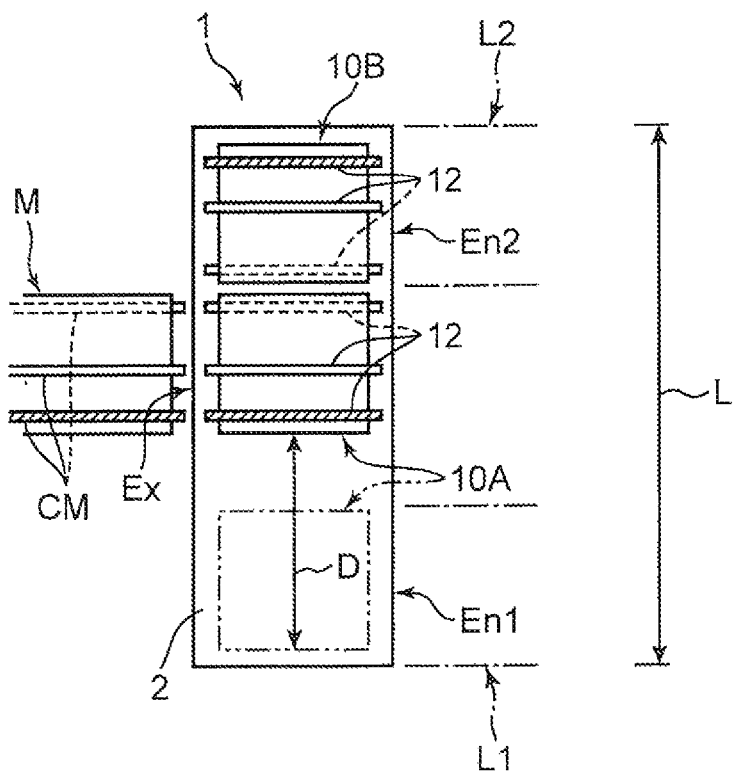

FIG. 13 is a schematic diagram showing a case where the conveyer width variable mechanism of the printing apparatus 1 (substrate support tables 10A, 10B) uses the device's inner side as a reference (embodiment shown in FIG. 1 to FIG. 4), wherein FIG. 13A shows a case where the conveyer width variable mechanism on the component mounting device M side uses the device's back side as a reference; that is, a case where the conveyer positioned on the device's back side is a fixed conveyer, and FIG. 13B shows a case where the conveyer width variable mechanism on the component mounting device M side uses the device's front side as a reference. FIG. 14 is a schematic diagram showing a case where the conveyer width variable mechanism of the printing apparatus 1 (substrate support tables 10A, 10B) uses the device's outer side as a reference; that is, a case where the conveyer positioned on the device's front side is a fixed conveyer regarding the first substrate support table 10A, and the conveyer positioned on the device's back side is a fixed conveyer regarding the second substrate support table 10B (configuration that is opposite to the embodiment shown in FIG. 1 to FIG. 4), wherein FIG. 14A shows a case where the conveyer width variable mechanism on the component mounting device M side uses the device's back side as a reference, and FIG. 14B shows a case where the conveyer width variable mechanism on the component mounting device M side uses the device's front side as a reference. Incidentally, in FIGS. 13 and 14, the fixed conveyers are illustrated with hatching. The conveyer pair 12 is illustrated with a solid line in a state when the interval of the conveyer pair 12 is a minimum.

In the respective examples of FIG. 13 and FIG. 14, initially, in the example shown in FIG. 13A, the sending position of the first substrate support table 10A; that is, the position where the substrate W is unloaded to the component mounting device M is the same place regardless of the interval of the conveyer pair 12 (or size of the substrate W). Accordingly, the moving distance D of the first substrate support table 10A between the first receiving position and the sending position is always constant, regardless of the size of the substrate W.

In the example shown in FIG. 13B, when the interval of the conveyer pair 12 is maximum, the sending position of the first substrate support table 10A is equivalent to the example of FIG. 13A. As the interval of the conveyer pair 12 decreases, however, the sending position of the first substrate support table 10A will be closer to the first receiving position side. Accordingly, the moving distance D of the first substrate support table 10A is equivalent to the example of FIG. 13A when the substrate W is of a maximum size, and decreases as the size of the substrate W decreases.

In the example shown in FIG. 14A, when the interval of the conveyer pair 12 is maximum, the sending position of the first substrate support table 10A is equivalent to the examples of FIGS. 13A and 13B. As the size of the substrate W decreases, however, the sending position of the first substrate support table 10A will be farther from the first receiving position. Accordingly, the moving distance D of the first substrate support table 10A is equivalent to the examples of FIGS. 13A and 13B when the substrate W is of a maximum size, and increases as the size of the substrate W decreases.

In the example shown in FIG. 14A, as shown in the Figure, when the substrate W is of a minimum size, the first substrate support table 10A is considerably offset to the device's back side relative to the conveyer pair CM of the component mounting device M. Thus, the size L of the printing apparatus 1 in the front-back direction needs to be increased in comparison to the example of FIG. 13 by that much.

In the example shown in FIG. 14B, the sending position of the first substrate support table 10A is constant regardless of the interval of the conveyer pair 12. Accordingly, the moving distance D of the first substrate support table 10A between the first receiving position and the sending position is constant regardless of the size of the substrate W. However, in the case of this example, the relation of the second substrate support table 10B and the component mounting device M becomes a relation that is equivalent to the relation of the first substrate support table 10A and the component mounting device M of FIG. 14A. That is, when the substrate W is of a minimum size, when the second substrate support table 10B is placed at the sending position, the second substrate support table 10B is considerably offset to the device's front side relative to the conveyer pair CM of the component mounting device M. Accordingly, in the case of the example of FIG. 14B, as with the example of FIG. 14A, the size L of the printing apparatus 1 in the front-back direction needs to be increased in comparison to the example of FIG. 13. With respect to the first substrate support table 10A, the sending position thereof will become farther from the first receiving position by that much and, consequently, the moving distance D of the first substrate support table 10A will increase in comparison to the example shown in FIG. 13.

As described above, according to the configuration (example of FIG. 13) in which the conveyer width variable mechanism on the printing apparatus 1 (substrate support tables 10A, 10B) side uses the device's inner side as a reference, regardless of whether the conveyer width variable mechanism of the component mounting device M uses the front or back as a reference, the moving distance D of the substrate support tables 10A, 10B can be made to be relatively short (in comparison to a case of using the device's outer side as a reference), and the enlargement of the printing apparatus 1 in the Y axis direction can also be prevented. Thus, according to the printing apparatus 1 in which the conveyer width variable mechanism on the printing apparatus 1 (substrate support tables 10A, 10B) side uses the device's inner side as a reference, it is possible to contribute to the improvement in the throughput and the downsizing of the printing apparatus 1.

The second embodiment of the screen printing apparatus according to the present disclosure is now explained with reference to FIG. 15.

Figure 15A:
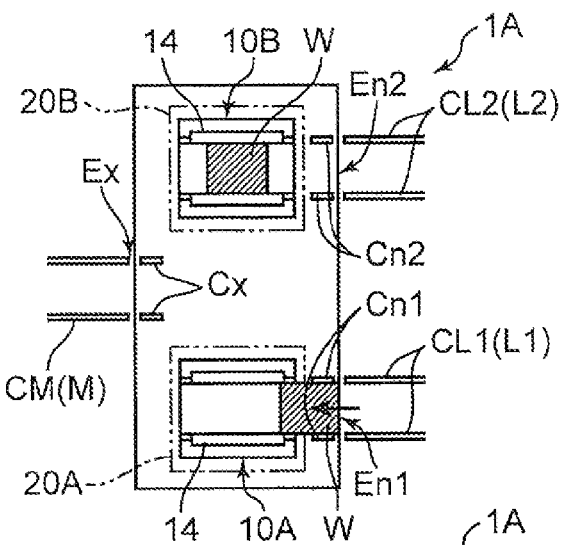
FIG. 15 is a schematic plan view showing the second embodiment of the screen printing apparatus according to the present disclosure (FIGS. 15A, 15B, and 15C show the printing operation in accordance with a time series).

FIG. 15A is a schematic plan view showing the screen printing apparatus 1A (hereinafter abbreviated as the "printing apparatus 1A") according to the second embodiment. The printing apparatus 1A according to the second embodiment is configured differently from the printing apparatus 1 according to the first embodiment with respect to the following points.

With the printing apparatus 1A, a conveyer pair Cn1 for receiving the substrate W from the first loader L1 and a conveyer pair Cn2 for receiving the substrate W from the second loader L2 are installed on the foundation 2. Positions where the conveyer pairs Cn1, Cn2 are respectively installed are the counterpart of the substrate loading parts En1, En2. Also, a conveyer pair Cx for unloading the substrate W to the component mounting device M1 is installed. A position where the conveyer pair Cx is installed is the counterpart of the substrate loading part En. Accordingly, with the printing apparatus 1A, the positions of the substrate loading parts En1, En2 and the substrate unloading part Ex on the foundation 2 are fixed, and a mounting line is formed by the loaders L1, L2 and the component mounting device M being disposed in correspondence with the foregoing positions. That is, unlike the first embodiment, the positions of the substrate loading parts En1, En2 are not set in correspondence with the positions of the loaders L1, L2, and the position of the substrate unloading part Ex is not set in correspondence with the position of the component mounting device M according to the print execution program and the like given from the host computer. With the conveyer pairs Cn1, Cn2, and Cx, the interval of the respective conveyers is changed based on the conveyer width variable mechanism according to the size of the substrate W, as with the conveyer pair 12 of the substrate support tables 10A, 10B.

The respective substrate support tables 10A, 10B do not have a space (substrate standby position) for causing the subsequent substrate W to stand by. The substrate W that is transferred from the loaders L1, L2 to the substrate support tables 10A, 10B via the substrate loading parts En1, En2 is therefore transferred directly to the lower position (print executing position) of the print executing parts 20A, 20B, and clamped by the clamp unit 14 at the foregoing position. While the clamp unit 14 is likewise movable in the X axis direction as with the first embodiment, the movable range thereof is limited to a range in which the relative position between the mask 21 and the substrate W can be corrected during the overlapping of the mask.

While not shown, the mask recognition camera 16 and the substrate recognition camera 50 are coupled with a moving mechanism with a motor or the like as the driving source. The mask recognition camera 16 and the substrate recognition camera 50 can move across a position (imaging position) disposed between the mask 21 and the substrate W, and a position (withdrawal position) withdrawn outside from a position between the mask 21 and the substrate W. That is, the printing apparatus 1A is configured such that the mask recognition camera 16 and the substrate recognition camera 50 capture the respective signs of the mask 21 and the substrate W by being interposed therebetween after the clamping of the substrate W and before the overlapping of the mask 21 so as to recognize the relative position between the mask 21 and the substrate W, and the printing apparatus 1A obtains correction values ($\Delta X$, $\Delta Y$, $\Delta R$) during the overlapping of the mask based on the foregoing recognition results.

In addition, with the printing apparatus 1A, the mask 21 is fixed on the foundation 2 side. The clamp unit 14 is movably provided in the X axis direction, the Z axis direction, and the R axis direction around the Z axis relative to a movable base of the substrate support tables 10A, 10B.

The electrical configuration of the printing apparatus 1A is basically the same as the first embodiment (see FIG. 10) excluding that there is only one print executing part, the moving mechanism for moving the mask recognition camera 16 or the like and the moving mechanism for moving the clamp unit 14 in the X axis direction, the Z axis direction, and the R axis direction are controlled by the main control unit 81 via the drive control unit 83, and other points.

Figure 15B:
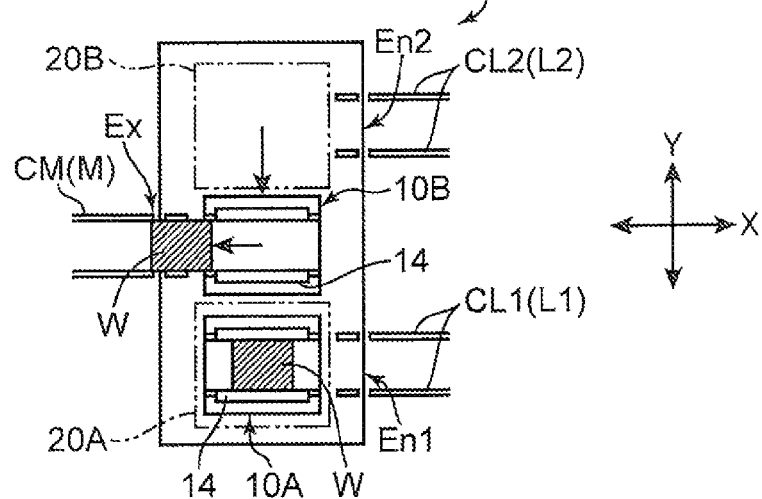
Figure 15C:
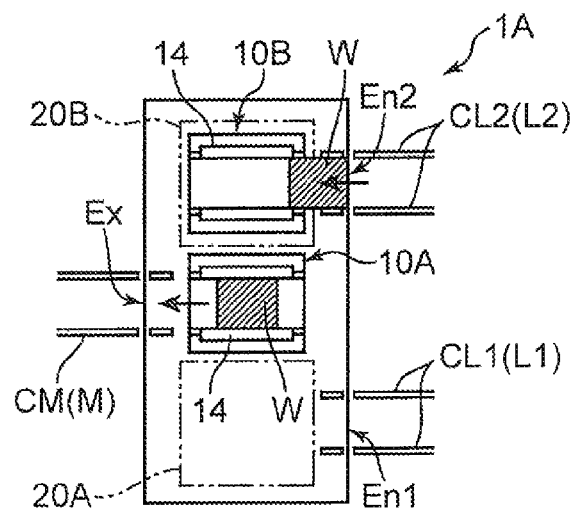

In the printing apparatus 1A, the substrate W is transferred from the first substrate loading part En1 to the first substrate support table 10A (FIG. 15A), the substrate W is clamped by the clamp unit 14, the substrate W is thereafter overlapped with the mask 21 from the underside of the mask 21 by raising the clamp unit 14 in the Z axis direction, and then the substrate W is subjected to printing (FIG. 15B). (During the operation, the substrate W is properly overlapped with the mask 21 as a result of position corrections being performed, respectively, to the clamp unit 14 with respect to the X axis direction and the R axis direction, and to the first substrate support table 10A with respect to the Y axis direction, based on the correction values ($\Delta X$, $\Delta Y$, $\Delta R$).) After the completion of printing, plate releasing is performed by the clamp unit 14 by being lowered in the Z axis direction. Meanwhile, the clamp unit 14 moves in the X axis direction by the amount of $-\Delta X$, and in the R axis direction by the amount of $-\Delta R$. Subsequently, the movement of the movable base of the first substrate support table 10A in the Y axis direction causes the first substrate support table 10A to be placed at the sending position, and the printed substrate W is thereby unloaded to the component mounting device M from above the first substrate support table 10A via the substrate unloading part Ex (FIG. 15C).

Consequently, as a result of the reception of the substrate W, the printing of the substrate W, and the unloading operation of the substrate W in the first substrate support table 10A, and the reception of the substrate W (FIG. 15C), the printing of the substrate W (FIG. 15A), and the unloading of the substrate W (FIG. 15B) in the second substrate support table 10B being performed with a given time difference, printing is alternately performed on the substrates W in the respective print executing parts 20A, 20B while the substrate W loaded from the first substrate loading part En1 is received by the first substrate support table 10A and the substrate W loaded from the second substrate loading part En2 is received by the second substrate support table 10B, respectively, and the substrates W are then unloaded from the common substrate unloading part Ex to the component mounting device M.

That is, with the printing apparatus 1A, the first substrate support table 10A can move between the first receiving position and the sending position, and the second substrate support table 10B can move between the second receiving position and the sending position. The sending position is positioned within a common area in which the respective movable areas of the first substrate support table 10A and the second substrate support table 10B overlap with each other. In addition, when the first substrate support table 10A is positioned at the sending position, the second substrate support table 10B is placed at the first receiving position that avoids the first substrate support table 10A within the movable area. When the second substrate support table 10B is positioned at the sending position, the first substrate support table 10A is positioned at the second receiving position that avoids the second substrate support table 10B within the movable area.

With this kind of printing apparatus 1A of the second embodiment, printing of the substrate W can also be efficiently performed since the printing process(mainly, substrate loading, substrate clamping, printing, substrate unclamping, substrate unloading) using the first substrate support table 10A and the printing process(mainly substrate loading, substrate clamping, printing, substrate unclamping, substrate unloading) using the second substrate support table 10B are performed in parallel by delaying the timing.

Moreover, the printing apparatus 1A can independently receive the substrate W from two loaders L1, L2 and perform printing on the substrate, and unload the printed substrate W to one component mounting device M. Thus, the printing apparatus 1A is useful for downsizing the manufacturing line as well as the printing apparatus 1 of the first embodiment. In particular, with the printing apparatus 1A of the second embodiment, since the respective substrate support tables 10A, 10B do not have a space (substrate standby position) for standing by the substrate W, the substrate support tables 10A, 10B can be downsized in the X axis direction by that much. Thus, there is an advantage in that the manufacturing line can be downsized in the substrate transfer direction (X axis direction).

The third embodiment of the screen printing apparatus according to the present disclosure is now explained with reference to FIG. 16.

Figure 16A:
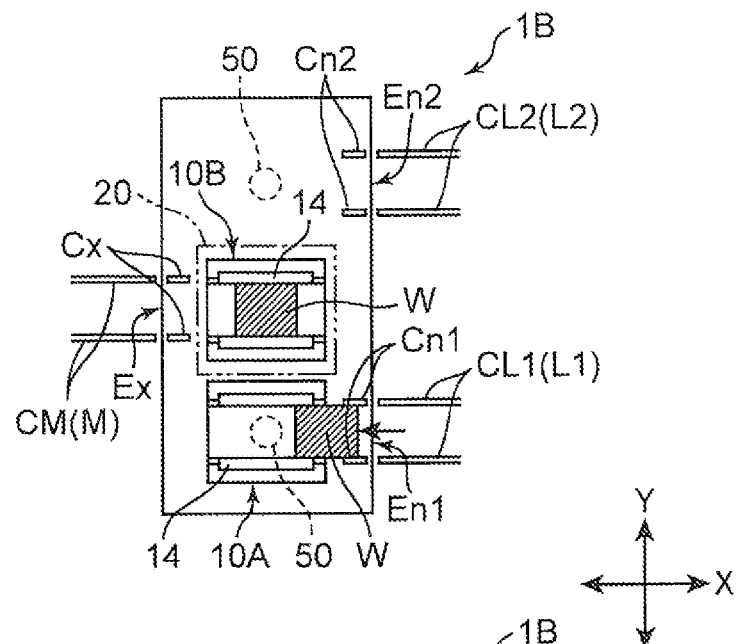
FIG. 16 is a schematic plan view showing the third embodiment of the screen printing apparatus according to the present disclosure (FIGS. 16A and 16B show the printing operation in accordance with a time series).
Figure 16B:
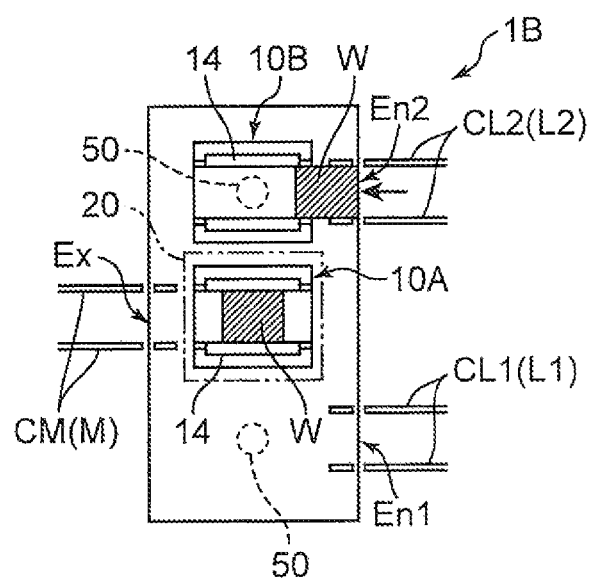

FIG. 16A is a schematic plan view showing the screen printing apparatus 1B (hereinafter abbreviated as the "printing apparatus 1B") according to the third embodiment. The printing apparatus 1B according to the third embodiment is a modified example of the printing apparatus 1A (see FIG. 15) of the second embodiment described above, and is configured differently from the printing apparatus 1A of the second embodiment with respect to the following points.

Initially, as the print executing part, a common print executing part 20 for performing printing on the substrate W on the respective substrate support tables 10A, 10B is provided. The print executing part 20 is disposed at a position above the sending position for unloading the substrate W. The substrate recognition camera 50 is disposed fixedly at the respective positions above the first and second receiving positions for receiving the substrate W on the substrate support tables 10A, 10B. Each camera 50 captures, respectively, at the first and second receiving positions, the plurality of signs of the substrate W on the substrate support tables 10A, 10B clamped by the clamp unit 14. The mask recognition camera 16 is fixedly provided to the clamp unit 14 as with the first embodiment. The mask recognition camera 16 is configured to capture a plurality of signs on the mask 21 while the substrate support tables 10A, 10B are moving from the first and second receiving positions to the sending position for performing the printing on the substrate W.

With the printing apparatus 1B, the substrate W is transferred from the loader L1 disposed aligning with the conveyer pair Cn1 provided on the foundation 2 to the first substrate support table 10A via the first substrate loading part En1 (FIG. 16A), the substrate W is clamped by the clamp unit 14, and the substrate W is thereafter disposed below the print executing part 20 as a result of the first substrate support table 10A moving from the first receiving position to the sending position. In addition, when position corrections are performed on the substrate W side in the foregoing state, the substrate W is overlapped with the mask 21 and the substrate is subjected to printing, and, after the completion of printing, plate releasing of the substrate W being separated from the mask 21 is performed after the clamping of the substrate W is released, and, based on the drive of the conveyer pair 12, the substrate W is unloaded directly from the first substrate support table 10A, via the substrate unloading part Ex, to the component mounting device M disposed in correspondence with the conveyer pair Cx provided on the foundation 2.

Consequently, as a result of the reception of the substrate W, the printing of the substrate W and the unloading operation of the substrate W in the first substrate support table 10A, and the reception of the substrate W (FIG. 16B), the printing of the substrate W (FIG. 16A) and the unloading of the substrate W in the second substrate support table 10B, via the first substrate loading part En2, from the loader L2 disposed in correspondence with the conveyer pair Cn2 provided on the foundation 2 being performed with a given time difference, printing is alternately performed on the substrates W in the print executing part 20 while the substrate W loaded from the first substrate loading part En1 is received by the first substrate support table 10A and the substrate W loaded from the second substrate loading part En2 is received by the second substrate support table 10B, respectively, and the substrates W are then unloaded from the common substrate unloading part Ex to the component mounting device M.

That is, with the printing apparatus 1B, the first substrate support table 10A can move between the first receiving position and the sending position, and the second substrate support table 10B can move between the second receiving position and the sending position. The sending position is positioned at the same position as the print executing part, and this position is positioned within a common area in which the respective movable areas of the first substrate support table 10A and the second substrate support table 10B overlap with each other. In addition, when the first substrate support table 10A is positioned at the sending position, the second substrate support table 10B is placed at the first receiving position that avoids the first substrate support table 10A within the movable area, and, when the second substrate support table 10B is positioned at the sending position, the first substrate support table 10A is positioned at the second receiving position that avoids the second substrate support table 10B within the movable area.

With this kind of printing apparatus 1B of the third embodiment, printing of the substrate W can also be efficiently performed since the printing process(mainly substrate loading, substrate clamping, printing, substrate unclamping, substrate unloading) using the first substrate support table 10A and the printing process(mainly substrate loading, substrate clamping, printing, substrate unclamping, substrate unloading) using the second substrate support table 10B are performed in parallel by delaying the timing Accordingly, it is quite useful when printing a common pattern on the substrates W that are respectively sent out from the respective loaders L1, L2. The printing can be efficiently performed with a simple configuration comprising one print executing part 20.

The fourth embodiment of the screen printing apparatus according to the present disclosure is now explained with reference to FIG. 17.

Figure 17A:
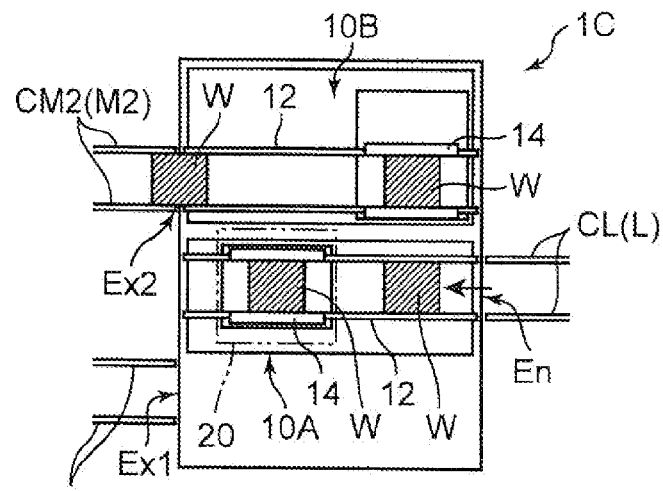
FIG. 17 is a schematic plan view showing the fourth embodiment of the screen printing apparatus according to the present disclosure.

FIG. 17A is a schematic plan view showing the screen printing apparatus 1C (hereinafter abbreviated as the "printing apparatus 1C") according to the fourth embodiment. The printing apparatus 1C according to the fourth embodiment is disposed between an upstream-side device of a single system and a downstream-side device of a dual system, and is configured differently from the printing apparatus 1 of the first embodiment with respect to the following points, but the remainder of the configuration is basically common with the printing apparatus 1 of the first embodiment.

With the printing apparatus 1C, one substrate loading part En and two substrate unloading parts Ex1, Ex2 (first substrate unloading part Ex1, second substrate unloading part Ex2) are respectively set in association with the arrangement of the loader L and the component mounting devices M1, M2. In the illustrated example, the printing apparatus 1C is disposed between the one loader L and the two component mounting devices M1, M2 (first component mounting device M1, and second component mounting device M2). The printing apparatus 1C loads the substrate W, which was sent out from the loader L, from the substrate loading part En into the apparatus, and unloads the printed substrate W from the first substrate unloading part Ex1 to the first component mounting device M1 or from the second substrate unloading part Ex2 to the second component mounting device M2. The respective substrate unloading parts Ex1, Ex2 are set at positions across a predetermined interval in the Y axis direction. The substrate loading part En is set at a position between the respective substrate unloading parts Ex1, Ex2 with respect to the Y axis direction. In the Figure, reference numerals CL, CM1, CM2 designate respectively belt conveyer pairs to be mounted on the loader L and the component mounting devices M1, M2.

The printing apparatus 1C comprises a common print executing part 20 for performing printing on the substrate W on the respective substrate support tables 10A, 10B, and a common substrate recognition camera 50 for imaging the signs of the substrate W. With the printing apparatus 1C of the fourth embodiment, the first substrate support table 10A is configured to move between a receiving position where the substrate W loaded from the loader L in the substrate loading part En can be received, and a position (first sending position) where the printed substrate W can be unloaded to the component mounting device M1 in the first substrate unloading part Ex1. Meanwhile, the second substrate support table 10B is configured to move between the receiving position and a position (second sending position) where the printed substrate W can be unloaded to the component mounting device M2 in the second substrate unloading part Ex2. The print executing part 20 and the substrate recognition camera 50 are provided at positions above the substrate support tables 10A, 10B in a state of being placed at the receiving position.

That is, with the printing apparatus 1C, the first substrate support table 10A can move between the receiving position and the first sending position. The second substrate support table 10B can move between the receiving position and the second sending position. The receiving position is the same position as the print executing part, and this position is positioned within a common area in which the movable area of the first substrate support table 10A and the movable area of the second substrate support table 10B overlap with each other. When the first substrate support table 10A is positioned at the receiving position, the second substrate support table 10B is positioned at the first sending position which avoids the first substrate support table 10A within its movable area. When the second substrate support table 10B is positioned at the receiving position, the first substrate support table 10A is placed at the second sending position which avoids the second substrate support table 10B within its movable area.

With the printing apparatus 1C, as shown in FIG. 17A, the first substrate support table 10A is placed at the receiving position, and the clamp unit 14 clamping the substrate W is placed at the print executing position so that the print executing part 20 can perform printing on the substrate W. During the printing, the subsequent substrate W sent out from the loader L is transferred from the loader L to the first substrate support table 10A in the substrate loading part En, and caused to stand by at the substrate standby position.

Figure 17B:
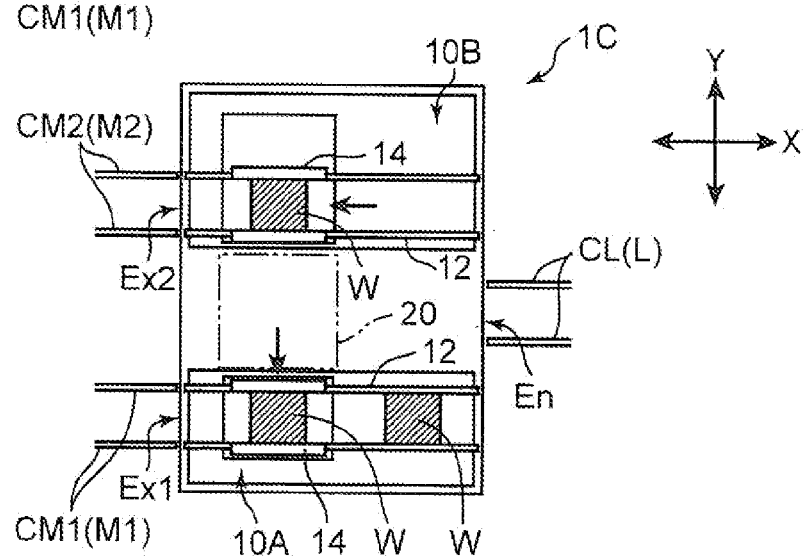
Figure 17C:
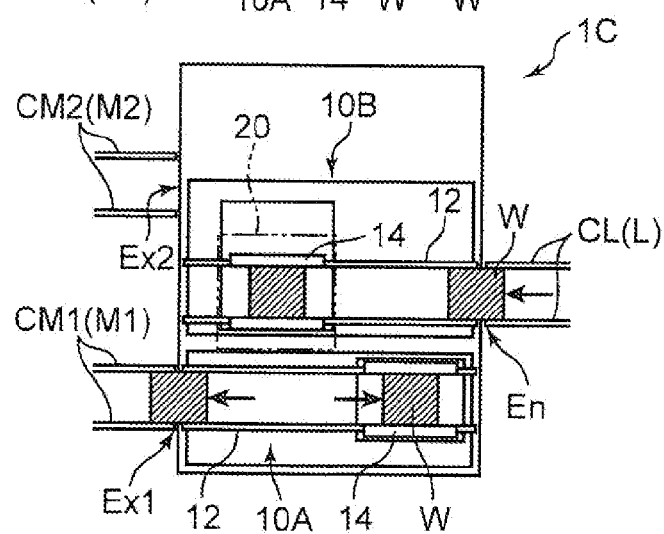

When the printing of the substrate W on the first substrate support table 10A is completed, the first substrate support table 10A moves from the receiving position to the first sending position, as shown in FIG. 17B. In addition, as shown in FIG. 17C, the clamping of the substrate W is released and the printed substrate W is unloaded from the first substrate unloading part Ex1 to the first component mounting device M1 by the conveyer pair 12 being driven. The clamp unit 14 moves then to the substrate standby position and clamps the subsequent substrate W. Subsequently, the first substrate support table 10A moves from the first sending position to the receiving position. During that operation, the clamp unit 14 moves from the substrate standby position to the print executing position so as to prepare for the printing of the substrate W.

With respect to the second substrate support table 10B, in parallel with the printing of the substrate W and the reception of the subsequent substrate W in the first substrate support table 10A, the unloading of the print-processed substrate W to the second component mounting device M2, the movement of the clamp unit 14 to the substrate standby position, and the clamping of the subsequent substrate W are performed. In parallel with the movement of the first substrate support table 10A from the receiving position to the first sending position, movement of the clamp unit 14 from the substrate standby position to the print executing position in the first substrate support table 10A, and the movement of the second substrate support table 10B to the receiving position are performed. In addition, in parallel with the unloading of the print-processed substrate W from the first substrate support table 10A to the first component mounting device M1, the movement of the clamp unit 14 to the substrate standby position and the clamping of the subsequent substrate W, printing of the substrate W and the reception of the subsequent substrate W in the second substrate support table 10B are performed.

As described above, the printing of the substrate W, the reception of the subsequent substrate W, and the unloading operation of the substrate W from the first substrate unloading part Ex1 in the first substrate support table 10A, and the printing of the substrate W, the reception of the subsequent substrate W, and the unloading of the substrate W from the second substrate unloading part Ex2 in the second substrate support table 10B are performed with a given time difference. As a result, the printing is alternately performed by the print executing part 20 on the substrates W loaded from the common substrate loading part En while the substrates W are received by the substrate support tables 10A, 10B, and the substrates W are then unloaded from the substrate unloading parts Ex1, Ex2 to the component mounting devices M1, M2.

According to this kind of printing apparatus 1C of the fourth embodiment, printing of the substrate W can be efficiently performed since the printing process using the first substrate support table 10A (mainly, loading of the substrate W to the standby position, substrate clamping, movement of the substrate W from the standby position to the printing position, printing, substrate unclamping, substrate unloading) and the printing process using the second substrate support table 10B (mainly, loading of the substrate W to the standby position, substrate clamping, movement of the substrate W from the standby position to the printing position, printing, and substrate unclamping, substrate unloading) are performed in parallel by delaying the timing.

Moreover, conventional incidental equipment such as a sorting device of the substrates W is no longer necessary. Nevertheless, the printing apparatus can independently receive the substrate W from an upstream-side device of a single system or one loader L and perform printing on the substrate, and the printing apparatus can independently unload the printed substrate W to a downstream-side device of a dual system or to two component mounting devices M1, M2. As a result, the manufacturing line can be downsized despite the printing apparatus 1C being disposed between the upstream-side device of a single system and the downstream-side device of a dual system. In particular, the printing apparatus 1C of the fourth embodiment is useful when printing a common pattern on the substrates W that are respectively sent out from one loader L1, and sending the printed substrates W to the respective component mounting devices M1, M2, so that printing can be performed efficiently with one print executing part 20.

Also, as with the printing apparatus 1 of the first embodiment, the printing apparatus 1C is configured such that the clamp unit 14 is provided movably between the print executing position and the substrate standby position in the respective substrate support tables 10A, 10B. As described above, the printing apparatus 1C is configured such that, while the preceding substrate W (printed substrate W) is being unloaded after the completion of printing, the clamp unit 14 moves to the substrate standby position and clamps the subsequent substrate W in standby. The substrate W is then placed at the print executing position while the substrate support tables 10A, 10B are reset to the receiving position. Thus, printing by the print executing part 20 is enabled substantially simultaneously with the substrate support tables 10A, 10B being reset to the receiving position. Accordingly, there is also an advantage in that, after the preceding substrate W is unloaded, the printing of the subsequent substrate W can be performed as soon as practicable, so that the printing of the substrates W can be performed efficiently.

The fifth embodiment of the screen printing apparatus according to the present disclosure is now explained with reference to FIG. 18.

Figure 18A:
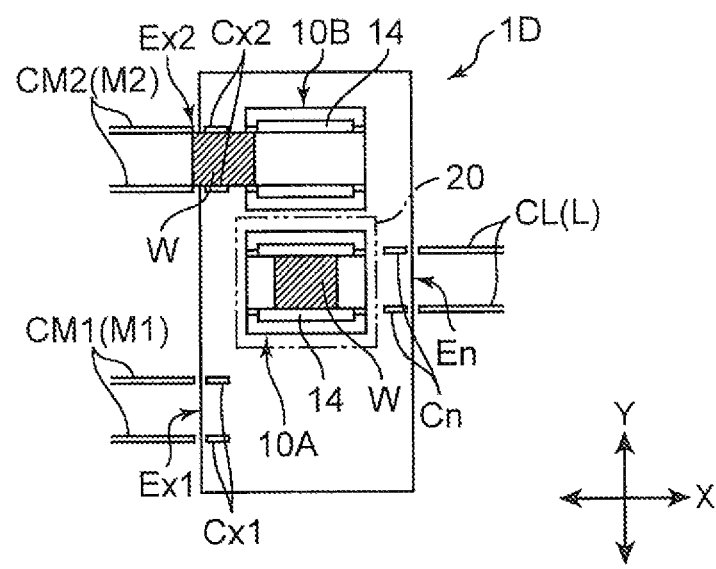
FIG. 18 is a schematic plan view showing the fifth embodiment of the screen printing apparatus according to the present disclosure.

FIG. 18A is a schematic plan view showing the screen printing apparatus 1D (hereinafter abbreviated as the "printing apparatus 1D") according to the fifth embodiment. The printing apparatus 1D according to the fifth embodiment is a modified example of the printing apparatus 1C (see FIG. 17) of the fourth embodiment. The printing apparatus 1D is configured differently from the printing apparatus 1C of the fourth embodiment with respect to the following points.

With the printing apparatus 1D, a conveyer pair Cn for receiving the substrate W from the loader L is installed on the foundation 2, and the position where the conveyer pair Cn is installed corresponds to the substrate loading part En. A conveyer pair Cx1 for unloading the substrate W to the first component mounting device M1 and a conveyer pair Cx2 for unloading the substrate W to the second component mounting device M2 are also installed, and the positions where the conveyer pairs Cx1, Cx2 are installed correspond to the substrate loading parts En1, En2. Accordingly, with the printing apparatus 1D, the positions of the substrate loading part En and the substrate unloading parts Ex1, Ex2 on the foundation 2 are fixed, and the loader L and the component mounting devices M1, M2 are disposed to be aligned with the foregoing positions. That is, the position of the substrate loading part En is not set in correspondence with the position of the loader L and the positions of the substrate unloading parts Ex1, Ex2 are not set in correspondence with the positions of the component mounting devices M1, M2 according to the print execution program and the like given from the host computer. Incidentally, with the conveyer pairs Cn, Cx1, Cx2, as with the conveyer pair 12 of the substrate support tables 10A, 10B, the interval of the respective conveyers is changed based on the conveyer width variable mechanism according to the size of the substrate W.

The respective substrate support tables 10A, 10B do not have a space (substrate standby position) for causing the subsequent substrate W to stand by. The substrate W that is transferred from the substrate loading part En to the substrate support tables 10A, 10B and is transferred directly to the receiving position or the lower position (print executing position) of the print executing part 20, and clamped by the clamp unit 14 at the foregoing position. While the clamp unit 14 is likewise movable in the X axis direction, the movable range thereof is limited to a range in which the relative position between the mask 21 and the substrate W can be corrected during the overlapping of the mask.

While not shown, the mask recognition camera 16 and the substrate recognition camera 50 are coupled with a moving mechanism with a motor or the like as the driving source. The mask recognition camera 16 and the substrate recognition camera 50 can move across a position (imaging position) disposed between the mask 21 and the substrate W, and a position (withdrawal position) withdrawn outside from a position between the mask 21 and the substrate W. That is, the printing apparatus 1D is configured such that the mask recognition camera 16 and the substrate recognition camera 50 capture the respective signs of the mask 21 and the substrate W by being interposed therebetween after the clamping of the substrate W and before the overlapping of the mask 21 so as to recognize the relative position between the mask 21 and the substrate W, and the printing apparatus 1D obtains correction values ($\Delta X$, $\Delta Y$, $\Delta R$) during the overlapping of the mask based on the foregoing recognition results.

In addition, with the printing apparatus 1D, the mask 21 is provided fixedly on the foundation 2 side, and the clamp unit 14 is provided movably in the X axis direction, the Z axis direction and the R axis direction around the Z axis relative to the movable base of the substrate support tables 10A, 10B.

The electrical configuration of the printing apparatus 1A is basically the same as the first embodiment (see FIG. 10) excluding the points that there is only one print executing part, the moving mechanism for moving the mask recognition camera 16 or the like and the moving mechanism for moving the clamp unit 14 in the X axis direction, the Z axis direction, and the R axis direction are controlled by the main control unit 81 via the drive control unit 83, and the other points.

Figure 18B:
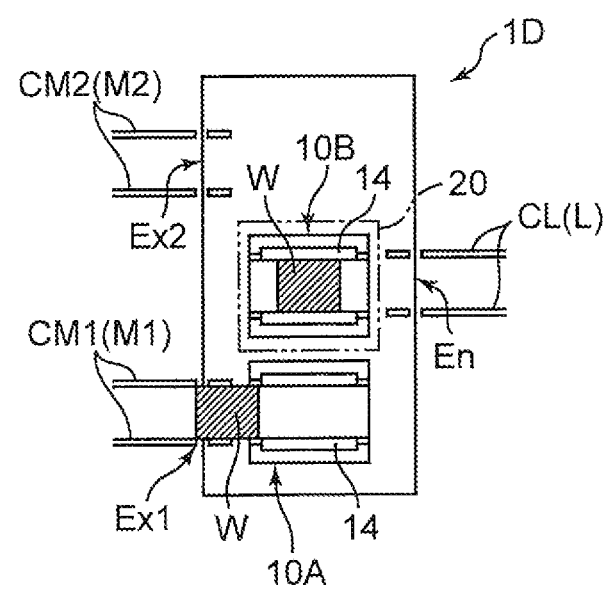

In the printing apparatus 1D, the substrate W is transferred from the substrate loading part En to the first substrate support table 10A and the second substrate support table 10B, the substrate W is clamped by the clamp unit 14, the substrate W is thereafter overlapped with the mask 21 from the underside thereof by raising the clamp unit 14 in the Z axis direction, and then the substrate W is subjected to printing (FIGS. 18A, 18B). During the operation, the substrate W is properly overlapped with the mask 21 as a result of position corrections being performed, respectively, to the clamp unit 14 with respect to the X axis direction and the R axis direction, and to the first substrate support table 10A with respect to the Y axis direction, based on the correction values ($\Delta X$, $\Delta Y$, $\Delta R$). After the completion of printing, the first substrate support table 10A moves to the first sending position and the second substrate support table 10B moves to the second unloading position, and the printed substrate W is consequently unloaded from the first substrate unloading part Ex1 to the first component mounting device M1 and unloaded from the second substrate unloading part Ex2 to the first component mounting device M1 (FIG. 18B, FIG. 18A).

Consequently, as a result of the reception of the substrate W, the printing of the substrate W and the unloading operation of the substrate W in the first substrate support table 10A, and the reception of the substrate W, the printing of the substrate W (FIG. 18B), and the unloading operation of the substrate W (FIG. 18A) in the second substrate support table 10B being performed with a given time difference, printing is alternately performed on the substrates W in the print executing part 20 while the substrate W loaded from the common substrate loading part En is received by the substrate support tables 10A, 10B, and the substrates W are then unloaded from the substrate unloading parts Ex1, Ex2 to the respective component mounting devices M1, M2.

With this kind of printing apparatus 1D of the fifth embodiment printing of the substrate W can also be efficiently performed since the printing process(mainly substrate W loading, substrate clamping, printing, substrate unclamping, and substrate unloading) using the first substrate support table 10A and the printing process(mainly substrate W loading, substrate clamping, printing, substrate unclamping, and substrate unloading) using the second substrate support table 10B are performed in parallel by delaying the timing.

Moreover, the printing apparatus 1D can independently receive the substrate W from one loader L and perform printing on the substrate, and unload the printed substrate W to two component mounting devices M1, M2. Thus, the printing apparatus 1D is useful for downsizing the manufacturing line as with the printing apparatus 1C of the fourth embodiment. In particular, with the printing apparatus 1D of the fifth embodiment, since the respective substrate support tables 10A, 10B do not have a space (substrate standby position) for standing by the substrate W, the substrate support tables 10A, 10B can be downsized in the X axis direction by that much. Thus, there is an advantage in that the manufacturing line can be downsized in the substrate transfer direction (X axis direction).

The sixth embodiment of the screen printing apparatus according to the present disclosure is now explained with reference to FIG. 19.

Figure 19A:
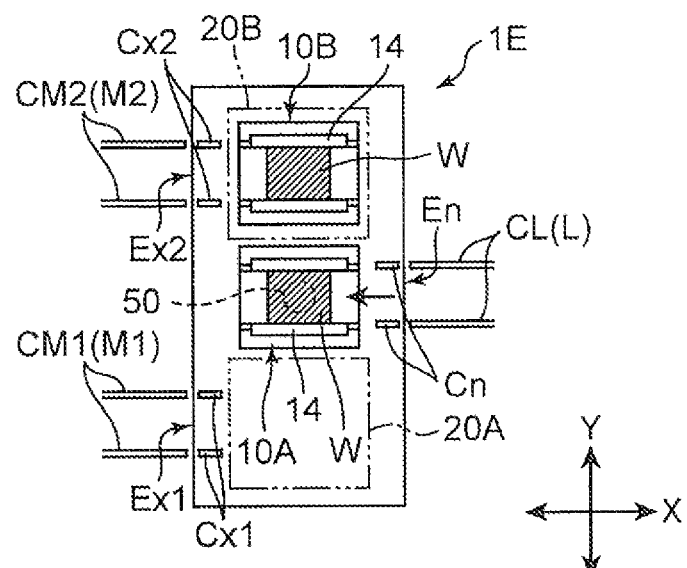
FIG. 19 is a schematic plan view showing the sixth embodiment of the screen printing apparatus according to the present disclosure.

FIG. 19A is a schematic plan view showing the screen printing apparatus 1E (hereinafter abbreviated as the "printing apparatus 1E") according to the sixth embodiment. The printing apparatus 1E according to the sixth embodiment is a modified example of the printing apparatus 1D (see FIG. 15) of the fifth embodiment described above, and is configured differently from the printing apparatus 1D of the fifth embodiment with respect to the following points.

Initially, the printing apparatus 1E is provided with two print executing parts 20A, 20B. These print executing parts 20A, 20B are disposed at positions above the first and second sending positions for unloading the substrates W on the respective substrate support tables 10A, 10B.

The substrate recognition camera 50 is disposed fixedly at the positions above the receiving positions for receiving the substrate W on the substrate support tables 10A, 10B. The substrate recognition camera 50 is configured to capture, at the respective receiving positions, the signs of the substrate W on the substrate support tables 10A, 10B clamped by the clamp unit 14. In addition, the mask recognition camera 16 is fixedly provided to the clamp unit 14. The mask recognition camera 16 is configured to capture the signs on the mask 21 while the substrate support tables 10A, 10B are moving from the receiving position to the first or second sending position for performing the printing on the substrate W.

Figure 19B:
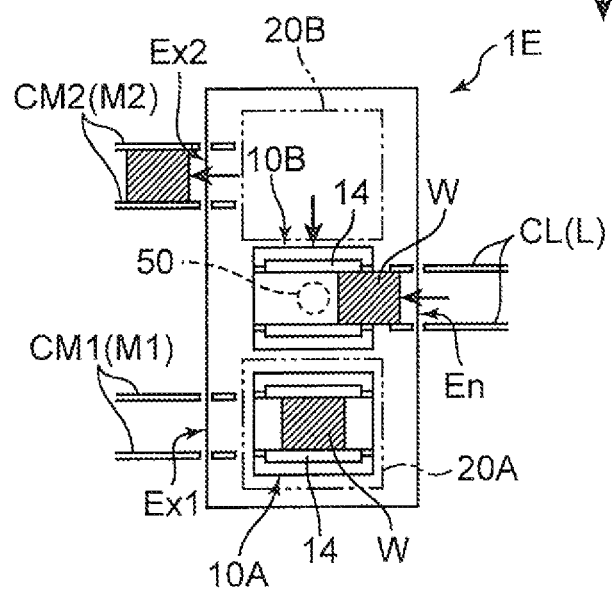

With the printing apparatus 1E, the substrate W is transferred, for example, from the substrate loading part En to the first substrate support table 10A in a state where the first substrate support table 10A is placed at the receiving position, and the substrate W is clamped by the clamp unit 14 and then the substrate W is subjected to substrate recognition (FIG. 19A). Subsequently, the first substrate support table 10A moves to the first sending position by being driven by the respective motors. The mask recognition is simultaneously performed. After movements of the clamp unit 14 with respect to the X axis direction and the R axis direction, and the movement of the movable base of the first substrate support table 10A with respect to the Y axis direction by respective correction amounts which are based on the foregoing recognition results, the clamp unit 14 is raised in the Z axis direction, and the substrate W is overlapped with the mask 21 and subjected to printing. After the printing, the substrate W is unloaded from the first substrate unloading part Ex to the first component mounting device M1 (FIG. 19B).

Consequently, as a result of the reception of the substrate W, the printing of the substrate W and the unloading operation of the substrate W in the first substrate support table 10A, and the reception of the substrate W (FIG. 19B), the printing of the substrate W (FIG. 19A), and the unloading operation of the substrate W in the second substrate support table 10B being performed with a given time difference, printing is alternately performed on the substrates W in the print executing parts 20A, 20B while the substrate W loaded from the common substrate loading part En is received by the substrate support tables 10A, 10B, and the substrates W are then unloaded from the substrate unloading parts Ex1, Ex2 to the respective component mounting devices M1, M2.

According to this kind of printing apparatus 1E of the sixth embodiment, printing of the substrate W can be efficiently performed since the printing process (mainly substrate W loading, substrate clamping, printing, substrate unclamping, and substrate unloading) using the first substrate support table 10A and the printing process (mainly substrate W loading, substrate clamping, printing, substrate unclamping, and substrate unloading) using the second substrate support table 10B are performed in parallel by delaying the timing.

Moreover, the printing apparatus 1E is useful when printing different patterns on the substrates W that are respectively sent out from one loader L1, and simultaneously sending the substrates W to the component mounting devices M1, M2.

The seventh embodiment of the screen printing apparatus according to the present disclosure is now explained with reference to FIG. 20.

Figure 20A:
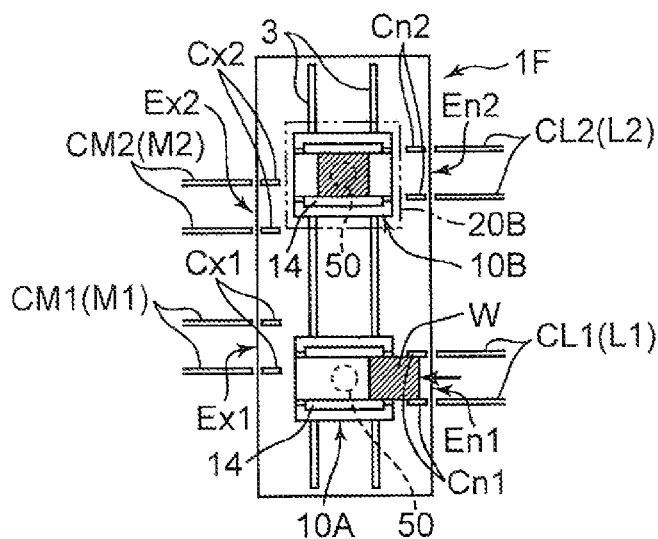
FIG. 20 is a schematic plan view showing the seventh embodiment of the screen printing apparatus according to the present disclosure (FIGS. 20A, 20B, and 20C show the printing operations in accordance with a time series).

FIG. 20A is a schematic plan view showing the screen printing apparatus 1F (hereinafter abbreviated as the "printing apparatus 1F") according to the seventh embodiment. The printing apparatus 1F is disposed between an upstream-side device of a dual system and a downstream-side device of a dual system, and is configured differently from the printing apparatus 1B of the second embodiment with respect to the following points, but the remainder of the configuration is basically common with the printing apparatus 1B of the second embodiment.

The printing apparatus 1F includes conveyer pairs Cn1, Cn2 corresponding to two substrate loading parts En1, En2

(first substrate loading part En1, second substrate loading part En2) provided at positions across a predetermined interval with respect to the Y axis direction on the foundation 2, and conveyer pairs Cx1, Cx2 corresponding to two substrate unloading parts Ex1, Ex2 (first substrate unloading part Ex1, second substrate unloading part Ex2) provided similarly at positions across a predetermined interval in the Y axis direction. The interval between the first substrate unloading part Ex1 and the second substrate unloading part Ex2 is set to be narrower.

The first substrate support table 10A is movably supported on a rail 3. The first substrate support table 10A moves between a second sending position where the printed substrate W can be unloaded from the second substrate unloading part Ex2, and a first withdrawal position Tes1 that is displaced more toward the front side with respect to the Y direction than a first receiving position where the substrate W loaded from the first substrate loading part En1 can be received. The second substrate support table 10B is movably supported on the rail 3. The second substrate support table 10B moves between a first sending position where the printed substrate W can be unloaded from the first substrate unloading part Ex1, and a second withdrawal position Tes2 that is displaced more toward the back side with respect to the Y direction than a second receiving position where the substrate W loaded from the second substrate loading part En2 can be received. The area between the first sending position and the second sending position is thus defined as a common area in which the movable area of the first substrate support table 10A and the movable area of the second substrate support table 10B overlap with each other.

In the printing apparatus 1F, the substrate W transferred from the first substrate loading part En1 to the first substrate support table 10A of the first receiving position is clamped by the clamp unit 14. Based on mask recognition and substrate recognition, position corrections are performed to the mask 21 at the printing position (same position as the first receiving position) below the first print executing part 20A. The printing is thereafter performed. Moreover, substantially at the same timing, the substrate W transferred from the first substrate loading part En2 to the second substrate support table 10B of the second receiving position is clamped by the clamp unit 14. Based on mask recognition and substrate recognition, position corrections are performed to the mask 21 at the printing position (same position as the second receiving position) below the second print executing part 20B. The printing is thereafter performed (FIG. 20A).

Figure 20B:
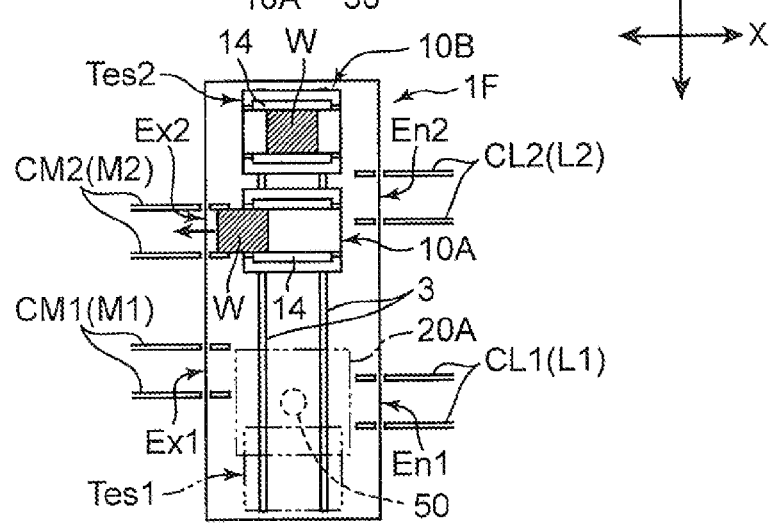

Subsequently, the first substrate support table 10A moves to the second sending position, and at the same time, the second substrate support table 10B moves to a second withdrawal position Tes2 that is farther back than the second receiving position. After the foregoing movements, the clamping of the clamp unit 14 is released at the first substrate support table 10A, and the substrate W is unloaded from the second substrate unloading part Ex2 to the second component mounting device M2 (FIG. 20B).

Figure 20C:
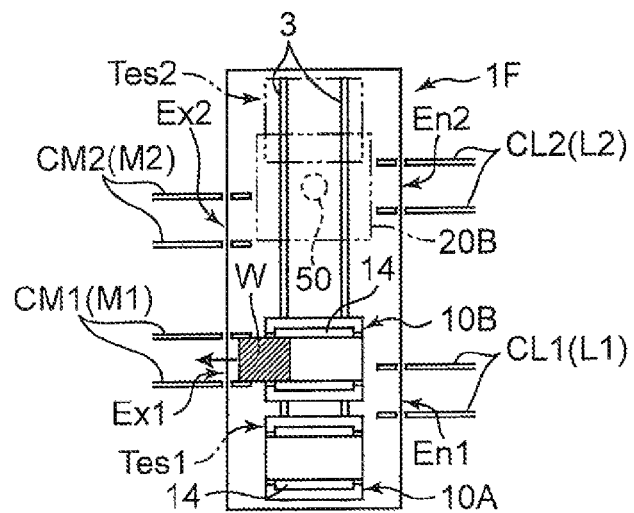

Subsequently, the first substrate support table 10A passes through from the second sending position to the first sending position and moves to the front-side first withdrawal position Tes1, and the second substrate support table 10B moves from the second withdrawal position Tes2 to the first sending position. After the foregoing movements, the clamping of the clamp unit 14 is released at the second substrate support table 10B, and the printed substrate W is unloaded from the first substrate unloading part Ex1 to the first component mounting device M1 (FIG. 20C).

That is, when the first substrate support table 10A is placed at the second sending position, the second substrate support table 10B is placed at the second withdrawal position Tes2 that avoids the first substrate support table 10A within its movable area. When the second substrate support table 10B is placed at the first sending position, the first substrate support table 10A is placed at the first withdrawal position Tes1 that avoids the second substrate support table 10B within its movable area.

According to this kind of printing apparatus 1F of the seventh embodiment, printing of the substrate W can be efficiently performed since the printing process(substrate loading, substrate clamping, printing, substrate unclamping, substrate unloading) using the first substrate support table 10A and the printing process(substrate loading, substrate clamping, printing, substrate unclamping, substrate unloading) using the second substrate support table 10B are performed in parallel by delaying the timing of the mutual substrate unloading processes.

Moreover, a common pattern or different patterns can be efficiently printed on the substrates W that are respectively sent out from the respective loaders L1, L2 with a simple configuration of comprising two print executing parts 20A, 20B. In addition, as described above, since the first substrate support table 10A can be moved from the first receiving position to the second sending position and the second substrate support table 10B can be moved from the second receiving position to the first sending position, the unloading destination of the print-processed substrate W can be easily switched between the component mounting devices M2, M1.

With the printing apparatus 1F of the seventh embodiment, in light of the configuration thereof, it is also possible to perform a forward transfer operation in addition to the foregoing cross transfer operation. The cross transfer operation is a printing operation where, on one hand, the substrate W is transferred from the first loader L1 to the first substrate support table 10A, and subsequently printing is performed on the substrate W, and the printed substrate W is unloaded to the first component mounting device M2, and on the other hand, the substrate W is transferred from the second loader L2 to the second substrate support table 10B, and subsequently printing is performed on the substrate W, and the printed substrate W is unloaded to the second component mounting device M2. The forward transfer operation is a printing operation where, on one hand, the substrate W is transferred from the first loader L1 to the first substrate support table 10A, and subsequently printing is performed on the substrate W, and the printed substrate W is unloaded to the first component mounting device M1, and on the other hand, the substrate W is transferred from the second loader L2 to the second substrate support table 10B, and subsequently printing is performed on the substrate W, and the printed substrate W is unloaded to the second component mounting device M2. Since the conveyer width variable mechanism of the respective substrate support tables 10A, 10B in the printing apparatus 1F is also configured to change the interval of the conveyer pair 12 with the device's inner side as a reference, as with the printing apparatus 1 of the first embodiment, there is an advantage in the foregoing case that this configuration will contribute to the improvement in the throughput and the downsizing of the printing apparatus 1, with respect to the component mounting devices M1, M2 to be disposed downstream. This point is now explained.

FIGS. 21 to 24 respectively show a moving distance, or the like, of the first substrate support table 10A between the receiving position and sending position, classified in accordance with a reference of each conveyer width variable mechanism on the component mounting device M side and the printing apparatus 1 side (substrate support tables 10A, 10B), wherein FIGS. 21 to 22 respectively show the moving distance and the like of the first substrate support table 10A in a case of the forward transfer operation, and FIGS. 23 and 24 respectively show the required moving distance and the like of the first substrate support table 10A in a case of the cross transfer operation.

Figure 21A:
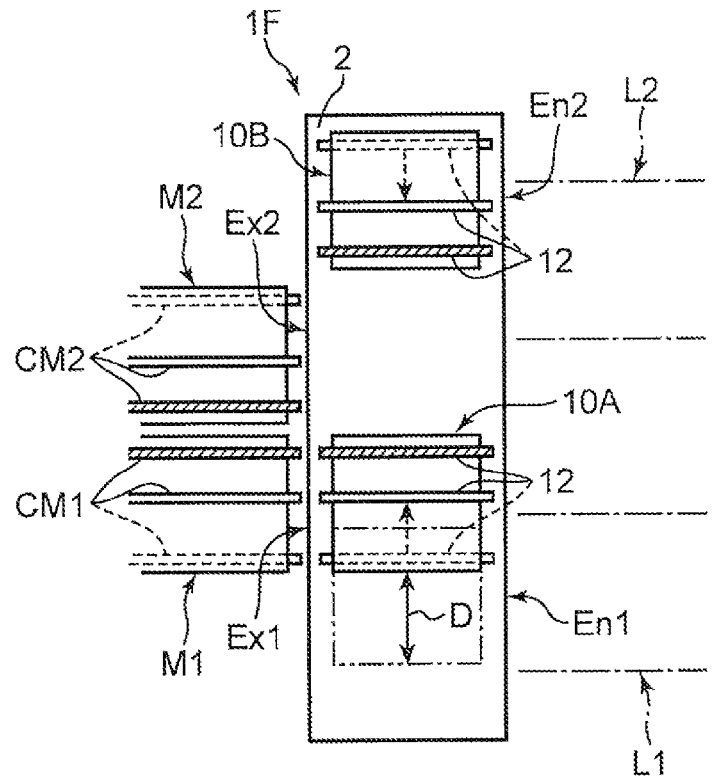
FIG. 21 is a schematic diagram of the printing apparatus (in the case of a forward transfer operation) explaining the advantages of the conveyer width variable mechanism (FIG. 21A shows a case where the conveyer width variable mechanism of the respective substrate support tables is based on an inner reference, and the conveyer width variable mechanism of the respective component mounting devices is based on an inner reference, and FIG. 21B shows a case where the conveyer width variable mechanism of the respective substrate support tables is based on an inner reference, and the conveyer width variable mechanism of the respective component mounting devices is based on an outer reference).
Figure 21B:
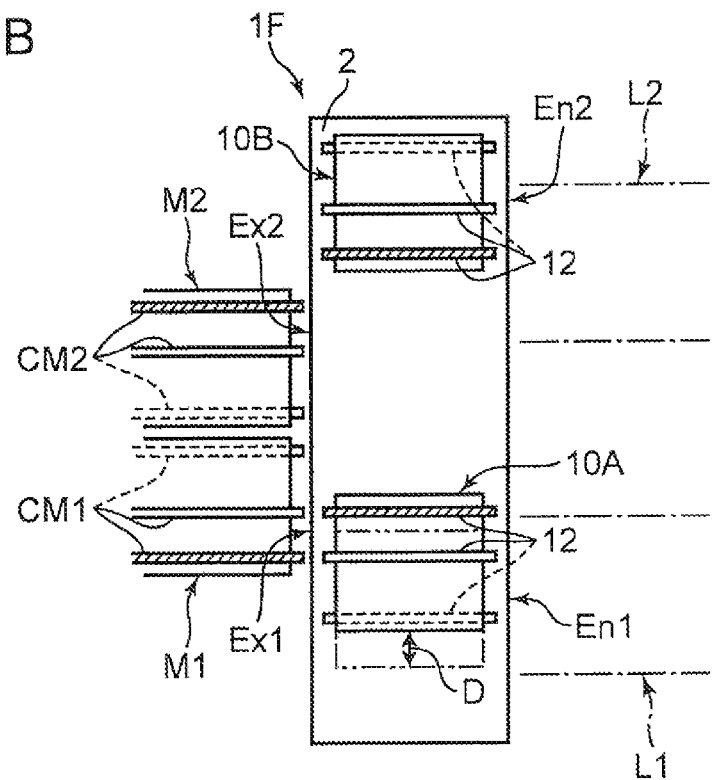
Figure 23A:
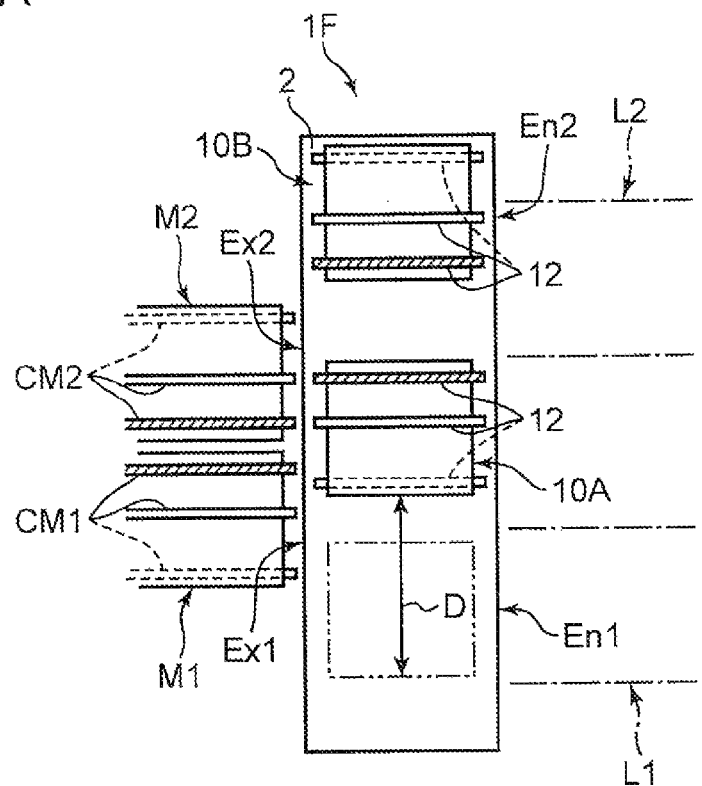
FIG. 23 is a schematic diagram of the printing apparatus (in the case of a cross transfer) explaining the advantages of the conveyer width variable mechanism (FIG. 23A shows a case where the conveyer width variable mechanism of the respective substrate support tables is based on an inner reference, and the conveyer width variable mechanism of the respective component mounting devices is based on an inner reference, and FIG. 23B shows a case where the conveyer width variable mechanism of the respective substrate support tables is based on an inner reference, and the conveyer width variable mechanism of the respective component mounting device is based on an outer reference).
Figure 23B:
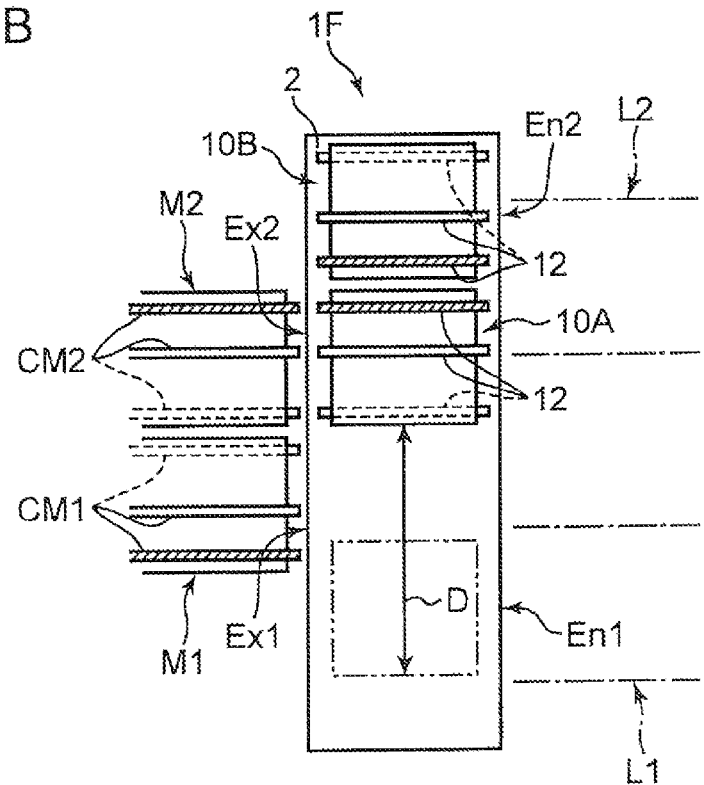

FIGS. 21 and 23 are schematic diagrams of a case where the conveyer width variable mechanism of the printing apparatus 1 (substrate support tables 10A, 10B) uses the device's inner side as a reference, wherein FIGS. 21A and 23A show a case where the conveyer width variable mechanism on the side of the component mounting devices M1, M2 is the inner reference, in which the conveyer on the device's back side is a fixed conveyer regarding the first component mounting device M1 and the conveyer on the device's front side is a fixed conveyer regarding the second component mounting device M2. FIGS. 21B and 23B show a case where the conveyer width variable mechanism of the component mounting devices M1, M2 is an outer reference, in which the conveyer on the device's front side is a fixed conveyer regarding the first component mounting device M1 and the conveyer on the device's back side is a fixed conveyer regarding the second component mounting device M2.

Figure 22A:
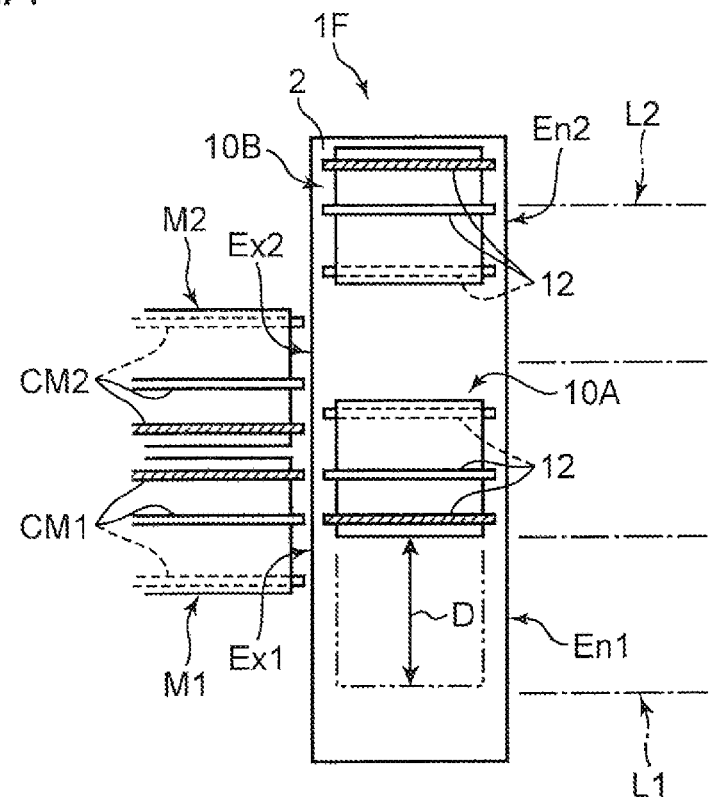
FIG. 22 is a schematic diagram of the printing apparatus (in the case of a cross transfer operation) explaining the advantages of the conveyer width variable mechanism (FIG. 22A shows a case where the conveyer width variable mechanism of the respective substrate support tables is based on an outer reference, and the conveyer width variable mechanism of the respective component mounting devices is based on an inner reference, and FIG. 22B shows a case where the conveyer width variable mechanism of the respective substrate support tables is based on an outer reference, and the conveyer width variable mechanism of the respective component mounting devices is based on an outer reference).
Figure 22B:
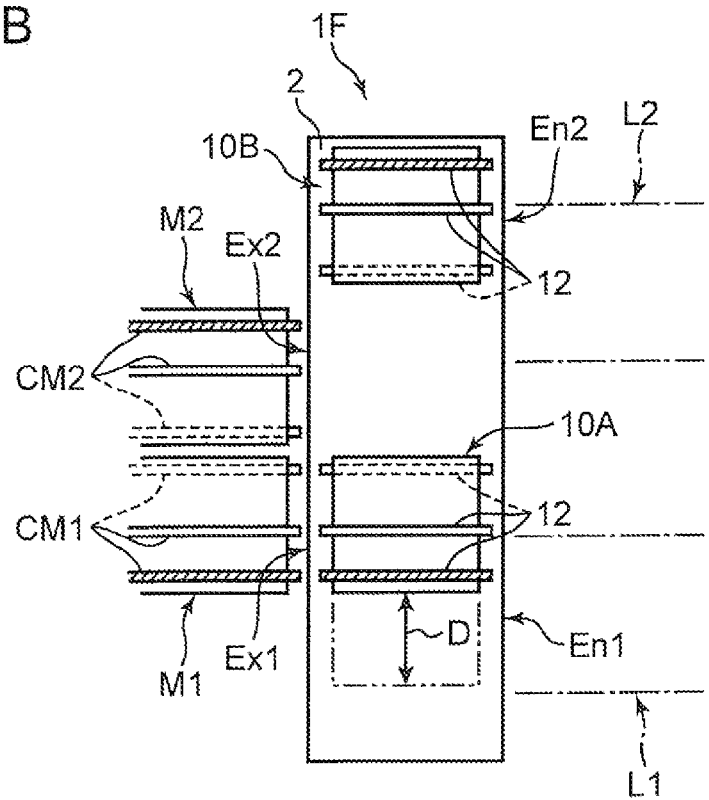
Figure 24A:
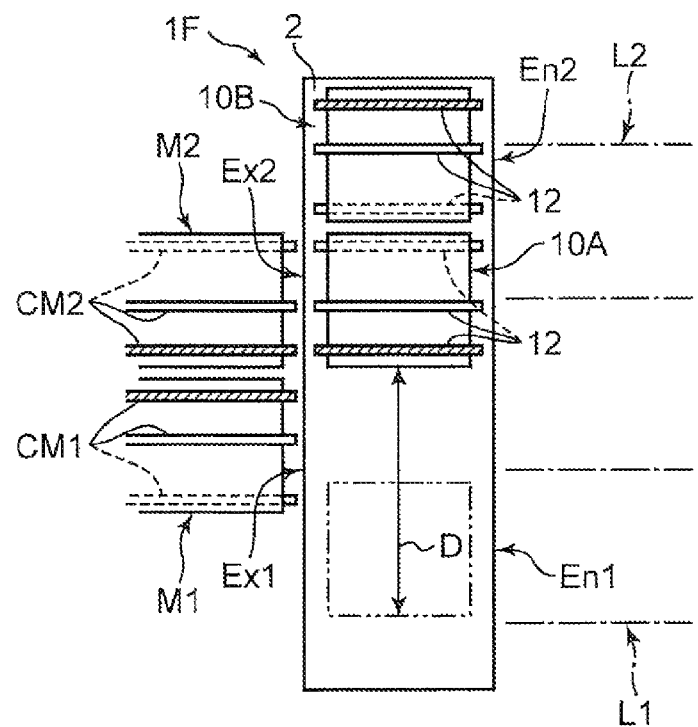
FIG. 24 is a schematic diagram of the printing apparatus (in the case of a cross transfer) explaining the advantages of the conveyer width variable mechanism (FIG. 24A shows a case where the conveyer width variable mechanism of the respective substrate support tables is based on an outer reference, and the conveyer width variable mechanism of the respective component mounting devices is based on an inner reference, and FIG. 24B shows a case where the conveyer width variable mechanism of the respective substrate support tables is based on an outer reference, and the conveyer width variable mechanism of the respective component mounting devices is based on an outer reference).
Figure 24B:
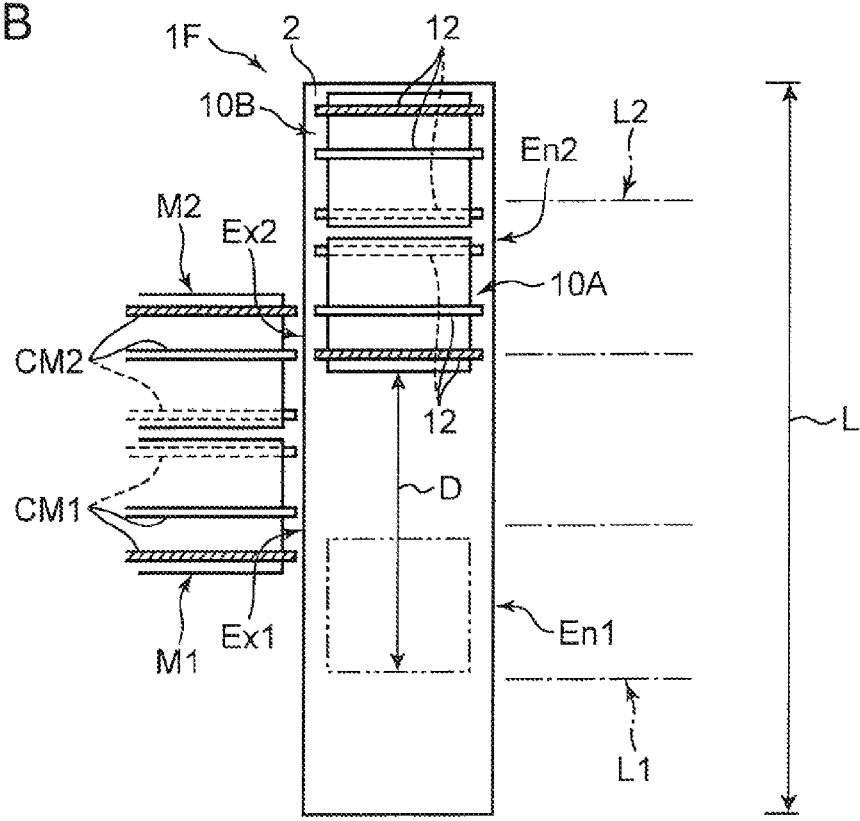

Meanwhile, FIGS. 22 and 24 are schematic diagrams of a case where the conveyer width variable mechanism of the printing apparatus 1 (substrate support tables 10A, 10B) uses the device's outer side as a reference, or a schematic diagram showing a case where the conveyer positioned on the device's front side is a fixed conveyer regarding the first substrate support table 10A, and the conveyer positioned on the device's back side is a fixed conveyer regarding the second substrate support table 10B. In addition, FIGS. 22A and 24A show a case where the conveyer width variable mechanism on the side of the component mounting devices M1, M2 is an inner reference. FIGS. 22B and 24B show a case where the conveyer width variable mechanism on the side of the component mounting devices M1, M2 is an outer reference.

Incidentally, in FIGS. 21 to 24, the fixed conveyers are illustrated with hatching. The conveyer pair 12 is illustrated with a solid line in a state when the interval of the conveyer pair 12 is a minimum.

Initially, based on FIGS. 21 and 22, the required moving distance of the first substrate support table 10A in the case of a forward transfer operation is examined.

In the example shown in FIG. 21A, the first sending position of the first substrate support table 10A or the position where the substrate W can be unloaded to the component mounting device M is constant regardless of the interval of the conveyer pair 12 (that is, size of the substrate W). Accordingly, regardless of the size of the substrate W, the moving distance D of the first substrate support table 10A between the first receiving position and the first sending position is always constant.

In the example shown in FIG. 21B, when the interval of the conveyer pair 12 is maximum, the first sending position of the first substrate support table 10A is equivalent to the example of FIG. 21A. As the interval of the conveyer pair 12 decreases, however, the first sending position of the first substrate support table 10A becomes closer to the first receiving position side. Accordingly, the moving distance D of the first substrate support table 10A is equivalent to the example of FIG. 21A when the substrate W is of a maximum size, and decreases as the size of the substrate W decreases.

In the example shown in FIG. 22A, when the interval of the conveyer pair 12 is maximum, the first sending position of the first substrate support table 10A is equivalent to the examples of FIGS. 21A and 21B. As the interval of the conveyer pair 12 decreases, however, the first sending position of the first substrate support table 10A becomes farther from the first receiving position. Accordingly, the moving distance D of the first substrate support table 10A is equivalent to the examples of FIGS. 21A and 21B when the substrate W is of a maximum size, and increases as the size of the substrate W decreases.

In the example shown in FIG. 22B, the first sending position of the first substrate support table 10A is constant regardless of the interval of the conveyer pair 12, and the position thereof is equivalent to that in the example of FIG. 21A. Accordingly, the moving distance D of the first substrate support table 10A is constant regardless of the size of the substrate W, and equivalent to the example of FIG. 21A.

That is, according to the configuration in which the conveyer width variable mechanism of the printing apparatus 1F (substrate support tables 10A, 10B) uses the device's inner side as a reference as with the examples of FIGS. 21A and 21B, the moving distance D of the substrate support tables 10A, 10B relating to the forward transfer operation can be made to be relatively short (in comparison to a case in which the conveyer width variable mechanism of the printing apparatus 1F uses the device's outer side as a reference), regardless of whether the conveyer width variable mechanism on the side of the component mounting devices M1, M2 uses the front or back of the device as a reference.

The required moving distance of the first substrate support table 10A in the case of a cross transfer operation is now examined based on FIGS. 23 and 24.

In the example shown in FIG. 23A, when the interval of the conveyer pair 12 is maximum, the second sending position of the first substrate support table 10A or the position where the substrate W can be unloaded from the first substrate support table 10A to the second component mounting device M2 will be farthest from the first receiving position. The second sending position of the first substrate support table 10A will be closer to the first receiving position side as the interval of the conveyer pair 12 decreases. Accordingly, the moving distance D of the first substrate support table 10A will be the greatest when the substrate W is of a maximum size, and becomes smaller as the size of the substrate W decreases.

In the example shown in FIGS. 23B and 24A, the second sending position of the first substrate support table 10A is constant regardless of the interval of the conveyer pair 12, and the position thereof is equivalent to the second sending position of the first substrate support table 10A when the interval of the conveyer pair 12 is maximum in the example of FIG. 23A. Accordingly, the moving distance D of the first substrate support table 10A is constant regardless of the size of the substrate W, and equivalent to the moving distance D when the substrate W is of a maximum size in the example of FIG. 23A.

In the example shown in FIG. 24B, when the interval of the conveyer pair 12 is maximum, the second sending position of the first substrate support table 10A is equivalent to the examples of FIGS. 23B and 24A. As the interval of the conveyer pair 12 decreases, however, the second sending position of the first substrate support table 10A becomes farther from the first receiving position. Accordingly, the moving distance D of the first substrate support table 10A will be equivalent to the examples of FIG. 23B and FIG. 24A when the substrate W is of a maximum size, and becomes greater as the size of the substrate W decreases. Moreover, in the example shown in FIG. 24B, as shown in the Figure, when the substrate W is of a minimum size, the first substrate support table 10A is considerably offset to the device's back side relative to the conveyer pair CM2 of the second component mounting device M2. Thus, the size L of the printing apparatus 1F in the front-back direction needs to be increased in comparison to the examples of FIGS. 23A, 23B and FIG. 24A by that much.

That is, according to the configuration in which the conveyer width variable mechanism of the printing apparatus 1F (substrate support tables 10A, 10B) uses the device's inner side as a reference as with the examples of FIGS. 23A and 23B, the moving distance D of the substrate support tables 10A, 10B relating to the forward transfer operation can be made to be relatively short (in comparison to a case in which the conveyer width variable mechanism of the printing apparatus 1F uses the device's outer side as a reference), and the enlargement of the printing apparatus 1F in the Y axis direction can also be prevented, regardless of whether the conveyer width variable mechanism on the side of the component mounting devices M1, M2 uses the front or back of the device as a reference.

Therefore, according to the configuration in which the conveyer width variable mechanism of the substrate support tables 10A, 10B uses the device's inner side as a reference, in both the forward transfer operation and the cross transfer operation, the moving distance D of the substrate support tables 10A, 10B can be made to be relatively short, and the enlargement of the printing apparatus 1 in the Y axis direction can also be prevented. Consequently, according to the printing apparatus 1 in which the conveyer width variable mechanism of the printing apparatus 1F (substrate support tables 10A, 10B) uses the device's inner side as a reference, it is possible to contribute to the improvement in the throughput and the downsizing of the printing apparatus 1.

The eighth embodiment of the screen printing apparatus according to the present disclosure is now explained with reference to FIGS. 25 to 28.

Figure 25:
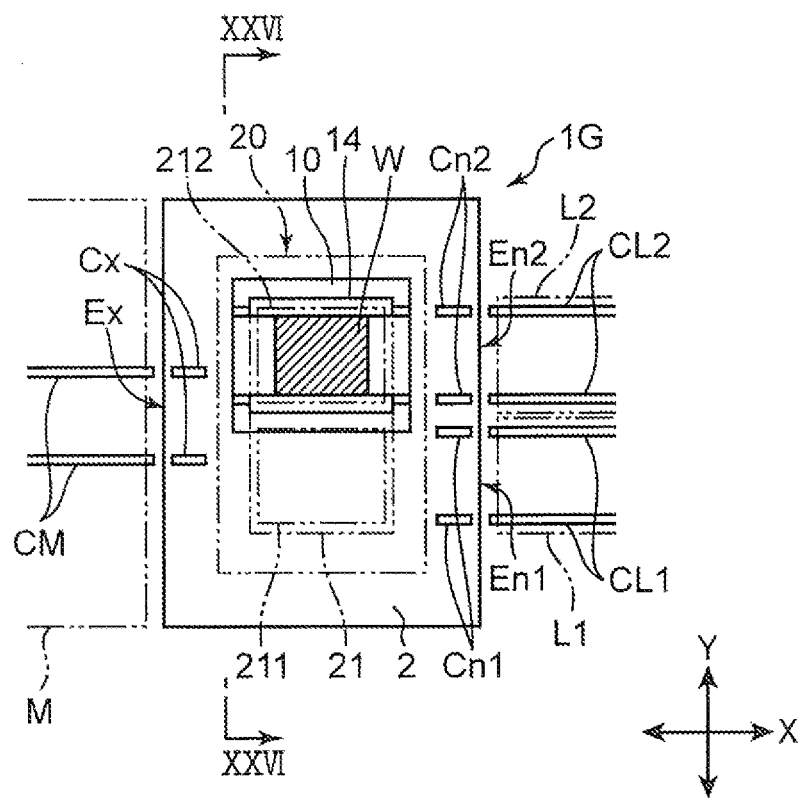
FIG. 25 is a schematic diagram showing the eighth embodiment of the screen printing apparatus according to the present disclosure.
Figure 26:
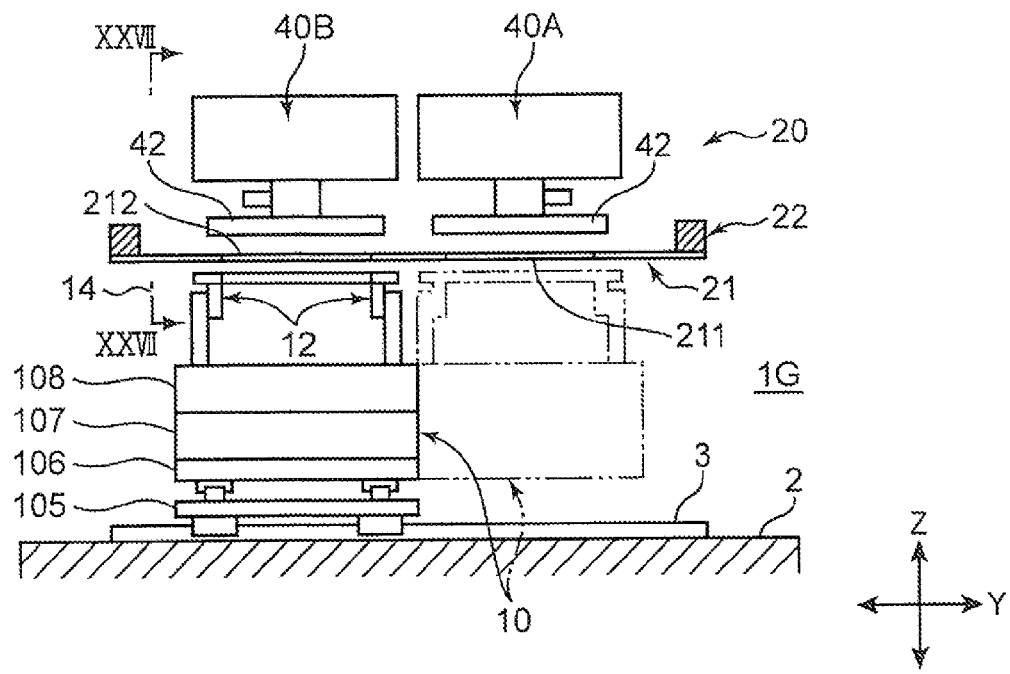
FIG. 26 is a cross section (XXVI-XXVI line cross section of FIG. 25) showing the screen printing apparatus.
Figure 27:
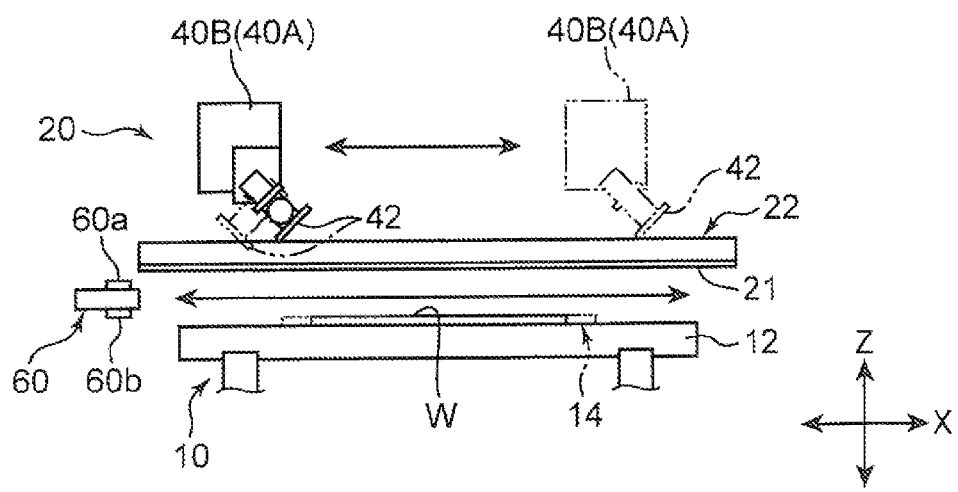
FIG. 27 is a cross section (XXVII-XXVII line cross section of FIG. 26) showing the screen printing apparatus.

FIG. 25 to FIG. 27 are schematic plan views showing the screen printing apparatus 1G (hereinafter abbreviated as the "printing apparatus 1G") according to the eighth embodiment, wherein FIG. 25 is a schematic plan view and FIGS. 26 and 27 are cross sections showing the printing apparatus 1G, respectively.

The screen printing apparatus 1G according to the eighth embodiment is disposed between two loaders L1, L2 and a component mounting device M. The screen printing apparatus 1G performs printing on the substrates W that are respectively sent out from the respective loaders L1, L2 on the upstream side and sends the printed substrates W to the component mounting device M on the downstream side. The screen printing apparatus 1G resembles to the printing apparatus 1A of the second embodiment. The printing apparatus 1G, as described later, performs printing to the substrates W by using a single mask comprising two printing patterns. In the ensuing explanation, among the constituent elements of the printing apparatus 1G, members that are the equivalent to those of the printing apparatus 1A of the second embodiment are given the common reference numeral and the explanation thereof is omitted, and only the differences are mainly explained in detail.

In the printing apparatus 1G, the respective substrate loading parts En1, En2 are juxtaposed in the Y axis direction, and the substrate unloading part Ex is provided at a position that is substantially intermediate of both substrate loading parts En1, En2 in the Y axis direction.

The printing apparatus 1G comprises, on its foundation 2, one substrate support device 10 for supporting the substrate W, and one print executing part 20 for performing printing on the substrate W supported by the substrate support device 10.

The substrate support device 10 corresponds to the substrate support means of the present disclosure. The substrate support device 10 receives the substrate W loaded from the substrate loading parts En1, En2 and supports the substrate W so as to enable printing thereon by the print executing part 20, and sends the printed substrate W from the substrate unloading part Ex.

The substrate support device 10 is provided movably in the Y axis direction along a fixed rail 3 installed on the foundation 2. The substrate support device 10 is configured to be driven by a screw feeding mechanism or the like having a motor as its driving source. Based on the motor control of the control machine described later, the substrate support device 10 moves among a first receiving position where the substrate W loaded from the first substrate loading part En1 can be received, a sending position where the substrate W can be unloaded from the substrate unloading part Ex, and a second receiving position where the substrate W loaded from the second substrate loading part En2 can be received.

The substrate support device 10 includes a conveyer pair 12, a moving mechanism for moving the conveyer pair 12 in the X axis direction, the Y axis direction, the Z axis direction and the R axis direction (around the Z axis), a clamp unit 14, and the like. With the printing apparatus 1G, the clamp unit 14 is supported by and fixed on the elevating table 108 described later.

The moving mechanism of the conveyer pair 12 includes an X axis table 106 provided on the base 105 of the substrate support device 10 and the X axis table 106 being movably supported in the X axis direction, a rotating table 107 provided on the X axis table 106 and the rotating table 107 being movably supported in the R axis direction (rotatably supported around the Z axis), an elevating table 108 provided on the rotating table 107 and the elevating table 108 being movably (elevatably) supported in the Z axis direction, and a drive mechanism for individually driving the respective tables 106 to 108 having a motor as the driving source. The moving mechanism moves the conveyer pair 12 in each of the foregoing directions based on the motor control of the control machine.

The print executing part 20 is provided above the substrate support device 10 configured as described above.

The print executing part 20 is supported by an apparatus frame, not shown, installed on the foundation 2. The print executing part 20 includes, as its constituent elements, a mask fixing member 22, two squeegee units 40A, 40B (first squeegee unit 40A, second squeegee unit 40B), an imaging unit 60, and the like.

The mask fixing member 22 of the printing apparatus 1G fixedly holds the mask 21 in a state of being stretched horizontally at a predetermined height position. The mask 21 used in the printing apparatus 1G is an element which is a single mask on which two mutually different types of printing patterns 211, 212 (first pattern 211, second pattern 212) are formed. The mask fixing member 22 is held so that the printing patterns 211, 212 are juxtaposed in the Y axis direction. Specifically, the mask fixing member 22 is held so that the printing patterns 211, 212 are arranged equally along the Y axis direction relative to the substrate unloading part Ex. In addition, the substrate loading parts En1, En2 are disposed so that the first substrate loading part En1 is aligned substantially in the X axis direction relative to the first pattern 211, and the second substrate loading part En2 is aligned substantially in the X axis direction relative to the second pattern 212.

Of the squeegee units 40A, 40B, the first squeegee unit 40A is disposed above the first printing pattern 211 of the mask 21 retained by the mask fixing member 22, and the second squeegee unit 40B is disposed above the second printing pattern 211, respectively. That is, the first squeegee unit 40A is used when printing is to be performed using the first printing pattern 211 of the mask 21, and the second squeegee unit 40B is used when printing is to be performed using the second pattern 212.

The squeegee units 40A, 40B are respectively supported on an apparatus frame, not shown, so that they are movable in the X axis direction indicated with a solid line and a virtual line of FIG. 27, and can be individually driven by a driving means such as a screw feeding mechanism having a motor as its driving source.

Moreover, the squeegee units 40A, 40B respectively include a single squeegee 42 that is elongated in the Y axis direction, a squeegee angle variable mechanism not shown for changing the inclination direction and the inclination angle (see FIG. 27) of the squeegee 42 relative to the mask 21, a squeegee elevating mechanism not shown for elevating the squeegee 42 between the printing work height position where the squeegee 42 slidably contacts the mask 21 and the withdrawal position that is higher than the foregoing position, and the like.

That is, when printing is performed using the first printing pattern 211 of the mask 21, the squeegee 42 of the first squeegee unit 40A is set at a predetermined angle relative to the surface (horizontal plane) of the substrate W and placed at the printing working position, and the first squeegee unit 40A is driven in the X axis direction in the foregoing state. Meanwhile, when printing is performed using the second printing pattern 212 of the mask 21, the squeegee 42 of the second squeegee unit 40B is set at a predetermined angle relative to the surface of the substrate W and placed at the printing working position, and the second squeegee unit 40B is driven in the X axis direction in the foregoing state.

The imaging unit 60 is used for image-recognizing the relative positional relationship of the mask 21 and the substrate W. The imaging unit 60 comprises a mask recognition camera 60a for imaging, from the lower side, a plurality of signs such as marks and symbols indicated on the lower face of the mask 21, and a mask recognition camera 60b for imaging, from the upper side, a plurality of signs such as marks and symbols of the substrate W supported by the substrate support device 10. The imaging unit 60 is provided movably, two-dimensionally, in a horizontal direction by being coupled to an X-Y robot not shown, and captures each of the signs by being disposed between the mask 21 before printing (before overlapping the mask) and the substrate W in accordance with the control of the X-Y robot by the control machine described later.

Incidentally, the printing apparatus 1G comprises a control machine that is equivalent to the control machine 8. The control machine can govern the control of the series of printing process operations of the substrate support device 10, the squeegee units 40A, 40B and the imaging unit 60. That is, the control machine can govern the series of operations including the reception of the substrate W loaded from the substrate loading parts En1, En2, the printing of the substrate W, and the unloading of the substrate W from the substrate unloading part Ex.

The printing operation of the printing apparatus 1G based on the control of the control machine is now explained with reference to FIGS. 25 and 28.

FIG. 25 schematically shows a state of a specific timing of the printing operation that is being performed continuously in the printing apparatus 1G. Specifically FIG. 25 shows a state immediately after the completion of printing of the substrate W using the second pattern 212 of the two printing patterns 211, 212 of the mask 21.

Figure 28A:
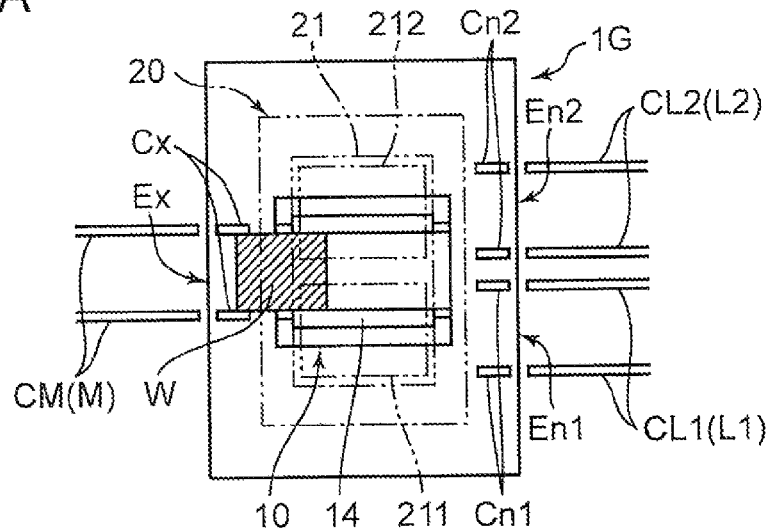
FIG. 28 is a schematic plan view explaining the printing operation of the screen printing apparatus in accordance with the control of the control machine (FIGS. 28A, 28B, and 28C show the printing operation in accordance with a time series).

From the state shown in FIG. 25, initially, the substrate support device 10 moves to the sending position or a position where the conveyer pair 12 aligns with the substrate unloading part Ex. In addition, after the clamped state of the substrate W is released, the printed substrate W is sent from the substrate support device 10 and unloaded from the substrate unloading part Ex to the component mounting device M by the drive of the conveyer pair 12, the conveyer pair on the foundation 2, and the conveyer CM (FIG. 28A).

Figure 28B:
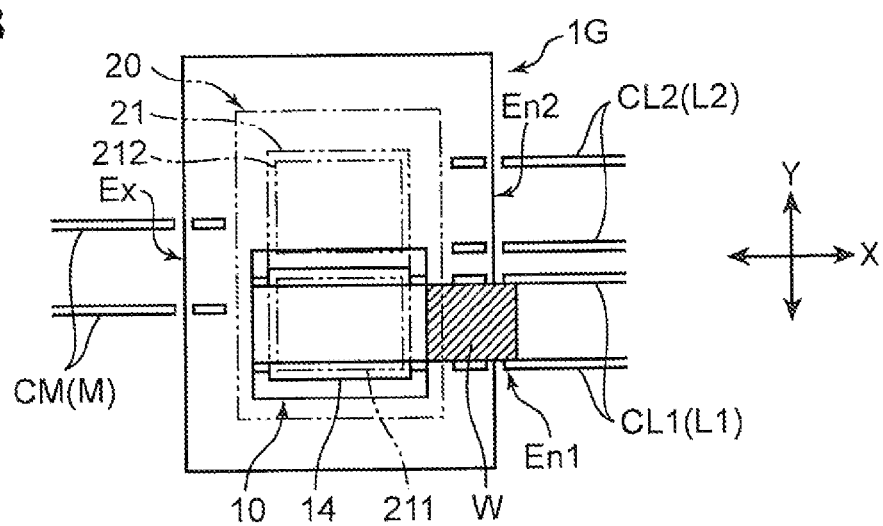

When the unloading of the substrate W is completed, the substrate support device 10 moves the first or second receiving position in order to receive the subsequent substrate W. That is, the substrate support device 10 moves the position where the conveyer pair 12 aligns with the first substrate loading part En1 or the second substrate loading part En2. Consequently, the substrate W loaded from the first substrate loading part En 1 or the second substrate loading part En2 can be received by the conveyer pair 12 of the substrate support device 10. For example, as shown in FIG. 28B, the substrate W loaded from the first substrate loading part Ent will be received by the conveyer pair 12, and clamped at a predetermined position.

Figure 28C:
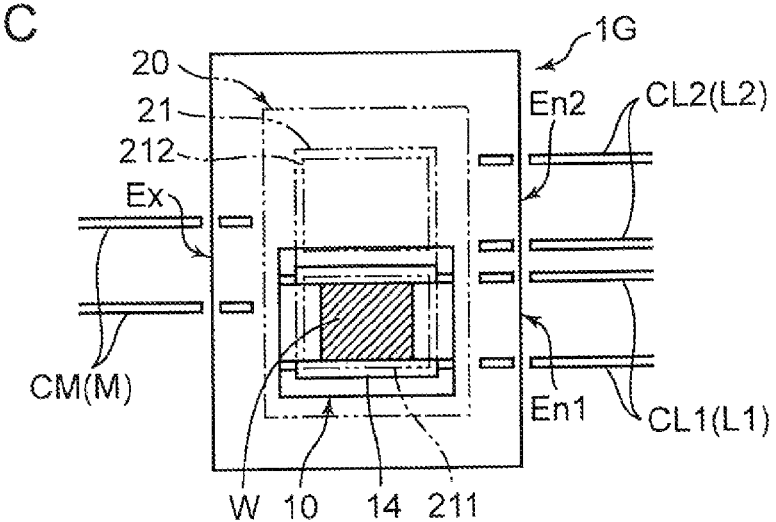

When the clamping of the substrate W is completed, the substrate W is placed, as shown in FIG. 28C, at a position below the printing pattern to be printed among the two printing patterns 211, 212 of the mask 21. Although the substrate W can be placed at the lower position of either of the printing patterns 211, 212 of the mark 21 by moving the substrate support device 10 in the Y axis direction, the substrate W is placed at the lower position of the first pattern 211, in the illustrated example.

In addition, prior to printing, the imaging unit 60 moves from a predetermined withdrawal position (position indicated in FIG. 27) to a space between the substrate W and the mask 21. The imaging unit 60 captures the respective signs of the substrate W and the mask 21, and thereafter moves to the withdrawal position. Consequently, the respective positions of the substrate W and the mask 21 are subjected to capture recognition. Based on the recognition results, the position gap between the mask 21 and the substrate W is obtained. The correction values ($\Delta X$, $\Delta Y$, $\Delta R$) of the X axis, Y axis and R axis directions according to the obtained position gap are also obtained. The foregoing recognition processing and calculation of correction values are performed by the control machine based on the images captured by the respective cameras 60a, 60b.

When the recognition of the substrate W and the like is completed, the substrate W is overlapped with the mask 21. The mask 21 is appropriately fit atop the substrate W as a result of the substrate support device 10 being driven in the Y axis direction and the conveyer 12 being driven in the X axis and R axis directions with the moving mechanism based on the correction values ($\Delta X$, $\Delta Y$, $\Delta R$).

In addition, when the overlapping of the substrate W with the mask 21 is completed, one of the two squeegee units 40A, 40B corresponding to the printing patterns 211, 212 to be printed is activated, and printing is thereby performed on the substrate W. In an example case of FIG. 28C, after the squeegee 42 of the first squeegee unit 40A is lowered from the withdrawal height position to the printing work height position, the entire squeegee unit 40 including the squeegee 42 moves in the X axis direction so as to perform the printing on the substrate W.

When the printing is completed, the conveyer pair 12 is reset to a predetermined home position. That is, as a result of the movement of the conveyer pair 12 in the respective directions of the X axis, Y axis and R axis, caused by the drive of the moving mechanism of the conveyer pair 12, the substrate W clamped by the clamp unit 14 is detached from the mask 21, the clamping of the clamp unit 14 is released, the substrate W is mounted on the conveyer pair 12 due to the lowering of the backup mechanism, and the conveyer pair 12 is placed at a position where it enables to transfer the substrate W among each of the conveyer pairs CL1, CL2 and CM.

When the printing of the substrate W is thereby completed, the substrate support device 10 moves to the sending position. Based on the drive of the conveyer pair 12, the printed substrate W is sent from the substrate support device 10 and unloaded from the substrate unloading part Ex to the component mounting device M. Subsequently, the substrate W loaded from the first substrate loading part En1 or the second substrate loading part En2 is received by the substrate support device 10, the substrate W is subjected to printing by using one of the two printing patterns 211, 212 of the mask 21, and the substrate W is unloaded from the substrate unloading part Ex to the component mounting device M.

According to the printing apparatus 1G explained above, it is possible not only to perform printing using one mask 21 including two printing patterns 211, 212, but also to independently receive the substrate W from the dual system loaders L1, L2, to perform printing on the substrate, and to unload the printed substrate W to the single system component mounting device M. Accordingly, conventional incidental equipment (switching device) is no longer required and it is possible to downsize the manufacturing line despite the printing apparatus 1G is disposed between an upstream-side device of a dual system (loaders L1, L2) and a downstream-side device of a single system (component mounting device M).

While an example of applying a mask formed with two mutually different types of printing patterns 211, 212 as the mask 21 was explained regarding the printing apparatus 1G, the printing patterns 211, 212 may also be the same type of pattern (hereinafter the same in the ninth to thirteenth embodiments).

The ninth embodiment of the screen printing apparatus according to the present disclosure is now explained with reference to FIG. 29.

Figure 29:
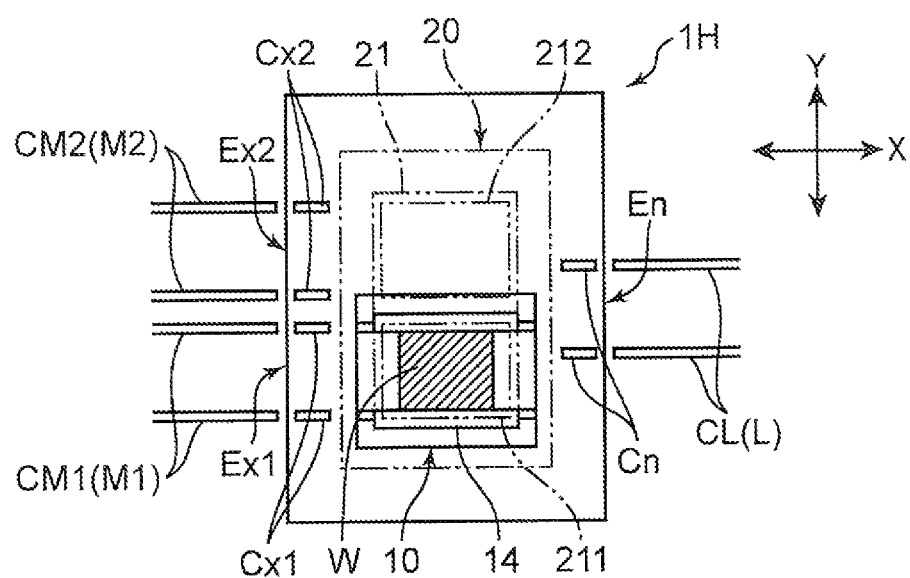
FIG. 29 is a schematic plan view showing the ninth embodiment of the screen printing apparatus according to the present disclosure.

FIG. 29 is a schematic plan view showing the screen printing apparatus 1H (hereinafter abbreviated as the "printing apparatus 1H") according to the ninth embodiment. The printing apparatus 1H according to the ninth embodiment is a modified example of the printing apparatus 1G of the eighth embodiment, and also resembles the printing apparatus 1D of the fifth embodiment. The printing apparatus 1H is configured differently from the printing apparatus 1G of the eighth embodiment with respect to the following points.

That is, the printing apparatus 1H is configured so that it can load the substrate W, which is sent out from one loader L, from the substrate loading part En into the apparatus, and the printing apparatus 1H can selectively unload the printed substrate W from the first substrate unloading part Ex1 to the first component mounting device M1 or the printing apparatus 1H can unload the printed substrate W from the printed second substrate unloading part Ex2 to the second component mounting device M2. In addition, the substrate support device 10 is provided movably in the Y axis direction from the receiving position where the substrate W loaded from the substrate loading part En can be received, the first sending position where the printed substrate W can be unloaded from the first substrate unloading part Ex1, and the second sending position where the printed substrate W can be unloaded from the second substrate unloading part Ex2. The printing apparatus 1H thus differs from the configuration of the printing apparatus 1G of the eighth embodiment with respect to the foregoing points.

While the timing chart is omitted, with the printing apparatus 1H, by the substrate support device 10 initially being placed at the receiving position, the substrate W loaded from the substrate loading part En is received by the substrate support device 10 (conveyer pair 12). Subsequently, after the substrate W is clamped, the substrate support device 10 is placed so as to correspond to the pattern to be printed on the substrate of either the first printing pattern 211 or the second printing pattern 212 of the mask 21, and the mask 21 is fit atop the substrate W in the foregoing state, and printing is thereby performed. After the printing, as a result of the substrate support device 10 being disposed at the first sending position or the second sending position, the substrate W is unloaded from the first substrate unloading part Ex1 to the first component mounting device M1, or unloaded from the second substrate unloading part Ex2 to the component mounting device M2.

According to the printing apparatus 1H of the ninth embodiment described above, it is possible not only to perform printing using the mask 21 including two printing patterns 211, 212, but also to independently receive the substrates W from the single system loader L, to perform printing on the substrate, and to unload the substrates W to the component mounting device of dual systems M1, M2. Thus, according to the printing apparatus 1H, conventional incidental equipment (sorting device) is no longer required and it is possible to downsize the manufacturing line despite the printing apparatus 1H being disposed between an upstream-side device of a single system (loader L1) and a downstream-side device of a dual system (component mounting devices M1, M2).

The tenth embodiment of the screen printing apparatus according to the present disclosure is now explained with reference to FIG. 30.

Figure 30:
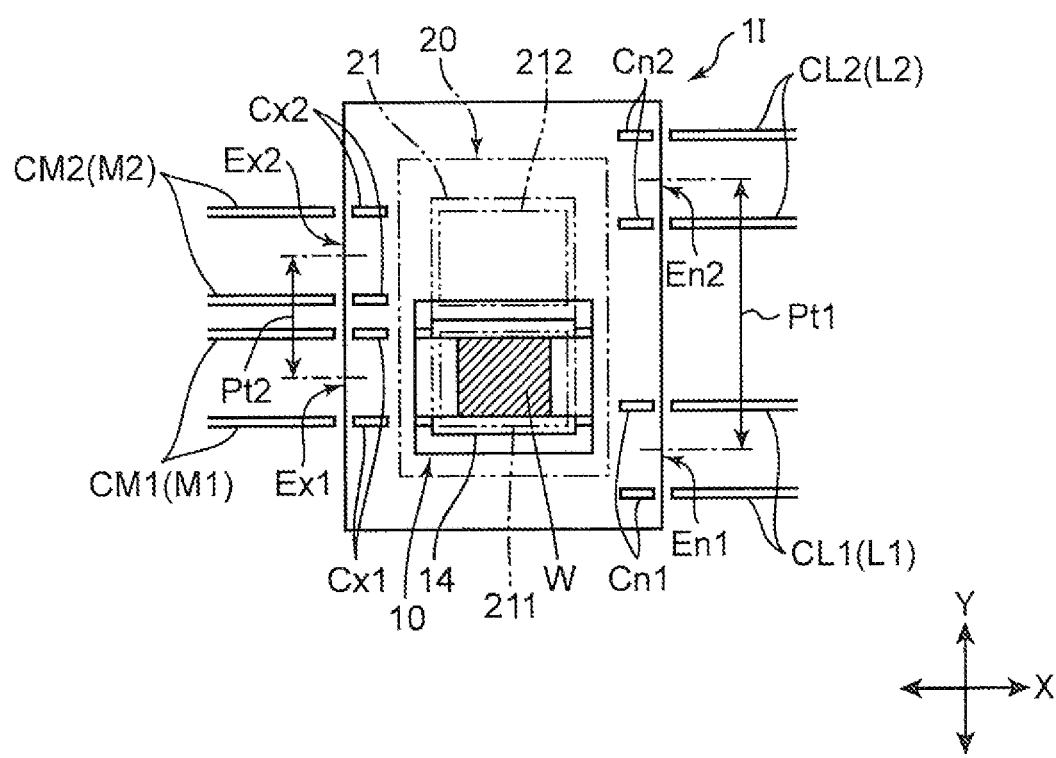
FIG. 30 is a schematic plan view showing the tenth embodiment of the screen printing apparatus according to the present disclosure.

FIG. 30 is a schematic plan view showing the screen printing apparatus 1I (hereinafter abbreviated as the "printing apparatus 1I") according to the tenth embodiment. The printing apparatus 1I according to the tenth embodiment is a modified example of the printing apparatus 1G of the eighth embodiment, and also resembles the printing apparatus 1F of the seventh embodiment. The printing apparatus 1I is configured differently from the printing apparatus 1G of the eighth embodiment with respect to the following points.

That is, the printing apparatus 1I is configured so that it can load the substrate W, which is sent out from the first loader L1, from the first substrate loading part En1 into the apparatus and load the substrate W, which is sent out from the second loader L2, from the second substrate loading part En2 into the apparatus, respectively. The printing apparatus 1I is also configured so that it selectively unloads the printed substrate W from the first substrate unloading part Ex1 to the first component mounting device M1 or unload the printed substrate W from the printed second substrate unloading part Ex2 to the second component mounting device M2. In addition, the substrate support device 10 is provided movably between the first sending position where the printed substrate W can be unloaded from the first substrate unloading part Ex1 and the second sending position where the printed substrate W can be unloaded from the second substrate unloading part Ex2. The printing apparatus 1I differs from the configuration of the printing apparatus 1G of the eighth embodiment with respect to the foregoing points. The respective substrate unloading parts Ex1, Ex2 are provided at a position between both substrate loading parts En1, En2 with respect to the Y axis direction. In other words, the substrate unloading parts Ex1, Ex2 are provided at an array pitch Pt2 which is different from an array pitch Pt1 of the substrate loading parts En1, En2 (Pt2<Pt1).

While the timing chart is omitted, with the printing apparatus 1I, by the substrate support device 10 initially being disposed at the first receiving position or the second receiving position, the substrate W loaded from the substrate loading part En1 or En2 is received by the substrate support device 10 (conveyer pair 12). Subsequently, after the substrate W is clamped, the substrate support device 10 is placed so as to correspond to the pattern to be printed on the substrate W of either the first printing pattern 211 or the second printing pattern 212 of the mask 21, and the mask 21 is fit atop the substrate W in the foregoing state, and printing is thereby performed. After the printing, as a result of the substrate support device 10 being placed at the first sending position or the second sending position, the substrate W is unloaded from the first substrate unloading part Ex1 to the first component mounting device M1, or unloaded from the second substrate unloading part Ex2 to the component mounting device M2.

According to the printing apparatus 1I of the tenth embodiment described above, it is possible not only to perform printing using the mask 21 including two printing patterns 211, 212, but also to independently receive the substrates W from the dual system loaders L1, L2, to perform printing on the substrate, and to unload the substrates W to the conveyer pairs CM1, CM2 of the component mounting devices M1, M2 installed at a pitch (Pt2) that is different than a pitch (Pt1) of the conveyer pairs CL1, CL2 of the loaders L1, L2. Thus, according to the printing apparatus 1I, conventional incidental equipment (relay device) is no longer required and it is possible to downsize the manufacturing line despite the printing apparatus 1I is disposed between an upstream-side device of a dual system (loaders L1, L2) and a downstream-side device of a dual system (component mounting devices M1, M2), and the line pitch of the respective substrate transfer lines of the upstream-side device and the line pitch of the respective substrate transfer lines of the downstream apparatus are different.

The eleventh embodiment of the screen printing apparatus according to the present disclosure is now explained with reference to FIGS. 31 and 32.

Figure 31:
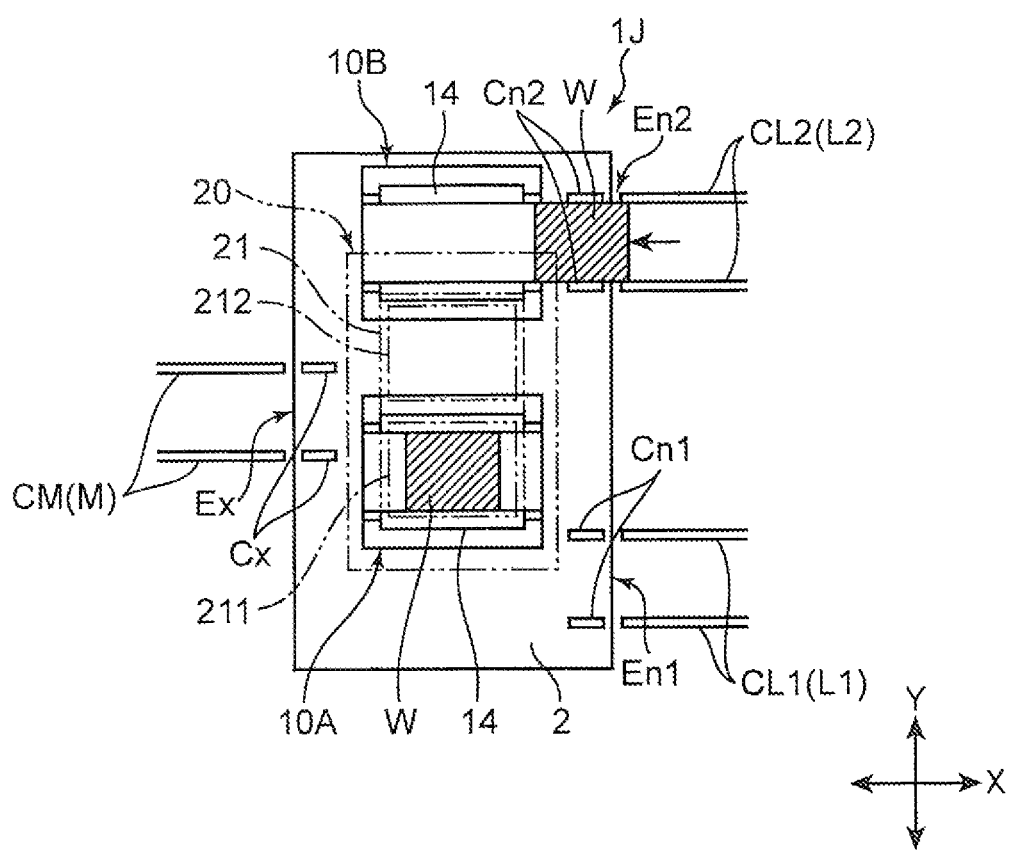
FIG. 31 is a schematic plan view showing the eleventh embodiment of the screen printing apparatus according to the present disclosure.

FIG. 31 is a schematic plan view showing the screen printing apparatus 1J (hereinafter abbreviated as the "printing apparatus 1J") according to the eleventh embodiment. The printing apparatus 1J according to the eleventh embodiment is a modified example of the printing apparatus 1G of the eighth embodiment, and is configured differently from the printing apparatus 1G of the eighth embodiment with respect to the following points.

That is, the printing apparatus 1J includes two substrate support devices 10A, 10B (first substrate support device 10A, second substrate support device 10B) as a substrate support device. The substrate support devices 10A, 10B are configured the same and supported on a common fixed rail 3 installed on the foundation 2. The substrate support devices 10A, 10B can be individually driven in the Y axis direction based on a screw feeding mechanism or the like with a motor as the driving source. In addition, the first substrate support device 10A moves between a receiving position (first receiving position) where the substrate W loaded from the first substrate loading part En1 can be received, and the sending position. The second substrate support device 10B moves between a receiving position (second receiving position) where the substrate W loaded from the second substrate loading part En2 can be received and the sending position. According to the printing apparatus 1J, only the printing of the first pattern 221 of the two printing patterns 211, 212 of the mask 21 can be performed on the substrate W supported by the first substrate support device 10A, and only the printing of the second pattern 212 can be performed on the substrate W supported by the second substrate support device 10B.

In order to send out the substrate W from the one substrate support device 10B (or 10A) to the substrate unloading part Ex during another substrate W being received by the other substrate support device 10A (or 10B), in other words, to enable to place the substrate support devices 10A and 10B simultaneously at the first or second receiving position and the sending position, both substrate loading parts En1, En2 in the printing apparatus 1J are disposed at positions outside of the mask 21 with respect to the Y axis, as shown in the Figures, for example.

With the printing apparatus 1J, as shown in the Figures, the first substrate support device 10A is placed at a lower position of the mask 21, and the substrate W is overlapped with the mask 21 and the substrate is subjected to printing in a state where the substrate W supported by the first substrate support device 10A is positioned relative to the first pattern 211. During the foregoing printing, the substrate W on the conveyer pair CL2 is transferred from the second substrate loading part En2 to the second substrate support device 10B of the first receiving position, and then clamped.

Figure 32A:
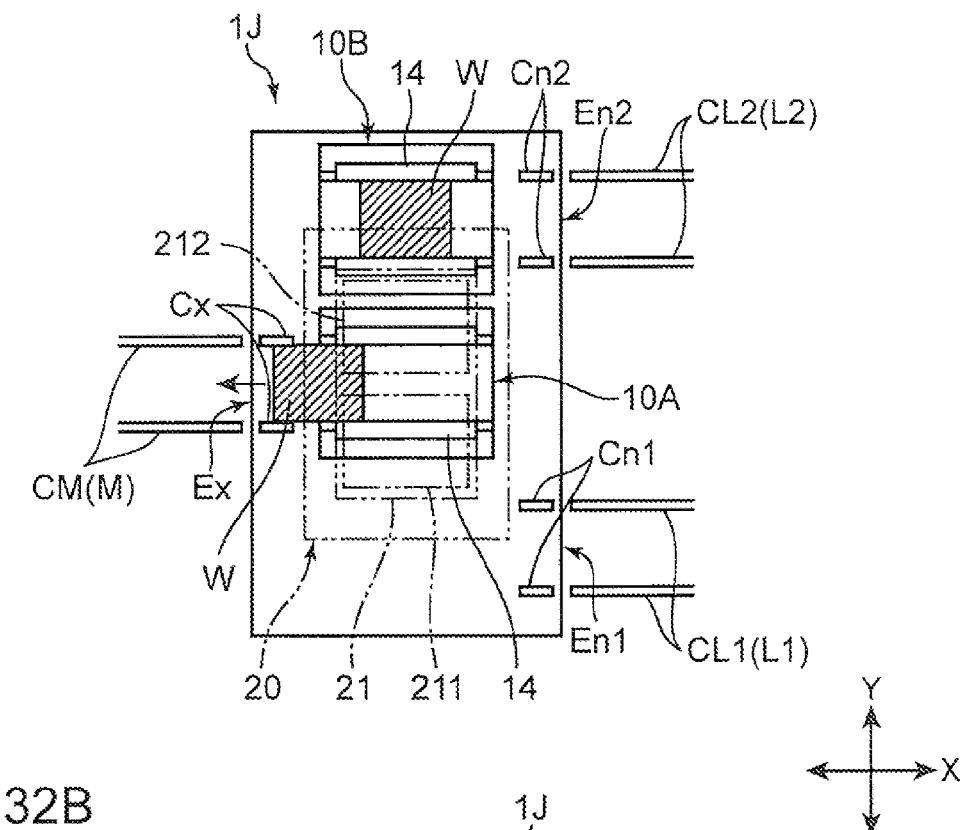
FIG. 32 is a schematic plan view explaining the printing operation of the screen printing apparatus in accordance with the control of the control machine (FIGS. 32A and 32B show the printing operation in accordance with a time series).

When the printing is completed, the first substrate support device 10A is placed at the sending position and the printed substrate W is sent from the substrate support device 10 and unloaded from the substrate unloading part Ex to the component mounting device M, as shown in FIG. 32A.

Figure 32B:
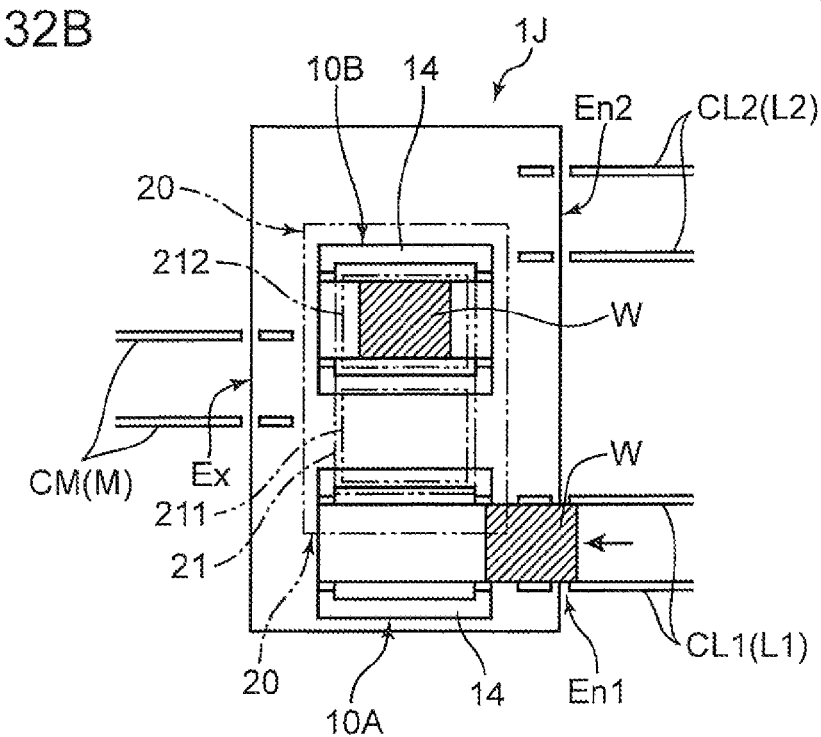

When the unloading of the substrate W is completed, the first substrate support device 10A is placed at the first receiving position, and the substrate W loaded from the first substrate loading part En1 is received by the conveyer pair 12 of the first substrate support device 10A, and then clamped, as shown in FIG. 32B. Meanwhile, the second substrate support device 10B is placed at a lower position of the mask 21, and the substrate W is overlapped with the mask 21 and is subjected to printing in a state where the substrate W supported by the second substrate support device 10B is positioned relative to the second pattern 212.

As described above, the first substrate support device 10A performs sequentially the processes of moving among the first receiving position, the lower position of the mask 21 (first pattern 211), and the sending position, printing of the substrate W supported by the first substrate support device 10A, unloading the substrate W, and receiving the subsequent substrate W, in this order. With a given time difference with the foregoing operations, the second substrate support device 10B sequentially performs the processes of moving among the second receiving position, the lower position of the mask 21 (second pattern 212), and the sending position, printing of the substrate W supported by the second substrate support device 10B (FIG. 32B), unloading of the substrate W, and receiving the subsequent substrate W (FIG. 31, FIG. 32A), in this order.

With this kind of printing apparatus 1J of the eleventh embodiment, as with the printing apparatus 1G of the eighth embodiment, the printing apparatus 1J can also independently receive the substrate W from an upstream-side device of a dual system (loaders L1, L2), perform printing on the substrate, and unload the substrate W to a downstream-side device of a single system (component mounting device M).

In addition, according to this printing apparatus 1J, since the substrates W are alternately received by the two substrate support devices 10A, 10B and the substrates W are simultaneously subjected to printing and unloaded, it is possible to start printing of the subsequent substrate W in a shorter period of time after the preceding printed substrate W is unloaded, in comparison to the printing apparatus 1G of the eighth embodiment. Thus, according to the printing apparatus 1J of the eleventh embodiment, in addition to the same operation and effect of the eight embodiment, that it is possible to downsize the manufacturing line despite the printing apparatus 1 being disposed between an upstream-side device of a dual system and a downstream-side device of a single system of the printing apparatus 1G, the operation and effect of being able to improve the throughput can also be enjoyed.

While no specific reference is made in the foregoing explanation, the imaging unit 60 is common in both substrate support devices 10A, 10B. In a state where the respective substrate support devices 10A, 10B are disposed at a lower position of the mask 21, the imaging unit 60 captures the respective signs by being disposed between the substrate W and the mask 21 (first pattern 211 or second pattern 212). In the printing apparatus 1J, at a timing when one substrate support device 10A (or 10B) is placed at a lower position of the mask 21, normally, as shown in FIG. 30 and FIG. 32B, the other substrate support device 10B (or 10A) is placed at the receiving position. Therefore, the other substrate support device 10B (or 10A) will not interfere with the sign capturing operation by the imaging unit 60.

The twelfth embodiment of the screen printing apparatus according to the present disclosure is now explained with reference to FIGS. 33 and 34.

Figure 33:
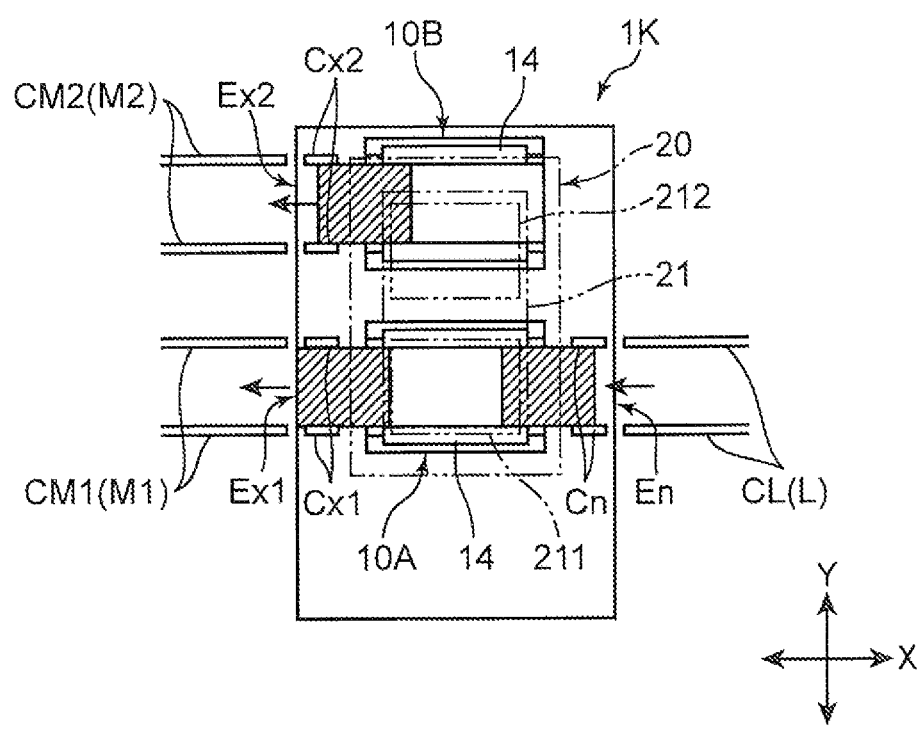
FIG. 33 is a schematic plan view showing the twelfth embodiment of the screen printing apparatus according to the present disclosure.

FIG. 33 is a schematic plan view showing the screen printing apparatus 1K (hereinafter abbreviated as the "printing apparatus 1K") according to the twelfth embodiment. The printing apparatus 1K according to the twelfth embodiment is a modified example of the printing apparatus 1J of the eleventh embodiment, and is configured differently from the printing apparatus 1J of the eleventh embodiment with respect to the following points.

That is, the printing apparatus 1K includes one substrate loading part En and two substrate unloading parts Ex1, Ex2 (first substrate unloading part Ex1, second substrate unloading part Ex2). In the illustrated example, the printing apparatus 1K is configured to load the substrate W, which is sent out from one loader L, from the substrate loading part En into the apparatus, and unloading the printed substrate W from the first substrate unloading part Ex1 to the first component mounting device M1, and from the second substrate unloading part Ex2 to the second component mounting device M2, respectively.

The substrate loading part En is provided to be aligned in one row in the X axis direction relative to the first substrate unloading part Ex1. In other words, the substrate loading part En is provided at the same position as the first substrate unloading part Ex1 with respect to the Y axis direction.

In addition, while the first substrate support device 10A is provided movably between a working position (position indicated in the Figure; corresponds to the receiving position and the first sending position of the present disclosure) where the substrate W loaded from the substrate loading part En can be received and where the printed substrate W can be unloaded from the first substrate unloading part Ex1, and a standby position that is positioned more toward the device's front side (downward in the Figure) than the foregoing working position. On the other hand, the second substrate support device 10B is provided movably between a receiving position (corresponds to the receiving position of the present disclosure) where the substrate W loaded from the substrate loading part En can be received, and a sending position (corresponds to the second sending position of the present disclosure) where the printed substrate W can be sent to the second substrate unloading part Ex2. While the working position in the first substrate support device 10A and the receiving position in the second substrate support device 10B are the same position, these terms are distinguished in words in the explanation of this embodiment.

The mask 21 is retained so that the first pattern 211 of the two printing patterns 211, 212 is positioned at the working position (receiving position). Moreover, in order to perform the printing simultaneously to the substrates W in a state where these substrates W are positioned to the respective printing patterns 211, 212, an interval of the respective printing patterns 211, 212 with respect to the Y axis direction is set in relation to the configuration of the respective substrate support devices 10A, 10B.

With the printing apparatus 1K, the printing of the substrate W and the unloading of the printed substrate W are performed substantially simultaneously by the respective substrate support devices 10A, 10B. That is, with the printing apparatus 1K, as shown in the Figure, the substrate W loaded from the substrate loading part En is received by the first substrate support device 10A in a state where the first substrate support device 10A is placed at the working position (receiving position and first sending position). At this timing, the preceding printed substrate W is sent from the first substrate support device 10A, and unloaded from the first substrate unloading part Ex1 to the first component mounting device M1. Moreover, at almost the same time as above, the preceding printed substrate W is sent from the second substrate support device 10B and unloaded from the second substrate unloading part Ex2 to the second component mounting device M2.

Figure 34A:
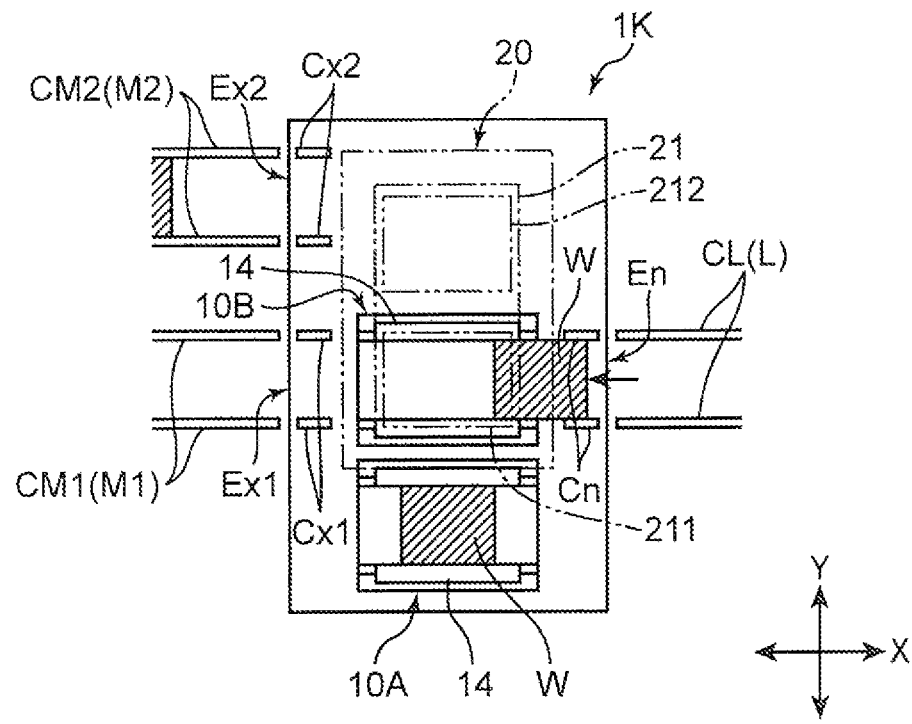
FIG. 34 is a schematic plan view explaining the printing operation of the screen printing apparatus in accordance with the control of the control machine (FIGS. 34A and 34B show the printing operation in accordance with a time series).

When the reception of the substrate W by the first substrate support device 10A is completed and the sending of the preceding substrate W is completed, the first substrate support device 10A is placed at the standby position and the second substrate support device 10B is placed at the receiving position, as shown in FIG. 34A. In the foregoing state, the substrate W is received by the second substrate support device 10B.

Figure 34B:
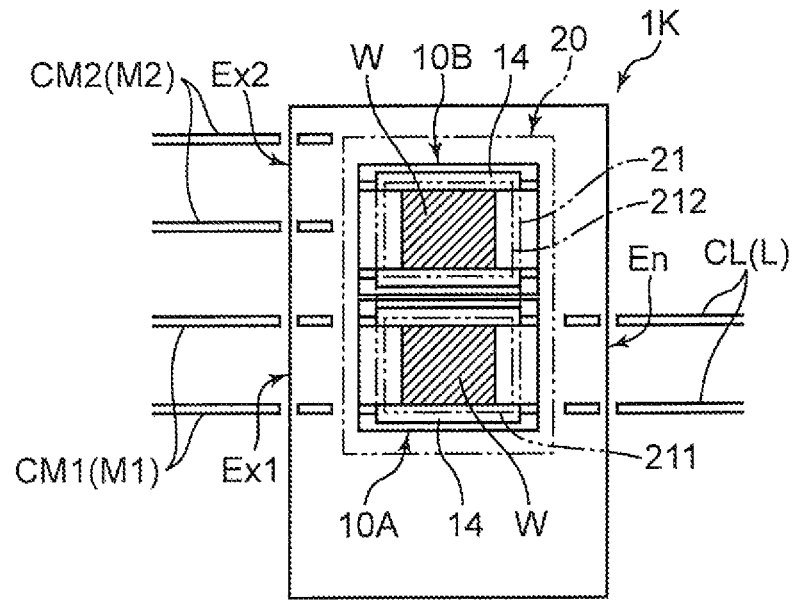

When the reception of the substrate W by the second substrate support device 10B is completed, the second substrate support device 10B is placed at a lower position of the mask 21 (second pattern 212). The first substrate support device 10A is placed at a lower position of the mask 21 (first pattern 211). As shown in FIG. 34B, the substrate W of the first substrate support device 10A is thus positioned relative to the first pattern 211 and the substrate W of the second substrate support device 10B is positioned relative to the second pattern 212, respectively. The imaging unit 60 performs capturing of the respective signs. Position corrections of the respective substrates are performed based on the calculated correction amounts. After the above operations, the respective substrates W are overlapped with the mask 21 and printings of both substrates W are performed substantially at the same time. Capturing of the respective signs by the imaging unit 60 is simultaneously performed for the respective substrates W. That is, the imaging unit 60 continuously captures the signs of the respective substrates W and the signs of the mask 21 (printing patterns 211, 212) by continuously moving between the substrate W of the first substrate support device 10A and the mask 21 (first pattern 211), and between the substrate W of the second substrate support device 10B and the mask 21 (second pattern 212).

When the printing is completed, the first substrate support device 10A is placed at the working position and the printed substrate W is sent to the first substrate unloading part Ex1 and the subsequent substrate W is simultaneously transferred from the substrate unloading part Ex to the first substrate support device 10A. Simultaneously the second substrate support device 10B is placed at the sending position so that the printed substrate W is sent to the second substrate unloading part Ex2 (see FIG. 33).

Subsequently, the printing of the substrate W and the unloading of the printed substrate W are performed substantially in parallel regarding the respective substrate support devices 10A, 10B.

According to this kind of printing apparatus 1K of the twelfth embodiment, since the printing apparatus 1K can independently receive the substrate W from the upstream-side device of a single system (loader L), and the printing apparatus 1K can perform printing thereof and unload the printed substrate W to the downstream-side device of a dual system (component mounting devices M1, M2), it is possible to yield the same operation and effect as the printing apparatus 1H (see FIG. 29) of the ninth embodiment of being able to downsize the manufacturing line despite the printing apparatus 1 being disposed between the upstream-side device of a dual system and the downstream-side device of a single system. In addition, since the printing apparatus 1K is configured, as described above, such that the substrate W is received by the two substrate support devices 10A, 10B, simultaneously subject to printing and then unloaded, as well as configured such that the printing of the substrate W and the unloading of the printed substrate W are performed substantially in parallel regarding the respective substrate support devices 10A, 10B, there is an advantage in that the throughput of the substrate W can be improved in comparison to the printing apparatus 1H of the ninth embodiment which transfers one substrate W at a time into the apparatus and then prints and unloads the substrate W.

The thirteenth embodiment of the screen printing apparatus according to the present disclosure is now explained with reference to FIGS. 35 and 36.

Figure 35:
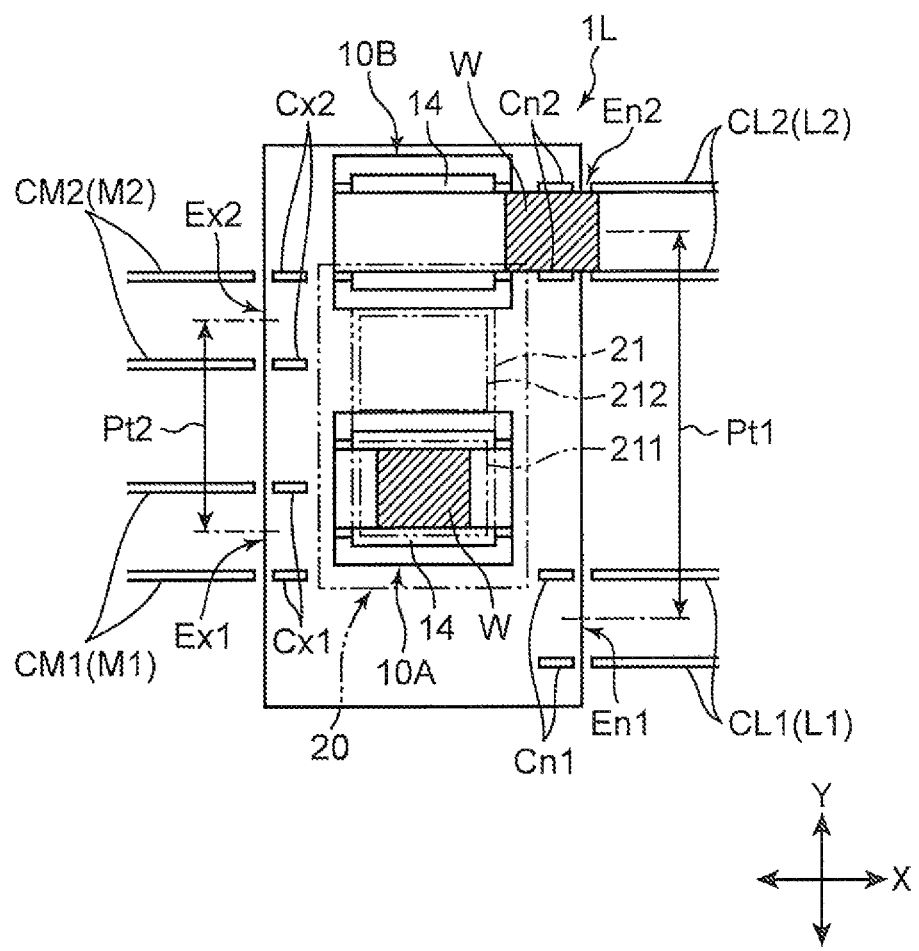
FIG. 35 is a schematic plan view showing the thirteenth embodiment of the screen printing apparatus according to the present disclosure.

FIG. 35 is a schematic plan view showing the screen printing apparatus 1L (hereinafter abbreviated as the "printing apparatus 1L") according to the thirteenth embodiment. The printing apparatus 1L according to the thirteenth embodiment is a modified example of the printing apparatus 1J of the eleventh embodiment, and is configured differently from the printing apparatus 1J of the eleventh embodiment with respect to the following points.

That is, the printing apparatus 1L includes two substrate unloading parts Ex1, Ex2 (first substrate unloading part Ex1 and second substrate unloading part Ex2) as the substrate unloading parts. In the illustrated example, the printing apparatus 1L is configured so that it can load the substrate W, which is sent out from the first loader L1, from the first substrate loading part Ent into the apparatus and load the substrate W, which is sent out from the second loader L2, from the second substrate loading part En2 into the apparatus, respectively, and unload the printed substrate W from the first substrate unloading part Ex1 to the first component mounting device M1 and unload the printed substrate W from the printed second substrate unloading part Ex2 to the second component mounting device M2, respectively.

The respective substrate unloading parts Ex1, Ex2 are provided at a position between both substrate loading parts En1, En2 in the Y axis direction. That is, the substrate unloading parts Ex1, Ex2 are provided at an array pitch Pt2 which is different from an array pitch Pt1 of the substrate loading parts En1, En2 (Pt2<Pt1).

In addition, the first substrate support device 10A moves across the first receiving position and a first sending position where the printed substrate W can be unloaded from the first substrate unloading part Ex1. The second substrate support device 10B is provided movably between the second receiving position and a second sending position where the printed substrate W can be unloaded from the second substrate unloading part Ex2. The printing apparatus 1L differs from the configuration of the printing apparatus 1J of the eleventh embodiment with respect to the foregoing points.

With the printing apparatus 1L, as shown in the Figure, the first substrate support device 10A is placed at the lower position of the mask 21, and the substrate W is overlapped with the mask 21 and the substrate W is subjected to printing in a state where the substrate W supported by the first substrate support device 10A is positioned relative to the first pattern 211.

Figure 36A:
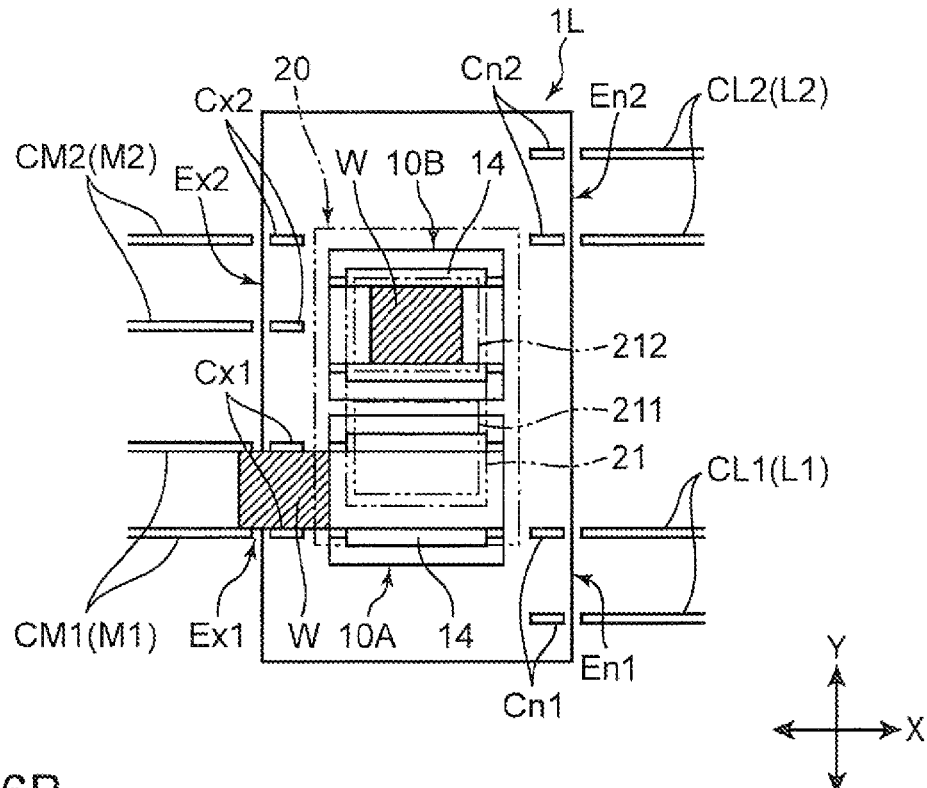
FIG. 36 is a schematic plan view explaining the printing operation of the screen printing apparatus in accordance with the control of the control machine (FIGS. 36A and 36B show the printing operation in accordance with a time series).

When the printing is finished, as shown in FIG. 36A, the first substrate support device 10A is placed at the first sending position. The printed substrate W is sent from the first substrate support device 10A and unloaded from the first substrate unloading part Ex1 to the first component mounting device M1.

Figure 36B:
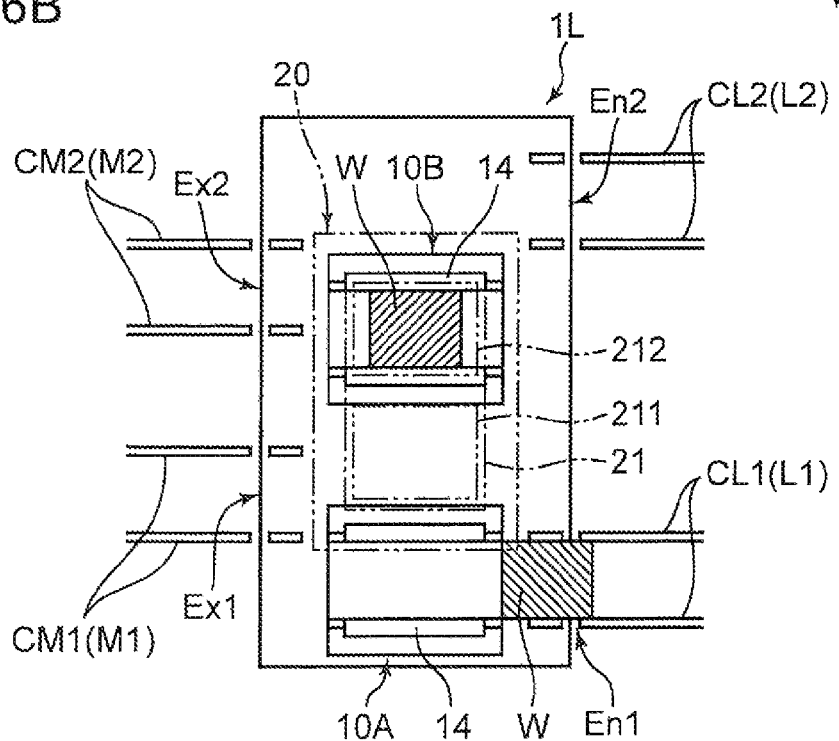

When the unloading of the substrate W is completed, as shown in FIG. 36B, the first substrate support device 10A is placed at the first receiving position, and the substrate W loaded from the first substrate loading part Ent is received on the conveyer pair 12 of the first substrate support device 10A and then clamped.

Subsequently, the first substrate support device 10A sequentially moves from the first receiving position to the lower position of the mask 21 (first pattern 211) and the first sending position. The printing of the substrate W supported by the first substrate support device 10A, the unloading of the substrate W and the receiving operation of the subsequent substrate W are sequentially performed. With a given time difference for the foregoing operation, the second substrate support device 10B sequentially moves from the second receiving position to the lower position of the mask 21 (second pattern 212) and the sending position. The printing of the substrate W supported by the second substrate support device 10B (FIG. 36B), the unloading of the substrate W and the receiving operation of the subsequent substrate W (FIG. 35) are sequentially performed.

According to the printing apparatus 1L of the thirteenth embodiment described above, the printing apparatus 1L can independently receive the substrates W from the dual system loaders L1, L2 and simultaneously perform printing on the substrates W and unload the substrates W to the conveyer pairs CM1, CM2 of the component mounting devices M1, M2 installed at a pitch (Pt2) that is different than a pitch (Pt1) of the conveyer pairs CL1, CL2 of the loaders L1, L2. Thus, according to the printing apparatus 1L, it is possible to yield the same operation and effect as the printing apparatus 1I (see FIG. 30) of the tenth embodiment of being able to downsize the manufacturing line despite the printing apparatus 1L being disposed between an upstream-side device of a dual system (loaders L1, L2) and a downstream-side device of a dual system (component mounting devices M1, M2), and the line pitch of the respective substrate transfer lines of the upstream-side device and the line pitch of the respective substrate transfer lines of the downstream apparatus are different. In addition, according to the printing apparatus 1L, since the substrates W are alternately received by the two substrate support devices 10A, 10B and simultaneously subject to printing and then unloaded as described above, there is an advantage in that the throughput of the substrate W can be improved in comparison to the printing apparatus 1I of the tenth embodiment.

Meanwhile, the screen printing apparatuses 1, 1A to 1L described above are illustrations of the preferred embodiments of the screen printing apparatus according to the present disclosure, and the specific configuration thereof may be modified as needed to the extent that such modification does not deviate from the gist of this disclosure.

For example, the specific supporting structure of the substrate W in the substrate support tables 10A, 10B, the specific holding structure of the mask 21 in the print executing parts 20A, 20B, or the specific structure of the squeegee unit 40 of the first embodiment are not necessarily limited to those of the screen printing apparatus 1 of the first embodiment, and may be modified as needed.

Moreover, in each of the first, second, sixth and seventh embodiments, while the position of the first print executing part 20A is set to align with the first receiving position and the position of the second print executing part 20B is set to align with the second receiving position, the print executing parts 20A, 20B may be disposed at a position that is closer to the sending position or farther from the sending position to the extent that they will not interfere with the substrate support table that is in the midst of sending the substrate.

Moreover, in the third embodiment, the print executing part 20 may be disposed at a position that is closer to the second receiving position or at a position that is closer to the second receiving position than the sending position. Moreover, in each of the fourth and fifth embodiments, the print executing part 20 may be disposed at a position that is closer to the first sending position or at a position that is closer to the first sending position than the receiving position.

Moreover, in the first to sixth embodiments, the first substrate support table 10A and the second substrate support table 10B were respectively supported movably on the common rail 3, but they may also be movably supported on separate rails, respectively.

Moreover, in each of the second, third, and fifth to thirteenth embodiments, conveyer pairs Cn (or Cn1, Cn2) and Cx (or Cx1, Cx2) are provided on the foundation 2, and the positions of the substrate loading part En and the substrate unloading part Ex are fixed. However, it is also possible to directly load and unload the substrates W with the substrate support tables 10A, 10B or the substrate support table 10 without installing the foregoing conveyer pairs. In the foregoing case, the flexibility of disposing the loader L (or L1, L2) and the component mounting device M (or M1, M2) can be improved. In addition, the position (substrate loading position) of the substrate loading part En (or En1, En2) and the position (substrate unloading position) of the substrate unloading part Ex (or Ex1, Ex2) are respectively set according to the print execution program or the like provided from the host computer in accordance with the arrangement of the loader L (or L1, L2) and the component mounting device M (or M1, M2) that was decided in advance.

Moreover, in each of the first, second and seventh embodiments, the print executing parts 20A, 20B are respectively set to align with the positions of the substrate loading parts En1, En2 with respect to the Y direction. However, in a case where the interval between the substrate loading part En1 and the substrate loading part En2 is narrow, the interference of the substrate support tables 10A, 10B can be avoided by disposing the print executing part 20A at an outside position that will be the device's front side of the substrate loading part En1, and disposing the print executing part 20B at an outside position that will be the device's back side of the substrate loading part En2, respectively.

Similarly, in the sixth embodiment, while the print executing parts 20A, 20B are respectively set to align with the positions of the substrate unloading parts Ex1, Ex2 in the Y direction, in cases where the interval between the substrate unloading part Ex1 and the substrate unloading part Ex2 is narrow, the interference of the substrate support tables 10A, 10B can be avoided by disposing the print executing part 20A at an outside position that will be the device's front side of the substrate unloading part Ex1, and disposing the print executing part 20B at an outside position that will be the device's back side of the substrate unloading part Ex2, respectively.

Moreover, in each of the first, second, and seventh embodiments, in the relationship between the conveyer pair 12 and the conveyer pair CL1 of the first substrate support table 10A, or in the relationship between the conveyer pair 12 and the conveyer pair CL2 of the second substrate support table 10B, respective arrangements of the fixed conveyer and the movable conveyer with respect to the Y direction may be the same. In the foregoing case, despite the size of the substrate W in the Y direction, changes in alignment can be maintained between the positions of the print executing part 20A and the substrate unloading part Ex1, or between the positions of the print executing part 20B and the substrate unloading part Ex2.

Moreover, the printing apparatuses 1J to 1L of the eleventh to thirteenth embodiments are configured such that printing is performed using the first pattern 211 of the two printing patterns 211, 212 of the mask 21 with respect to the substrate W supported by the first substrate support device 10A, and printing is performed using the second pattern 212 with respect to the substrate W supported by the second substrate support device 10B. However, it may also be configured that such printing is performed by arbitrarily using the two printing patterns 211, 212 on the substrate W supported by either of the substrate support devices 10A, 10B. In the foregoing case, in the case of the printing apparatus 1J of the eleventh embodiment, for instance, the second substrate support device 10B may withdraw to the position on the outside (upper side in FIG. 31) of the print executing part 20 when the first substrate support device 10A is positioned at the second pattern 212. The first substrate support device 10A may withdraw to the position on the outside (lower side in FIG. 31) of the print executing part 20 when the second substrate support device 10B is positioned at the first pattern 211. The same applies to the other printing apparatuses 1K, 1L.

Also, with the printing apparatus 1J of the eleventh embodiment and the printing apparatus 1L of the thirteenth embodiment, as with the printing apparatus 1K of the twelfth embodiment, the configuration may be such that printing is enabled simultaneously when the respective substrates W supported by both substrate support devices 10A, 10B are positioned relative to the respective printing patterns 211, 212. That is, the arrangement pitch of both printing patterns 211, 212 is increased to an extent where both substrate support devices 10A, 10B will not interfere with each other despite being positioned below the respective printing patterns 211, 212.

In addition, in the printing apparatus 1L of the thirteenth embodiment, it is also possible to reduce, as much as possible, the arrangement pitch (Pt2) of the component mounting devices M1, M2 (for instance, to be the same as or smaller than the arrangement pitch of both printing patterns 211, 212). In the foregoing case, the simultaneous implementation of printing and substrate unloading as illustrated in FIG. 36A is not possible. However, it is still possible, for example, to transfer the substrate W from the second substrate loading part En2 to the second substrate support device 10B while printing on the substrate W on the first substrate support device 10A overlapping with the printing pattern 211 and while unloading the printed substrate W on the first substrate support device 10A to the first substrate unloading part Ex1, and to transfer the substrate W from the first substrate loading part En1 to the first substrate support device 10A while printing on the substrate W on the second substrate support device 10B overlapping with the printing pattern 212 and while unloading the printed substrate W on the second substrate support device 10B from the second substrate unloading part Ex2. That is, there is an advantage in that loading the substrate can be performed while printing or while unloading the printed substrate W, so that the throughput of the substrate W can be increased.

The disclosure described above can be summarized as follows.

The screen printing apparatus according to one aspect of the present disclosure comprises: a print executing part positioned between a substrate loading position which enables loading of a substrate, and a substrate unloading position which enables unloading of a printed substrate, both of which are juxtaposed in a certain direction, the print executing part being configured performing screen printing to a substrate; substrate support means that receives a substrate loaded from the substrate loading position, supports the substrate so that the print executing part enables to perform the printing on the substrate, and unloads the printed substrate from the substrate unloading position; and the control means that controls the substrate support means, wherein the substrate support means comprises first substrate support means and second substrate support means which are respectively juxtaposed movably in a Y axis direction which is orthogonal to an X axis direction under the presumption that the X axis is defined as the certain direction. The first substrate support means and second substrate support means have a common area in which movable areas of the first and second substrate support means partially overlap, wherein the control means executes one of the operational controls: a first operational control in which the first substrate support means and the second substrate support means receive a substrate from a first substrate loading position and a second substrate loading position which are respectively predetermined as the substrate loading position at positions which are mutually different in the Y axis direction and which are outside of the common area and the first substrate support means and the second substrate support means unload a print-processed substrate from the substrate unloading position positioned within the common area; a second operational control in which the first substrate support means and the second substrate support means receive a substrate from the substrate loading position positioned within the common area and the first substrate support means and the second substrate support means unload a print-processed substrate from a first substrate unloading position and a second substrate unloading position which are respectively predetermined as the substrate unloading position at positions which are mutually different in the Y axis direction and which are outside of the common area; and a third operational control in which the first substrate support means and the second substrate means receive a substrate from a first substrate loading position and a second substrate loading position which are respectively predetermined as the substrate loading position at positions which are mutually different in the Y axis direction and which are positioned within the common area and the first substrate support means and the second substrate support means unload a print-processed substrate from a first substrate unloading position and a second substrate unloading position which are respectively predetermined as the substrate unloading position at positions which are mutually different in the Y axis direction and which are positioned within the common area, and wherein the print executing part is placed at a position at which the print executing part enables performing of screen printing on the substrate supported by each of the substrate support means.

According to the foregoing screen printing apparatus, it is enable to solely install the screen printing apparatus between a device of a single system and a device of a dual system, or between an upstream-side device of a dual system and a downstream-side device of a dual system without incidental equipment such as a sorting device, and perform printing to a substrate that is transferred from the upstream side and unload the substrate to the downstream side.

In the foregoing screen printing apparatus, the first substrate support means and the second substrate support means respectively comprise a pair of conveyers extending parallel to each other in the X axis direction and configured to receive a substrate loaded from the substrate loading position and to unload a printed substrate from the substrate unloading position, and conveyer width variable means capable of changing an interval between the conveyers, and the conveyer width variable means changes the interval between the conveyers by displacing, with conveyers on one side which are mutually adjacent among the pairs of conveyers of respective substrate support means as a reference, conveyers on the other side in the Y axis direction.

According to the foregoing configuration, realized is a configuration that contributes to the improvement in the throughput and the downsizing of the screen printing apparatus in relation to the device to be disposed downstream of the screen printing apparatus.

Moreover, the screen printing apparatus according to another aspect of the present disclosure comprises: a print executing part positioned between a substrate loading position which enables loading of a substrate, and a substrate unloading position which enables unloading of a printed substrate, both of which are juxtaposing in a certain direction, the print executing part being configured to perform screen printing to a substrate; and substrate support means that receives a substrate loaded from the substrate loading position, supports the substrate so that the print executing part enables performing of the printing on the substrate, and unloads the printed substrate from the substrate unloading position, wherein a first substrate loading position and a second substrate loading position, both of which are aligned in a Y axis direction which is orthogonal to an X axis direction under the presumption that the X axis is defined as the certain direction, are defined as the substrate loading position, or the substrate unloading position is defined at a position between the first and second substrate loading positions in the Y axis direction, wherein the substrate support means comprises first substrate support means and second substrate support means which are respectively movably juxtaposed in a Y axis direction which is orthogonal to an X axis direction under the presumption that the X axis is defined as the certain direction, wherein the substrate support means comprises first substrate support means and second substrate support means which are respectively juxtaposed movably in a Y axis direction, the first substrate support means and second substrate support means have a common area in which movable areas of the first and second substrate support means partially overlap, wherein the first substrate support means and the second substrate support means are placed such that, in a state where one of the first and second substrate support means is placed at a position where the substrate support means is allowed to receive the substrate loaded from the substrate loading position, or in a state where the one of the first and second substrate support means is placed at a position where the substrate support means is allowed to unload a printed substrate from the substrate unloading position, the one substrate support means is positioned within the common area and the other substrate support means is placed at a position where the other substrate support means avoids the one substrate support means in the movable area, and wherein the print executing part is placed at a position at which the print executing part enables performing of screen printing on the substrate supported by each of the substrate support means.

According to the foregoing screen printing apparatus, since two printing processes using two substrate support tables can be performed simultaneously in parallel, printing can be performed efficiently. In addition, a screen printing apparatus in which at least either the upstream-side device or the downstream apparatus is a dual system, it can independently receive a substrate from the upstream-side device, perform printing on the substrate, and unload the substrate to the downstream apparatus without having to use incidental equipment (switching device) as with conventional screen printing apparatuses.

Moreover, the screen printing apparatus according to yet another aspect of the present disclosure comprises: a print executing part positioned between a substrate loading position and a substrate unloading position, both of which are juxtaposing in a certain direction, the print executing part being configured to perform screen printing to a substrate, and substrate support means that receives a substrate loaded from the substrate loading position, supports the substrate so that the print executing part enables the printing on the substrate, and unloads the printed substrate from the substrate unloading position; wherein a first substrate loading position and a second substrate loading position, both of which are aligned in a Y axis direction which is orthogonal to an X axis direction under the presumption that the X axis is defined as the certain direction, are defined as the substrate loading position, and the substrate unloading position is defined at a position between the first and second substrate loading positions in the Y axis direction, wherein the substrate support means comprises first substrate support means and second substrate support means which are respectively provided movably in the Y axis direction, the first substrate support means moving, within a movable area thereof, between a first receiving position where a substrate loaded from the first substrate loading position can be received and a sending position where a substrate can be unloaded from the substrate unloading position, the second substrate support means moving, within a movable area thereof, between a second receiving position where a substrate loaded from the second substrate loading position can be received and the sending position, wherein the first substrate support means and the second substrate support means being configured such that, when one of the first and second substrate support means is positioned within a common area in which the movable areas of the first and second substrate support means partially overlap, the other substrate support means is placed at a position where the other substrate support means avoids the one substrate support means in the movable area, and wherein the print executing part is placed at a position at which the print executing part enables screen printing on the substrate supported by each of the substrate support means.

With the foregoing screen printing apparatus, the substrate loaded from the first substrate loading position is received (accepted) by the first substrate support means placed at the first receiving position, and the substrate is subjected to printing in a state of being supported by the second substrate support means. In addition, the printed substrate is unloaded from the substrate unloading position by sending the substrate from the relevant means in a state where the first substrate support means is placed at the sending position within the common area. Meanwhile, the substrate loaded from the second substrate loading position is received by the second substrate support means which is placed at the second receiving position that is a position where the second substrate support means enables avoiding the first substrate support means positioned at the sending position within the common area in the movable area, and the substrate is subjected to printing in a state of being supported by the second substrate support means. In addition, the printed substrate is unloaded from the substrate unloading position by sending the substrate from the relevant means in a state where the second substrate support means is moved to the movable area and disposed at the sending position within the common area. During the operation, the first substrate support means is placed, within its movable area, at the second receiving position that is a position where the first substrate support means enables avoiding the second substrate support means positioned at the sending position within the common area. That is, according to the foregoing screen printing apparatus, since two printing processes using two substrate support means can be performed simultaneously in parallel, printing can be performed efficiently. In addition, a screen printing apparatus can independently receive a substrate from an upstream-side device of a dual system, perform printing on the substrate, and unload the substrate to a downstream-side device of a single system without having to use incidental equipment (switching device) as with conventional screen printing apparatuses.

In the foregoing, a screen printing apparatus is disposed so as to perform printing on a substrate supported by each of the substrate support means placed at the sending position.

With the foregoing screen printing apparatus substrates loaded from the first and second substrate loading positions (upstream-side device of a dual system) are subjected to printing with a common print executing part, and then unloaded.

The print executing part the print executing part may consist of a first print executing part for performing printing on the substrate supported by the first substrate support means placed at the first receiving position, and a second print executing part that performs printing on the substrate supported by the second substrate support means placed at the second receiving position.

With the foregoing screen printing apparatus, the substrate at each substrate loading position where the substrate was loaded is subjected to printing by the different print executing part, and then unloaded. Thus, it is possible to print different patterns on the respective substrates loaded from the upstream-side device of a dual system, and simultaneously unload the substrates.

Moreover, the screen printing apparatus according to yet another aspect of the present disclosure comprises: a print executing part positioned between a substrate loading position and a substrate unloading position, both of which are juxtaposing in a certain direction, the print executing part being configured to perform screen printing to a substrate; and substrate support means that receives a substrate loaded from the substrate loading position, supports the substrate so that the print executing part enables the printing on the substrate, and unloads the printed substrate from the substrate unloading position; wherein a first substrate unloading position and a second substrate unloading position, both of which are aligned in a Y axis direction which is orthogonal to an X axis direction under the presumption that the X axis is defined as the certain direction, are defined as the substrate unloading position, and the substrate loading position is defined at a position between the first and second substrate unloading positions in the Y axis direction, wherein the substrate support means comprises first substrate support means and second substrate support means which are respectively provided movably in the Y axis direction, the first substrate support means moving, within a movable area thereof, between a receiving position where a substrate loaded from the substrate loading position can be received and a first sending position where a substrate can be unloaded from the first substrate unloading position, the second substrate support means moving, within a movable area thereof, between the receiving position and a second sending position where a substrate can be unloaded from the second substrate unloading position, wherein the first substrate support means and the second substrate support means are configured such that, when one of the first and second substrate support means is positioned within a common area in which the movable areas of the first and second substrate support means partially overlap, the other substrate support means is placed at a position where the other substrate support means avoids the one substrate support means in the movable area, and wherein the print executing part is placed at a position at which the print executing part enables screen printing on the substrate supported by each of the substrate support means.

With the foregoing screen printing apparatus, the substrate loaded from the substrate loading position is received by the first substrate support means or the second substrate support means placed at a receiving position within the common area in which the movable area of the first substrate support means and the movable area of the second substrate support means partially overlap, and the substrate is subjected to printing in a state of being supported on the table. In addition, when the substrate is received by the first substrate support means and printing is performed, the printed substrate is unloaded from the first substrate unloading position by sending the substrate from the first substrate support means in a state where the first substrate support means is placed at the first sending position. Meanwhile, when the substrate is received by the second substrate support means and printing is performed, the printed substrate is unloaded from the second substrate unloading position by sending the substrate from the second substrate support means in a state where the second substrate support means is placed at the second sending position. That is, with the foregoing screen printing apparatus, when the substrate is received by the first substrate support means placed at a receiving position within the common area, the second substrate support means supporting the printed substrate is positioned at the second sending position where the second substrate supporting means avoids the first substrate support means within the movable area, and when the substrate is received by the second substrate support means placed at a receiving position within the common area, the first substrate support means supporting the printed substrate is positioned at the first sending position where the first substrate supporting means avoids the second substrate support means within the movable area. According to the foregoing screen printing apparatus, since two printing processes using two substrate support means can be performed simultaneously in parallel, printing can be performed efficiently. In addition, a screen printing apparatus can independently receive a substrate from an upstream-side device of a single system, simultaneously perform printing on the substrate, and unload the substrate to a downstream-side device of a dual system without having to use incidental equipment (switching device) as with conventional screen printing apparatuses.

In the foregoing screen printing apparatus, the print executing parts are disposed so as to perform printing on a substrate supported by each of the substrate support means placed at the receiving position.

With the foregoing screen printing apparatus, substrates loaded from the substrate loading positions are subjected to printing with a common print executing part, and then unloaded from the first or second substrate unloading position.

The print executing part may consist of a first print executing part for performing printing on the substrate supported by the first substrate support means placed at the first sending position, and a second print executing part that performs printing on the substrate supported by the second substrate support means placed at the second sending position.

With the foregoing screen printing apparatus, the substrates are subjected to printing with different print executing parts according to the substrate loading position where the substrate was unloaded. Thus, it is possible to print different patterns on the respective substrates unloaded from the upstream-side device of a single system, and simultaneously unload the substrates to the downstream-side device of a dual system.

In the foregoing screen printing apparatus, preferably, the substrate support means comprises a conveyer that receives a substrate loaded from the substrate loading position, and unloads a printed substrate from the substrate unloading position, and clamp means provided movably in a substrate transfer direction of a substrate W by the conveyer. The clamp means is configured to clamp the substrate with the substrate lifted from the conveyer so that the print executing parts enables printing on the substrate, wherein a position on the substrate loading position side of the conveyer is a substrate standby position, and wherein a position on the substrate unloading position side is a print executing position, and the clamp means is configured to clamp a substrate on the conveyer at the substrate standby position, to move the substrate to the print executing position, to release the clamped state at the print executing position after printing is performed to the substrate, thereby returning the substrate on the conveyer, and thereafter to move a subsequent substrate to the substrate standby position in order to clamp the subsequent substrate.

According to the foregoing configuration, since it is possible to clamp and place a subsequent substrate at the print executing position while a preceding substrate that was printed is being unloaded from the substrate unloading position by driving the conveyer, the printing of the subsequent substrate can be started more quickly after the preceding substrate is printed.

Moreover, the screen printing apparatus according to yet another aspect of the present disclosure comprises: a print executing part positioned between a substrate loading position and a substrate unloading position, both of which are juxtaposed in a certain direction, the print executing part being configured to perform screen printing to a substrate; substrate support means that receives a substrate loaded from the substrate loading position, supports the substrate so that the print executing part enables the printing on the substrate, and unloads the printed substrate from the substrate unloading position; and the control means that drive-controls the substrate support means, wherein a first substrate loading position and a second substrate loading position, both of which are aligned in a Y axis direction which is orthogonal to an X axis direction under the presumption that the X axis is defined as the certain direction, are defined as the substrate loading position, wherein the print executing part includes one screen mask on which two printing patterns are aligned in the Y axis direction, wherein the substrate support means is provided movably in the Y axis direction across a first receiving position where a substrate loaded from the first substrate loading position can be received, a second receiving position where a substrate loaded from the second substrate loading position can be received, and a sending position where a substrate can be sent to the substrate unloading, and wherein the control means places the substrate support means at the first receiving position or the second receiving position in order to receive substrates loaded from the first and second substrate loading positions, the control means moves the substrate support means to the print executing part so that printing is performed on the received substrates using one of the two printing patterns of the screen mask, and the control means places the substrate support means at the sending position in order to send the printed substrate to the substrate unloading position.

With the foregoing screen printing apparatus, by moving the substrate support means at the first or second receiving position, the substrate is received by the substrate support means alternatively from the first or second substrate unloading position, and printing is performed in a state where the substrate is supported by the substrate support means. During the operation, by moving the substrate support means to the print executing part so that printing is performed by using one of the two printing patterns of the screen mask, a pattern according to the type or substrate or the like is printed on the substrate. In addition, the printed substrate is unloaded from the substrate unloading position by placing the substrate support means at the sending position and sending the substrate from the substrate support means. That is, according to the foregoing screen printing apparatus, in addition to being able to perform printing using a screen mask including two printing patterns as with a conventional apparatus (a screen printing apparatus disclosed in Japanese Patent Laid-Open Publication No. 2008-272964), for instance, even in cases where the screen printing apparatus is disposed between an upstream-side device of a dual system and a downstream-side device of a single system, the screen printing apparatus can independently receive a substrate from an upstream-side device of a dual system, simultaneously perform printing on the substrate, and unload the substrate to a downstream-side device of single system without having to use incidental equipment (switching device) as with conventional screen printing apparatuses.

There may also be a configuration wherein a first substrate unloading position and a second substrate unloading position, both of which are aligned in the Y axis direction at a pitch that is different from an array pitch of the first and second substrate loading positions, are defined as the substrate unloading position, wherein the substrate support means is movably provided to a first sending position where a substrate from the first substrate unloading position can be sent and a second sending position where a substrate from the second substrate unloading position can be sent, both of which are defined as the sending position, and wherein the control means places the substrate support means at the first sending position or the second sending position in order to unload a printed substrate.

With the configuration of the foregoing screen printing apparatus, printing is performed while the substrates are received from the first and second substrate loading positions, and the substrates are unloaded from the first and second substrate unloading positions provided at a pitch that is different from that of the first and second substrate loading positions. Thus, according to the foregoing screen printing apparatus, even in cases where the screen printing apparatus is installed between an upstream-side device of a dual system and a downstream-side device of a dual system and the line pitch of the respective substrate transfer lines of the upstream-side device and the line pitch of the respective substrate transfer lines of the downstream apparatus are different, the screen printing apparatus can independently receive a substrate from the upstream-side device, the screen printing apparatus can simultaneously perform printing on the substrate, and the screen printing apparatus can unload the substrate to the downstream apparatus without having to use incidental equipment (relay device) as with conventional screen printing apparatuses.

Moreover, the screen printing apparatus according to yet another aspect of the present disclosure comprises: a print executing part positioned between a substrate loading position and a substrate unloading position, both of which are juxtaposed in a certain direction, the print executing part being configured to perform screen printing to a substrate; substrate support means that receives a substrate loaded from the substrate loading position, supports the substrate so that the print executing part enables the printing on the substrate, and unloads the printed substrate from the substrate unloading position; and the control means that drive-controls the substrate support means, wherein a first substrate unloading position and a second substrate unloading position, both of which are aligned in a Y axis direction which is orthogonal to an X axis direction under the presumption that the X axis is defined as the certain direction, are defined as the substrate unloading position, wherein the print executing part includes one screen mask on which two printing patterns are aligned in the Y axis direction, wherein the substrate support means is movably provided movably in the Y axis direction across a receiving position where a substrate loaded from the substrate loading position can be received, a first sending position where a substrate from the first substrate unloading position can be sent, and a second sending position where a substrate from the second substrate unloading position can be sent, and wherein the control means places the substrate support means at the receiving position that receives a substrate loaded from the substrate loading position, the control means places the substrate support means to the print executing part so that printing is performed on the received substrate using one of the two printing patterns of the screen mask, and the control means places the substrate support means at the first sending position or the second sending position in order to unload the printed substrate from either the first or second substrate unloading position.

With the foregoing screen printing apparatus, by placing the substrate support means at the receiving position, the substrate is received by the substrate support member, and printing is performed in a state where the substrate is supported by the substrate support means. During the operation, by moving the substrate support means to the print executing part so that printing is performed by using one of the two printing patterns of the screen mask, a pattern according to the type or substrate or the like is printed on the substrate. In addition, the printed substrate is selectively unloaded from the first or second substrate unloading position by sending the substrate from the substrate support means in a state where the substrate support means is placed at the first or second sending position. According to the foregoing screen printing apparatus, in addition to being able to perform printing using a screen mask including two printing patterns as with a conventional apparatus, even in cases where the screen printing apparatus is disposed between an upstream-side device of a single system and a downstream-side device of a dual system, for instance, the screen printing apparatus can independently receive a substrate from an upstream-side device of a single system, simultaneously perform printing on the substrate, and unload the substrate to a downstream-side device of a dual system without having to use incidental equipment (sorting device) as with conventional screen printing apparatuses.

Moreover, the screen printing apparatus according to yet another aspect of the present disclosure comprises: a print executing part positioned between a substrate loading position and a substrate unloading position, both of which are juxtaposed in a certain direction, the print executing part being configured to perform screen printing to a substrate; substrate support means that receives a substrate loaded from the substrate loading position, supports the substrate so that the print executing part enables the printing on the substrate, and unloads the printed substrate from the substrate unloading position; and the control means that drive-controls the substrate support means, wherein a first substrate loading position and a second substrate loading position, both of which are aligned in a Y axis direction which is orthogonal to an X axis direction under the presumption that the X axis is defined as the certain direction, are defined as the substrate loading position, wherein the substrate support means includes first substrate support means and second substrate support means which are respectively movably provided in the Y axis direction, the first substrate support means moving between a first receiving position where a substrate loaded from the first substrate loading position can be received and a sending position where a substrate can be sent to the substrate unloading position, and the second substrate support means moving between a second receiving position where a substrate loaded from the second substrate loading position can be received and the sending position, wherein the print executing part includes one screen mask on which two printing patterns are aligned in the Y axis direction, and wherein the control means places the first substrate support means at the first receiving position in order to receive a substrate loaded from the first substrate loading position, the control means moves the first substrate support means to the print executing part so that printing is performed to the received substrate using one of the two printing patterns of the screen mask, and the control means moves the first substrate support means at the sending position in order to send the printed substrate to the substrate unloading position, and the control means moves the second substrate support means at the second receiving position in order to receive a substrate loaded from the second substrate loading position, the control means places the second substrate support means to the print executing part so that printing is performed to the received substrate using one of the two printing patterns of the screen mask, and the control means places the second substrate support means at the sending position in order to send the printed substrate to the substrate unloading position.

With the foregoing screen printing apparatus, the substrate loaded from the first substrate loading position is received by the first substrate support means placed at the first receiving position, and printing is performed in a state where the substrate is supported by the first substrate support means. During the operation, by moving the first substrate support means to the print executing part so that printing is performed by using one of the two printing patterns of the screen mask, a pattern according to the type or substrate or the like is printed on the substrate. In addition, the printed substrate is unloaded from the substrate unloading position as a result of the first substrate support means being disposed at the sending position and the substrate being sent from the first substrate support means. Meanwhile, the substrate loaded from the second substrate loading position is received by the second substrate support means placed at the second receiving position, and printing is performed in a state where the substrate is supported by the second substrate support means. During the operation, by moving the substrate support means to the print executing part so that printing is performed by using one of the two printing patterns of the screen mask in the same way, a pattern according to the type or substrate or the like is printed on the substrate. In addition, the printed substrate is unloaded from the substrate unloading position by placing the second substrate support means at the sending position and sending the substrate from the second substrate support means. That is, according to the foregoing screen printing apparatus, in addition to being able to perform printing using a screen mask including two printing patterns as with a conventional apparatus, even in cases where the screen printing apparatus is disposed between an upstream-side device of a dual system and a downstream-side device of a single system, for instance, the screen printing apparatus can independently receive a substrate from an upstream-side device of a dual system, simultaneously perform printing on the substrate, and unload the substrate to a downstream-side device of a single system without having to use incidental equipment (switching device) as with conventional screen printing apparatuses.

There may be a configuration wherein a first substrate unloading position and a second substrate unloading position, both of which are aligned in the Y axis direction at a pitch that is different from an array pitch of the first and second substrate loading positions, are defined as the substrate unloading position, wherein the first substrate support means is movably provided to a first sending position as the sending position where a substrate can be sent to the first substrate unloading position, the second substrate support means is movably provided to a second sending position as the sending position where a substrate can be sent to the second substrate unloading part, and wherein the control means places the first substrate support means at the first sending position in order to send a printed substrate supported by the first substrate support means to the first substrate unloading position, and the control means places the second substrate support means at the second sending position in order to send a printed substrate supported by the second substrate support means to the second substrate unloading position.

With the configuration of the foregoing screen printing apparatus, while the printed substrate supported by the first substrate support means is sent to the first substrate unloading position as a result of the first substrate support means being disposed at the first sending position, the printed substrate supported by the second substrate support means is sent to the second substrate unloading position as a result of the second substrate support means being disposed at the second sending position. Consequently, the printed substrates are unloaded from the first and second substrate unloading positions provided at a pitch that is different from that of the first and second substrate loading positions. Thus, according to the foregoing screen printing apparatus, even in cases where the screen printing apparatus is disposed between an upstream-side device of a dual system and a downstream-side device of a dual system and the line pitch of the respective substrate transfer lines of the upstream-side device and the line pitch of the respective substrate transfer lines of the downstream apparatus are different, the screen printing apparatus can independently receive a substrate from the upstream-side device, simultaneously perform printing on the substrate, and unload the substrate to the downstream apparatus without having to use incidental equipment (relay device) as with conventional screen printing apparatuses.

Moreover, the screen printing apparatus according to yet another aspect of the present disclosure comprises: a print executing part positioned between a substrate loading position and a substrate unloading position, both of which are juxtaposed in a certain direction, the print executing part being configured to perform screen printing to a substrate; substrate support means that receives a substrate loaded from the substrate loading position, supports the substrate so that the print executing part enables the printing on the substrate, and unloads the printed substrate from the substrate unloading position; and the control means that drive-controls the substrate support means, wherein a first substrate unloading position and a second substrate unloading position, both of which are aligned in a Y axis direction which is orthogonal to an X axis direction under the presumption that the X axis is defined as the certain direction, are defined as the substrate unloading position, wherein the substrate support means comprises first substrate support means and second substrate support means which are respectively movably provided in the Y axis direction, the first substrate support means moving between a receiving position where a substrate loaded from the substrate loading position can be received and a first sending position where a substrate can be sent to the first substrate unloading position, and the second substrate support means moving between the receiving position and a second sending position where a substrate can be sent to the second substrate unloading position, wherein the print executing part includes one screen mask on which two printing patterns are aligned in the Y axis direction, and wherein the control means places the first substrate support means at the receiving position in order to receive a substrate loaded from the substrate loading position, the control means places the first substrate support means to the print executing part so that printing is performed on the received substrate using one of the two printing patterns of the screen mask, and the control means places the first substrate support means at the first sending position in order to send the printed substrate to the first substrate unloading position, and the control means places the second substrate support means at the receiving position in order to receive a substrate loaded from the substrate loading position, the control means places the second substrate support means to the print executing part so that printing is performed on the received substrate using one of the two printing patterns of the screen mask, and the control means places the second substrate support means at the second sending position in order to send the printed substrate to the second substrate unloading position. With the foregoing screen printing apparatus, the substrate loaded from the substrate loading position is received by the first substrate support means or the second substrate support means placed at the receiving position, and printing is performed in a state where the substrate is supported by the substrate support means. During the operation, by moving the substrate support means to the print executing part so that printing is performed by using one of the two printing patterns of the screen mask, a pattern according to the type or substrate or the like is printed on the substrate. In addition, when the substrate is received by the first substrate support means and the substrate is subjected to printing, the printed substrate is unloaded from the first substrate unloading position by sending the substrate from the first substrate support means in a state where the first substrate support means is placed at the first sending position, and when the substrate is received by the second substrate support means and the substrate is subjected to printing, the printed substrate is unloaded from the second substrate unloading position by sending the substrate from the second substrate support means in a state where the second substrate support means is placed at the second sending position. According to the foregoing screen printing apparatus, in addition to being able to perform printing using a screen mask including two printing patterns as with a conventional apparatus, for instance, even in cases where the screen printing apparatus is disposed between an upstream-side device of a single system and a downstream-side device of a dual system, the screen printing apparatus can independently receive a substrate from an upstream-side device of a single system, simultaneously perform printing on the substrate, and unload the substrate to a downstream-side device of a dual system without having to use incidental equipment (sorting device) as with conventional screen printing apparatuses.

INDUSTRIAL APPLICABILITY

As described above, the screen printing apparatus according to the present disclosure can be installed between a device of a single transfer-type and a device of a dual transfer-type or the like without incidental equipment such as a sorting device, and is useful in the field of manufacturing component mounted substrates.

The invention claimed is:

1. A screen printing apparatus comprising:
a print executing part positioned between a substrate loading position which enables loading of a substrate, and a substrate unloading position which enables unloading of a printed substrate, both of which are juxtaposed in a certain direction, the print executing part being configured to perform screen printing on the substrate;
a substrate support table receiving a substrate loaded from the substrate loading position, supporting the substrate so that the print executing part enables printing on the substrate, and unloading the printed substrate from the substrate unloading position; and
a control unit controlling the substrate support table,
the substrate support table including a first substrate support device and a second substrate support device which are respectively movably juxtaposed movably in a Y axis direction which is orthogonal to an X axis direction defined as the certain direction, the first substrate support device and the second substrate support device having a common area in which movable areas of the first and the second substrate support devices partially overlap,
the control unit executing one of operational controls including:
a first operational control in which the first substrate support device and the second substrate support device receive a substrate from a first substrate loading position and a second substrate loading position which are respectively predetermined as the substrate loading position at positions which are mutually different in the Y axis direction and which are outside of the common area and the first substrate support device and the second substrate support device unload a print-processed substrate from the substrate unloading position positioned within the common area;
a second operational control in which the first substrate support device and the second substrate support device receive a substrate from the substrate loading position positioned within the common area and the first substrate support device and the second substrate support device unload a print-processed substrate from a first substrate unloading position and a second substrate unloading position which are respectively predetermined as the substrate unloading position at positions which are mutually different in the Y axis direction and which are outside of the common area; and
a third operational control in which the first substrate support device and the second substrate support device receive a substrate from a first substrate loading position and a second substrate loading position which are respectively predetermined as the substrate loading position at positions which are mutually different in the Y axis direction and which are positioned within the common area and the first substrate support device and the second substrate support device unload a print-processed substrate from a first substrate unloading position and a second substrate unloading position which are respectively predetermined as the substrate unloading position at positions which are mutually different in the Y axis direction and which are positioned within the common area, and the print executing part being placed at a position at which the print executing part enables screen printing on the substrate supported by each of the substrate support devices.

2. The screen printing apparatus according to claim 1,
wherein the first substrate support device and the second substrate support device respectively include a pair of conveyers extending parallel to each other in the X axis direction and configured to receive a substrate loaded from the substrate loading position and to unload a printed substrate from the substrate unloading position, and a conveyer width variable mechanism for changing an interval between the conveyers, and
wherein the conveyer width variable mechanism changes the interval between the conveyers by displacing, with conveyers on one side which are mutually adjacent among the pairs of conveyers of respective substrate support tables as a reference, conveyers on the other side in the Y axis direction.

3. A screen printing apparatus comprising:
a print executing part positioned between a substrate loading position which enables loading of a substrate, and a substrate unloading position which enables unloading of a printed substrate, both of which are juxtaposed in a certain direction, the print executing part being configured to perform screen printing on a substrate; and
a substrate support table receiving a substrate loaded from the substrate loading position supporting the substrate so that the print executing part enables printing on the substrate, and unloading the printed substrate from the substrate unloading position,
a first substrate loading position and a second substrate loading position, both of which are aligned in a Y axis direction which is orthogonal to an X axis direction defined as the certain direction, defined as the substrate loading position, and the substrate unloading position being defined at a position between the first and second substrate loading positions in the Y axis direction,
the substrate support table including a first substrate support device and a second substrate support device which are respectively movably juxtaposed in the Y axis direction, the first substrate support device and the second substrate support device have a common area in which movable areas of the first and second substrate support devices partially overlap, the first substrate support device and the second substrate support device being placed such that, in a state where one of the first and second substrate support devices is placed at a position where the substrate support table is allowed to receive the substrate loaded from the substrate loading position, or in a state where the one of the first and second substrate support devices is placed at a position where the substrate support table is allowed to unload a printed substrate from the substrate unloading position, the one substrate support device is positioned within the common area and the other substrate support device is placed at a position where the other substrate support device avoids the one substrate support device in the movable area, and
the print executing part being placed at a position at which the print executing part enables screen printing on the substrate supported by each of the substrate support devices.

4. A screen printing apparatus comprising:
a print executing part positioned between a substrate loading position and a substrate unloading position, both of which are juxtaposed in a certain direction, the print executing part being configured to perform screen printing on a substrate; and a substrate support table receiving a substrate loaded from the substrate loading position, supporting the substrate so that the print executing part enables printing on the substrate, and unloading the printed substrate from the substrate unloading position;

a first substrate loading position and a second substrate loading position, both of which are aligned in a Y axis direction which is orthogonal to an X axis direction defined as the certain direction, being defined as the substrate loading position, and the substrate unloading position being defined at a position between the first and second substrate loading positions in the Y axis direction, the substrate support table including a first substrate support device and a second substrate support device which are respectively movably provided in the Y axis direction, the first substrate support device moving, within a movable area thereof, between a first receiving position where a substrate loaded from the first substrate loading position is received and a sending position where a substrate is unloaded from the substrate unloading position, the second substrate support device moving, within a movable area thereof, between a second receiving position where a substrate loaded from the second substrate loading position is received and the sending position, the first substrate support device and the second substrate support device being configured such that, when one of the first and second substrate support devices is positioned within a common area in which the movable areas of the first and second substrate support devices partially overlap, the other substrate support device is placed at a position where the other substrate support device avoids the one substrate support device in the movable area, and the print executing part being placed at a position at which the print executing part enables screen printing on the substrate supported by each of the substrate support devices.

5. The screen printing apparatus according to claim 4, wherein the print executing part is disposed so as to enable screen printing on the substrate supported by each of the substrate support devices placed at the sending position.

6. The screen printing apparatus according to claim 4, wherein the print executing part includes a first print executing part that performs printing on the substrate supported by the first substrate support device placed at the first receiving position, and a second print executing part that performs printing on the substrate supported by the second substrate support device placed at the second receiving position.

7. The screen printing apparatus according to claim 4, wherein the substrate support table includes a conveyer that receives a substrate loaded from the substrate loading position and unloads a printed substrate from the substrate unloading position, and a clamp unit movably provided in a substrate transfer direction of a substrate by the conveyer, the clamp unit is configured to clamp the substrate with the substrate lifted from the conveyer so that the print executing part enables printing on the substrate, wherein a position on the substrate loading position side of the conveyer is a substrate standby position, and wherein a position on the substrate unloading position side is a print executing position, and wherein the clamp unit is configured to clamp a substrate on the conveyer at the substrate standby position, to move the substrate to the print executing position, to release the clamped state at the print executing position after printing is performed on the substrate, thereby returning the substrate on the conveyer, and thereafter to move a subsequent substrate to the substrate standby position in order to clamp the subsequent substrate.

8. A screen printing apparatus comprising:

a print executing part positioned between a substrate loading position and a substrate unloading position, both of which are juxtaposed in a certain direction, the print executing part being configured to perform screen printing on a substrate; and a substrate support table receiving a substrate loaded from the substrate loading position, supporting the substrate so that the print executing part enables printing on the substrate, and unloading the printed substrate from the substrate unloading position;

a first substrate unloading position and a second substrate unloading position, both of which are aligned in a Y axis direction which is orthogonal to an X axis direction defined as the certain direction, being defined as the substrate unloading position, and the substrate loading position being defined at a position between the first and second substrate unloading positions in the Y axis direction, the substrate support table including a first substrate support device and a second substrate support device which are respectively movably provided in the Y axis direction, the first substrate support device moving, within a movable area thereof, between a receiving position where a substrate loaded from the substrate loading position is received and a first sending position where a substrate is unloaded from the first substrate unloading position, the second substrate support device moving, within a movable area thereof, between the receiving position and a second sending position where a substrate is unloaded from the second substrate unloading position, the first substrate support device and the second substrate support device being configured such that, when one of the first and second substrate support devices is positioned within a common area in which the movable areas of the first and second substrate support device partially overlap, the other substrate support device is placed at a position where the other substrate support device avoids the one substrate support device in the movable area, and the print executing part being placed at a position at which the print executing part enables screen printing on the substrate supported by each of the substrate support device.

9. The screen printing apparatus according to claim 8, wherein the print executing part is disposed so as to enable screen printing on the substrate supported by each of the substrate support tables placed at the receiving position.

10. The screen printing apparatus according to claim 8, wherein the print executing part includes a first print executing part that performs printing on the substrate supported by the first substrate support device placed at the first sending position, and a second print executing part that performs printing on the substrate supported by the second substrate support device placed at the second sending position.

11. A screen printing apparatus comprising:
a print executing part positioned between a substrate loading position and a substrate unloading position, both of which are juxtaposed in a certain direction, the print executing part being configured to perform screen printing on a substrate;
a substrate support table receiving a substrate loaded from the substrate loading position, supporting the substrate so that the print executing part enables to perform the printing on the substrate, and unloading the printed substrate from the substrate unloading position; and
a control unit that drive-controls the substrate support table,
the substrate support table including a first substrate support device and a second substrate support device which are respectively movably provided in a Y axis direction which is orthogonal to an X axis direction defined as the certain direction, the first substrate support device and the second substrate support device have a common area in which movable areas of the first and second substrate support devices partially overlap, under the definition of a first substrate loading position and a second substrate loading position being defined as the substrate loading position wherein the first substrate loading position and the second substrate loading position are aligned in the Y axis direction orthogonal to the X axis direction, wherein the first substrate loading position and the second substrate loading position are positioned respectively on either outer side of the common area, and wherein the substrate unloading position is defined at a position within the common area in the Y axis direction, the first substrate support device moving between a first receiving position where a substrate loaded from the first substrate loading position is received and a sending position where a substrate is sent to the substrate unloading position, and the second substrate support device moving between a second receiving position where a substrate loaded from the second substrate loading position is received and the sending position,
the print executing part including one screen mask on which two printing patterns are aligned in the Y axis direction, and the screen mask is placed at a position within the common area, and
the control unit placing the first substrate support device at the first receiving position to receive a substrate loaded from the first substrate loading position, the control unit moving the first substrate support device to the print executing part so that printing is performed on the received substrate using one of the two printing patterns of the screen mask, and at the same time, the control unit moving the second substrate support device at the second receiving position to receive a substrate loaded from the second substrate loading position, the control unit placing the first substrate support device at the sending position after printing is performed on a substrate supported by the first substrate support device, the control unit moving the printed substrate to the substrate unloading position and, after the substrate is moved, the control unit moving the second substrate support device to the print executing part so that printing is performed on the substrate received at the second receiving position using one of the two printing patterns of the screen mask, and at the same time, the control unit moving the first substrate support device at the first receiving position for receiving a substrate loaded from the first substrate loading position, the control unit placing the second substrate support device at the sending position after printing is performed on a substrate supported by the second substrate support device and the control unit moving the printed substrate to the substrate unloading position, whereby printing is alternately performed on the substrates loaded from the substrate loading positions.

12. A screen printing apparatus, comprising:
a print executing part positioned between a substrate loading position and a substrate unloading position, both of which are juxtaposed in a certain direction, the print executing part being configured to perform screen printing on a substrate;
a substrate support table receiving a substrate loaded from the substrate loading position, supporting the substrate so that the print executing part enables printing on the substrate, and unloading the printed substrate from the substrate unloading position; and
a control unit that drive-controls the substrate support table,
a first substrate unloading position and a second substrate unloading position, both of which are aligned in a Y axis direction which is orthogonal to an X axis direction defined as the certain direction, being defined as the substrate unloading position,
the substrate support table including a first substrate support device and a second substrate support device which are respectively movably provided in the Y axis direction and having a common area in which movable areas of the first and second substrate support devices partially overlap, the first substrate support device moving at least between a receiving position where a substrate loaded from the substrate loading position is received and a first sending position where a substrate is sent to the first substrate unloading position, and the second substrate support device moving at least between the receiving position and a second sending position where a substrate is sent to the second substrate unloading position,
the print executing part including one screen mask on which two printing patterns are aligned in the Y axis direction, the two printing patterns being formed of a first printing pattern positioned on the first substrate unloading position side and a second printing pattern positioned on the second substrate unloading position side, the screen mask being positioned within the common area,
the first substrate support device and the second substrate support device are respectively further set with the movable area so that, while one of the first substrate support device and the second substrate support device is positioned on the screen mask, the other substrate support table enables moving outside with respect to the Y axis direction avoiding the one substrate support table, and
wherein, when printing is performed on the substrate supported by the first substrate support device using the second printing pattern and printing is performed on the substrate supported by the second substrate support device using the first printing pattern, the control unit places the first substrate support device at the receiving position to receive a substrate loaded from the substrate loading position, and the control unit moves the first substrate support device to the print executing part so that printing is performed on the received substrate using the second printing pattern, and at the same time, the control unit moves the second substrate support device to a position outside the first substrate support device in the Y axis direction so as to avoid the first substrate support device, and, after printing is performed, the control unit moves the first substrate support device at the first sending position to send the substrate to the first substrate unloading position, and at the same time, the control unit moves the second substrate support device at the receiving position to receive a substrate loaded from the substrate loading position, and, after the substrate is received by the second substrate support device, the control unit moves the second substrate support device to the print executing part so that printing is performed on the received substrate using the first printing pattern, and at the same time, the control unit moves the first substrate support device to a position outside the second substrate support device with respect to the Y axis direction so as to avoid the second substrate support device, and, after printing is performed, the control unit moves the second substrate support device at the second sending position to send the substrate to the second substrate unloading position, and at the same time, the control unit moves the first substrate support device at the receiving position that receives a substrate loaded from the substrate loading position, whereby printing is alternately performed while a substrate loaded from the substrate loading position is received by either the first substrate support device or the second substrate support device.

13. A screen printing apparatus, comprising:

a print executing part positioned between a substrate loading position and a substrate unloading position, both of which are juxtaposed in a certain direction, the print executing part being configured to perform screen printing on a substrate;

a substrate support table receiving a substrate loaded from the substrate loading position, supporting the substrate so that the print executing part enables printing on the substrate, and unloading the printed substrate from the substrate unloading position; and a control unit that drive-controls the substrate support table, a first substrate loading position and a second substrate loading position, both of which are aligned in a Y axis direction which is orthogonal to an X axis direction defined as the certain direction, being defined as the substrate loading position, and a first substrate unloading position and a second substrate unloading position, both of which are aligned in the Y axis direction at a pitch which is different from an array pitch of the first and second substrate loading positions, being defined as the substrate unloading position, the substrate support table including a first substrate support device and a second substrate support device which are respectively movably provided in the Y axis direction and having a common area in which movable areas of the first and second substrate support devices partially overlap, the first substrate support device moving at least between a first receiving position where a substrate loaded from the first substrate loading position is received and a first sending position where a substrate is sent to the first substrate unloading position, and the second substrate support device moving at least between a second receiving position where a substrate loaded from the second substrate loading position is received and a second sending position where a substrate is sent to the second substrate unloading position, the print executing part including one screen mask on which two printing patterns are aligned in the Y axis direction, the two printing patterns being formed of a first printing pattern positioned on the first substrate unloading position side and a second printing pattern positioned on the second substrate unloading position side, the screen mask being positioned within the common area, the first substrate support device and the second substrate support device being respectively further set with the movable area so that, while one of the first substrate support device and the second substrate support device is positioned on the screen mask, the other substrate support table being enabled to move outside with respect to the Y axis direction avoiding the one substrate support table, and wherein, when printing is performed on the substrate supported by the first substrate support device using the second printing pattern and printing is performed on the substrate supported by the second substrate support device using the first printing pattern, the control unit places the first substrate support device at the first receiving position to receive a substrate loaded from the substrate loading position, the control unit moves the first substrate support device to the print executing part so that printing is performed on the received substrate using the second printing pattern, and at the same time, the control unit moves the second substrate support device to a position outside the first substrate support device in the Y axis direction so as to avoid the first substrate support device, and, after printing is performed, the control unit moves the first substrate support device at the first sending position to send the substrate to the first substrate unloading position, and at the same time, the control unit moves the second substrate support device at the second receiving position to receive a substrate loaded from the second substrate loading position, and, after the substrate is received by the second substrate support device, the control unit moves the second substrate support device to the print executing part so that printing is performed on the received substrate using the first printing pattern, and at the same time, the control unit moves the first substrate support device to a position outside the second substrate support device in the Y axis direction so as to avoid the second substrate support device, and, after printing is performed, the control unit moves the second substrate support device at the second sending position to send the substrate to the second substrate unloading position, and at the same time, the control unit moves the first substrate support device at the first receiving position to receive a substrate loaded from the first substrate loading position, whereby printing is alternately performed on the substrates loaded from the substrate loading positions.

* * * * *